United States Patent
Tokita

(10) Patent No.: US 9,236,310 B2
(45) Date of Patent: *Jan. 12, 2016

(54) METHOD OF MANUFACTURING A SEMICONDUCTOR DEVICE

(71) Applicant: Renesas Electronics Corporation, Kanagawa (JP)

(72) Inventor: Hirofumi Tokita, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/657,220

(22) Filed: Mar. 13, 2015

(65) Prior Publication Data

US 2015/0187657 A1 Jul. 2, 2015

Related U.S. Application Data

(63) Continuation of application No. 13/638,067, filed as application No. PCT/JP2010/055739 on Mar. 30, 2010, now Pat. No. 9,013,915.

(51) Int. Cl.
| | |
|---|---|
| *G11C 11/00* | (2006.01) |
| *H01L 21/8234* | (2006.01) |
| *H01L 21/8238* | (2006.01) |
| *H01L 27/11* | (2006.01) |

(Continued)

(52) U.S. Cl.
CPC .. *H01L 21/823462* (2013.01); *H01L 21/76224* (2013.01); *H01L 21/823842* (2013.01); *H01L 21/823857* (2013.01); *H01L 21/823871* (2013.01); *H01L 27/0629* (2013.01); *H01L 27/1104* (2013.01); *H01L 29/517* (2013.01); *H01L 27/0207* (2013.01); *H01L 29/513* (2013.01)

(58) Field of Classification Search
USPC .................. 365/156; 257/371, 204, 206, 351
See application file for complete search history.

(56) References Cited

U.S. PATENT DOCUMENTS

| | | | |
|---|---|---|---|
| 6,693,008 B1 * | 2/2004 | Sato et al. ..................... | 438/256 |
| 7,229,893 B2 | 6/2007 | Wang et al. | |

(Continued)

FOREIGN PATENT DOCUMENTS

| | | |
|---|---|---|
| JP | 2007-88122 | 4/2007 |
| JP | 2009-43944 | 2/2009 |

(Continued)

OTHER PUBLICATIONS

International Search Report—PCT/JP2010/055739—Jul. 6, 2010.

(Continued)

*Primary Examiner* — Pho M Luu
(74) *Attorney, Agent, or Firm* — Young & Thompson

(57) ABSTRACT

In an n-channel HK/MG transistor including: a gate insulating film made of a first high dielectric film containing La and Hf; and a gate electrode which is formed of a stacked film of a metal film and a polycrystalline Si film and which is formed in an active region in a main surface of a semiconductor substrate and surrounded by an element separation portion formed of an insulating film containing oxygen atoms, a second high dielectric film which contains Hf but whose La content is smaller than a La content of the first high dielectric film is formed below the gate electrode which rides on the element separation portion, instead of the first high dielectric film.

12 Claims, 51 Drawing Sheets

(51) Int. Cl.
*H01L 27/06* (2006.01)
*H01L 21/762* (2006.01)
*H01L 27/02* (2006.01)
*H01L 29/51* (2006.01)

(56) References Cited

U.S. PATENT DOCUMENTS

| | | | |
|---|---|---|---|
| 7,407,845 B2 | 8/2008 | Lee et al. | |
| 7,625,791 B2 | 12/2009 | Tseng et al. | |
| 8,021,939 B2 | 9/2011 | Chudzik et al. | |
| 8,129,780 B2 * | 3/2012 | Shinbori et al. | 257/334 |
| 8,319,289 B2 * | 11/2012 | Shiraishi et al. | 257/374 |
| 8,618,594 B2 * | 12/2013 | Shinbori et al. | 257/311 |
| 9,013,915 B2 * | 4/2015 | Tokita | 365/156 |
| 2005/0258468 A1 | 11/2005 | Colombo et al. | |
| 2006/0030096 A1 | 2/2006 | Weimer | |
| 2007/0228480 A1 | 10/2007 | Yen et al. | |
| 2009/0152650 A1 | 6/2009 | Chudzik et al. | |
| 2010/0072523 A1 | 3/2010 | Sato | |

FOREIGN PATENT DOCUMENTS

| | | |
|---|---|---|
| JP | 2009-224386 | 10/2009 |
| JP | 2009-302085 | 12/2009 |
| JP | 2010-62499 | 3/2010 |

OTHER PUBLICATIONS

C.M. Lai et al., A Novel "Hybrid" High-k/Metal Gate Process for 28nm High Performance CMOSFETs, IEDM Technical Digest, pp. 655-658, Jun. 2009.
Taiwanese Office Action, dated Jan. 20, 2015, in corresponding Taiwanese Patent Application No. 100106543.
JP Office Action dated Nov. 12, 2013, with English Translation; Application No. 2012-507963.
Chinese office Action dated May 15, 2014; Application No. 201080066028.5.

* cited by examiner

METHOD OF MANUFACTURING A SEMICONDUCTOR DEVICE

This is a continuation of application Ser. No. 13/687,067, now U.S. Pat. No. 9,013,915.

TECHNICAL FIELD

The present invention relates to a semiconductor device and a method of manufacturing the same, and, more particularly, the present invention relates to a technique effectively applied to a semiconductor device and a method of manufacturing the same, the semiconductor device having a field effect transistor (HK (High-k)/MG (Metal Gate) transistor; hereinafter, referred to as "HK/MG transistor") whose gate insulating film is made of a High-k material with a high dielectric constant and whose gate electrode is made of a metal material.

BACKGROUND ART

In association with development of miniaturization of a field effect transistor, a technique in which a High-k film is used as a gate insulating film instead of a conventional $SiO_2$ film or SiON film has been studied. This technique is for suppressing a gate leakage current which is increased by the tunnel effect and for thinning an equivalent oxide thickness (EOT) to improve a gate capacitance, which result in increase in a driving performance of the field effect transistor.

For example, a specification of U.S. Patent Application Laid-Open Publication No. 2009/0152650 (Patent Document 1) discloses a technique of preventing reoxidation of the gate insulating film, which is made of High-k, by shortening the gate electrode in terms of element separation to be a resolution limit of a lithography technique.

Moreover, C. M. Lai et. al., IEDM Tech. Dig., pp. 655 to 658 (2009)(Non-Patent Document 1) describes a technique of forming a CMOSFET whose gate length is 28 nm by a Gate First process or a Gate Last process.

PRIOR ART DOCUMENTS

Patent Document

Patent Document 1: U.S. Patent Application Laid-Open Publication No. 2009/0152650

Non-Patent Document

Non-Patent Document 1: C. M. Lai, C. T. Lin, L. W. Cheng, C. H. Hsu, J. T. Tseng, T. F. Chiang, C. H. Chou, Y. W. Chen, C. H. Yu, S. H. Hsu, C. G. Chen, Z. C. Lee, J. F. Lin, C. L. Yang, G. H. Ma, S. C. Chien, IEDM Technical Digest, pp. 655 to 658 (2009)

DISCLOSURE OF THE INVENTION

Problems to be Solved by the Invention

According to the studies made by the present inventor, it has been found that, in a HK/MG transistor whose gate insulating film is made of a High-k material and whose gate electrode is made of a metal material, a threshold voltage rapidly increases as a gate width is narrower. This rapid increase in the threshold voltage remarkably has arisen in, more particularly, an n-channel HK/MG transistor.

Further, according to another studies made by the present inventor, it has been conceivable that oxygen atoms are supplied from the insulating film which forms an element separation portion to the gate insulating film as one of factors of the above-described increase in the threshold voltage in the n-channel HK/MG transistor. Accordingly, the present inventor have studied to reduce a quantity of the oxygen atoms supplied from the element separation portion to the gate insulating film by changing a condition of a manufacturing process such as a thermal treatment temperature or a material of the gate insulating film or others. However, it has been difficult to change the condition of the manufacturing process only for suppressing the increase in the threshold voltage in the n-channel HK/MG transistor, and therefore, the increase in the threshold voltage in the n-channel HK/MG transistor has could not be avoided.

A preferred aim of the present invention is to provide a technique capable of obtaining stable operation characteristics in a semiconductor device having an HK/MG transistor whose gate insulating film is made of a High-k material and whose gate electrode is made of a metal material.

The above and other preferred aims and novel characteristics of the present invention will be apparent from the description of the present specification and the accompanying drawings.

Means for Solving the Problems

The typical ones of the inventions disclosed in the present application will be briefly described as follows.

The present invention relates to a semiconductor device having an n-channel HK/MG transistor whose gate insulating film is made of a High-k material and whose gate electrode is made of a metal material, and this n-channel HK/MG transistor includes: an element separation portion which is formed in a main surface of a semiconductor substrate and which is formed of an insulating film containing oxygen atoms; an active region adjacent to the element separation portion; a first high dielectric film which is formed on the active region and the element separation portion and which contains La and Hf; a second high dielectric film which is connected to the first high dielectric film on the element separation portion and which contains Hf but whose La content is lower than a La content of the first high dielectric film; a gate electrode which is formed on the first high dielectric film and the second high dielectric film; a channel region which is formed below the gate electrode in the active region; and a source region and a drain region which are formed on both sides of the gate electrode in the active region so as to interpose the channel region therebetween.

Effects of the Invention

The effects obtained by typical aspects of the present invention disclosed in the present application will be briefly described below.

In a semiconductor device having an HK/MG transistor whose gate insulating film is made of a High-k material and whose gate electrode is made of a metal material, stable operation characteristics can be obtained.

BRIEF DESCRIPTIONS OF THE DRAWINGS

Figure 57:
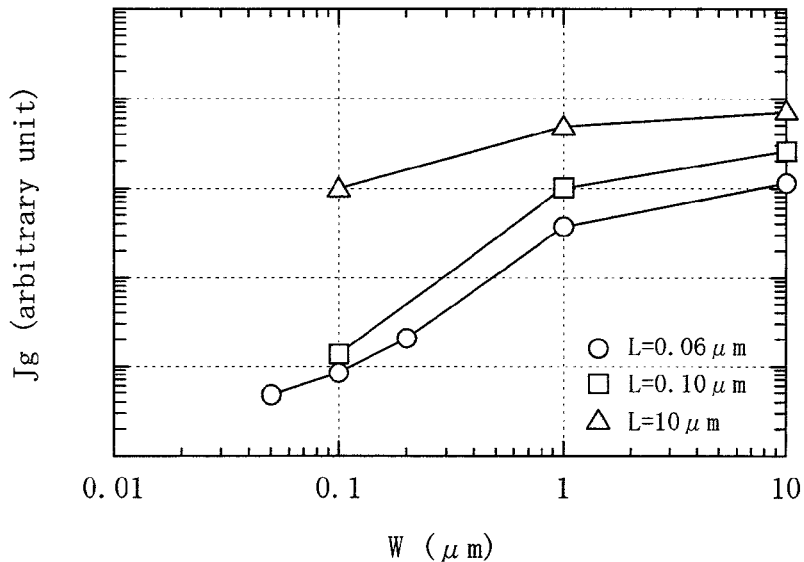
Figure 58:
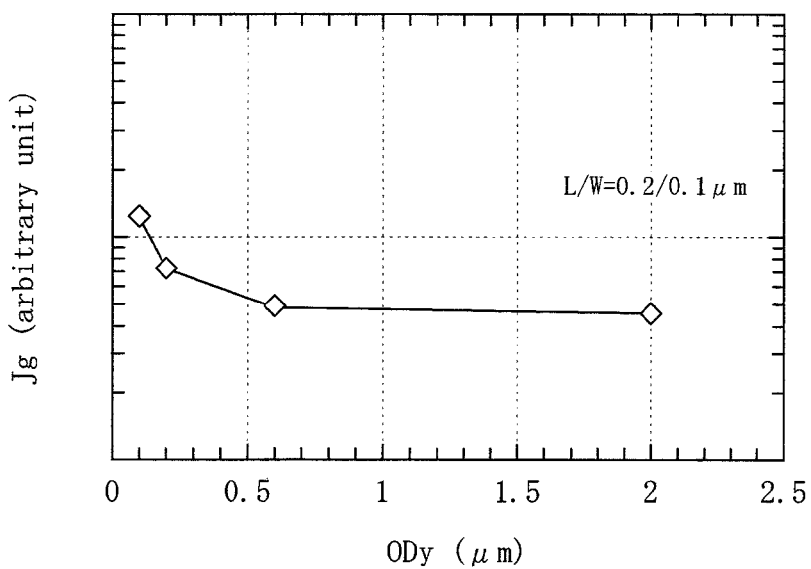

FIG. 57 is a graph explaining a relationship between a gate leakage current (Jg) and the gate width (W) of the n-channel HK/MG transistor, which has been studied by the present inventor, with using the gate length (Lg) as a parameter; and FIG. 58 is a graph explaining a relationship between the gate leakage current (Jg) and the width (ODy) of the element separation portion along the gate width direction on which the gate having the Nch gate stack structure rides, of the n-channel HK/MG transistor which has been studied by the present inventor.

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, in some drawings used in the embodiments, hatching is used even in a plan view so as to make the drawings easy to see. In the following embodiments, a metal insulator semi-conductor field effect transistor (MISFET) representing a field effect transistor is abbreviated as "MIS", a p-channel type MISFET is abbreviated as "pMIS", and an n-channel type MISFET is abbreviated as "nMIS". Further, in the following embodiments, the term "wafer" mainly indicates a silicon (Si) monocrystalline wafer and it indicates not only the same but also a silicon on insulator (SOI) wafer, an insulating film substrate for forming an integrated circuit thereon, or the like. The shape of the wafer includes not only a circular shape or a substantially circular shape but also a square shape, a rectangular shape, and the like.

Still further, in the following embodiments, when a gate or gate structure is mentioned, it indicates a stacked film formed of a gate insulating film and a gate electrode, and is differentiated from a gate electrode.

In addition, components having the same function are denoted by the same reference symbols throughout all the drawings for describing the following embodiments, and the repetitive description thereof will be omitted. Hereinafter, embodiments of the present invention will be described in detail with reference to the accompanying drawings.

First, since it is conceivable that a structure of the HK/MG transistor according to the present embodiment is clarified, a cause of the increase in the threshold voltage by a narrow channel in the n-channel HK/MG transistor will be explained with reference to FIGS. 53 to 58.

The gate structure of the n-channel HK/MG transistor explained here is the same as a gate structure of an n-channel HK/MG transistor explained later with reference to FIGS. 2 to 4, and includes: a gate insulating film formed of a stacked film of a $SiO_2$ film and a HfLaON film (hafnium oxynitride film containing La); and a gate electrode formed of a stacked film of a TiN film and a polycrystalline Si film thereon.

Also, this gate structure of the n-channel HK/MG transistor is different from a gate structure of a p-channel HK/MG transistor. The gate structure of the p-channel HK/MG transistor is the same as a gate structure of a p-channel HK/MG transistor explained later with reference to FIGS. 2 to 4, and includes: a gate insulating film formed of a stacked film of a $SiO_2$ film and a HfAlON film (hafnium oxynitride film containing Al); and a gate electrode formed of a stacked film of a TiN film and a polycrystalline Si film thereon.

Therefore, the gate structure (gate insulating film and gate electrode) of the n-channel HK/MG transistor is referred to as an Nch gate stack structure, and the gate structure (gate insulating film and gate electrode) of the p-channel HK/MG transistor is referred to as a Pch gate stack structure, so that the both structures are differentiated from each other. Moreover, the Nch gate stack structure or the Pch gate stack structure is mentioned as both structures with a $SiO_2$ film positioned in a lower layer of the gate insulating film and without the $SiO_2$ film.

Figure 53:
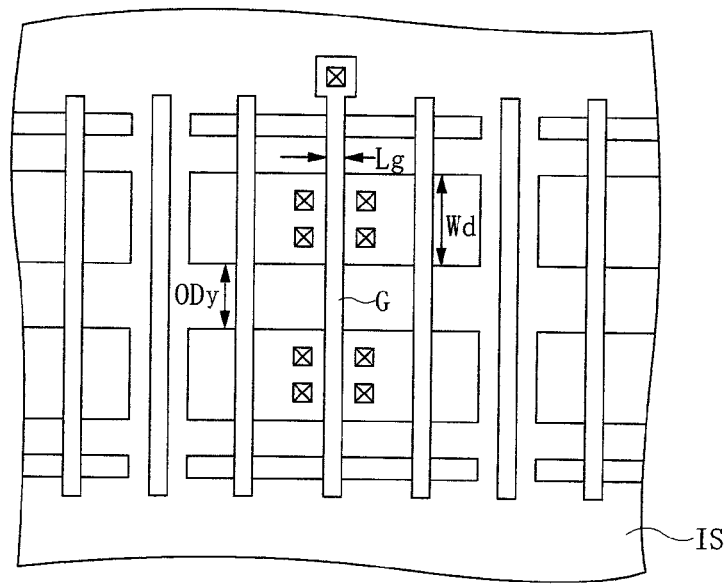
FIG. 53 is a plan view of a principal part of an n-channel HK/MG transistor, which has been studied by the present inventor.
Figure 54:
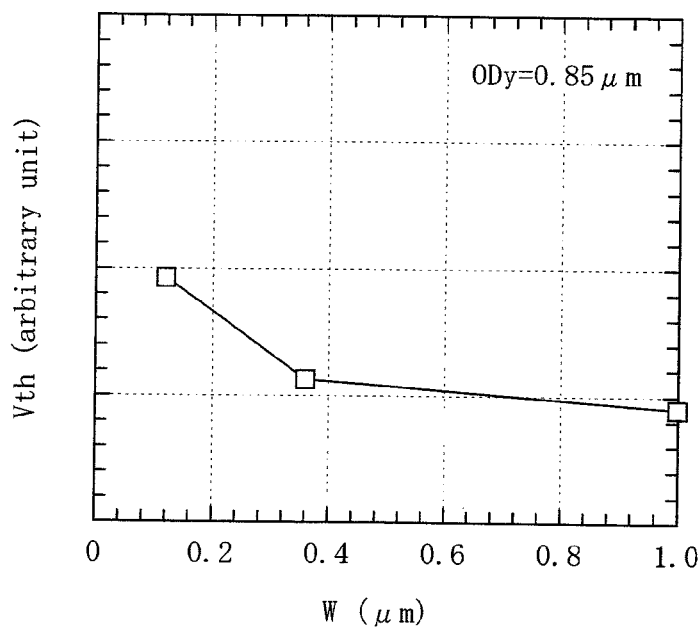
FIG. 54 is a graph explaining a relationship between a threshold voltage (Vth) and a gate width (W) of an n-channel HK/MG transistor, which has been studied by the present inventor, with using an impurity concentration (div1 to div4) of a channel region as a parameter.

FIG. 53 is a plan view of a principal part of the n-channel HK/MG transistor which has been studied by the present inventor, and FIG. 54 is a graph explaining a relationship between a threshold voltage (Vth) and a gate width (W) of the n-channel HK/MG transistor.

As illustrated in FIG. 54, when the channel width (gate width W) of the n-channel HK/MG transistor is 0.4 μm or narrower, a narrow-channel effect which increases the threshold voltage of the n-channel HK/MG transistor appears. As a cause of the narrow-channel effect, for example, expansion of a depletion layer in a lateral direction at an end portion of a channel region is cited. That is, it is considered that, since the depletion layer is expanded in the lateral direction at the end portion of the channel region, a charge quantity of the depletion layer which is controlled by the gate electrode increases to cause the increase in the threshold voltage. Moreover, it is also proposed that impurities for channel stopper below the element separation portion are diffused into the channel region to cause the increase in the threshold voltage at the end portion of the channel region and reduce an effective channel width, which results in the increase in the threshold voltage.

However, the present inventor have found that the threshold voltage of the n-channel HK/MG transistor increases as an overlapped portion of the gate "G" of the Nch gate stack structure with the element separation portion "IS" on which this gate G of the Nch gate stack structure rides is larger.

Next, with reference to FIGS. 55 to 58, an influence on the threshold voltage of the n-channel HK/MG transistor caused by the overlapped portion of the gate G of the Nch gate stack structure with the element separation portion IS will be explained.

Figure 55:
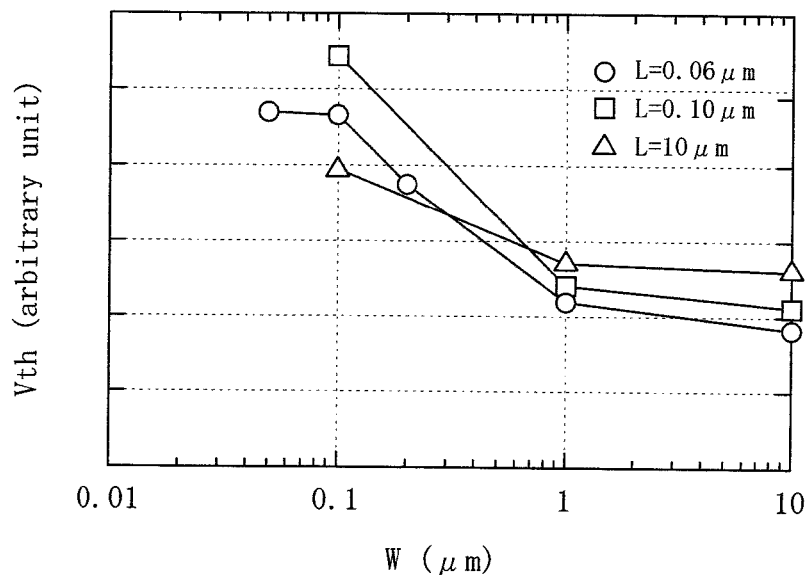
FIG. 55 is a graph explaining a relationship between the threshold voltage (Vth) and the gate width (W) of the n-channel HK/MG transistor, which has been studied by the present inventor, with using a gate length (Lg) as a parameter.
Figure 56:
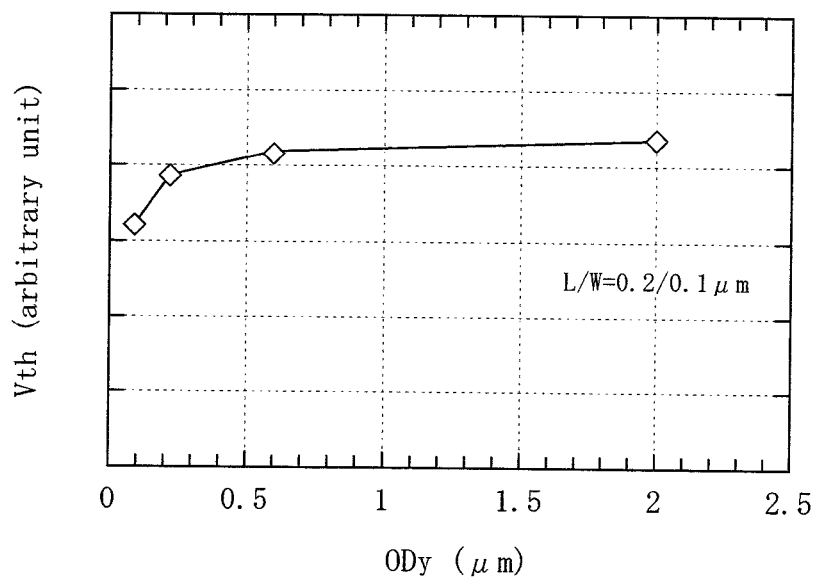
FIG. 56 is a graph explaining a relationship between a threshold voltage (Vth) and a width (ODy) of an element separation portion along a gate width direction on which a gate having an Nch gate stack structure rides, of the n-channel HK/MG transistor which has been studied by the present inventor.

FIG. 55 is a graph explaining a relationship between the threshold voltage (Vth) and the gate width (W) of the n-channel HK/MG transistor with using a gate length (Lg) as a parameter, and FIG. 56 is a graph explaining a relationship between the threshold voltage (Vth) and a width (ODy) of the element separation portion along a gate width direction on which the gate having the Nch gate stack structure rides, of the n-channel HK/MG transistor.

As illustrated in FIG. 55, the threshold voltage of the n-channel HK/MG transistor increases as the gate width W of the gate G of the Nch gate stack structure is narrower. However, as illustrated in FIG. 56, even if the gate width W of the gate G of the Nch gate stack structure is the same, the threshold voltage of the n-channel HK/MG transistor increases as the overlapped portion of the gate G of the Nch gate stack structure with the element separation portion IS is larger.

FIG. 57 is a graph explaining a relationship between the gate leakage current (Jg) and the gate width (W) of the n-channel HK/MG transistor with using the gate length (Lg) as a parameter, and FIG. 58 is a graph explaining a relationship between the gate leakage current (Jg) and the width (ODy) of the element separation portion along the gate width direction on which the gate electrode of the Nch gate stack structure rides, of the n-channel HK/MG transistor.

As illustrated in FIG. 57, the gate leakage current of the n-channel HK/MG transistor decreases as the gate width W of the gate G of the Nch gate stack structure is narrower. However, as illustrated in FIG. 58, even if the gate width W of the gate G of the Nch gate stack structure is the same, the gate leakage current of the n-channel HK/MG transistor decreases as the overlapped portion of the gate G of the Nch gate stack structure with the element separation portion IS is larger.

It is considered from these facts that, at the overlapped portion of the gate G of the Nch gate stack structure with the element separation portion IS in the n-channel HK/MG transistor, oxygen atoms are supplied from the element separation portion IS to the gate insulating film so that a thickness of the gate insulating film obtained after manufacturing the semiconductor device is thicker than an initial thickness thereof obtained in the film formation. Further, it is considered that a quantity of the oxygen atoms supplied to the gate insulating film is larger as the overlapped portion of the gate G of the Nch gate stack structure with the element separation portion IS is larger, and, as a result, the threshold voltage increases as illustrated in the above-described FIG. 56 and the gate leakage current decreases as illustrated in the above-described FIG. 58 as the overlapped portion of the gate G with the element separation portion IS is larger.

On the other hand, in the p-channel HK/MG transistor, it has been almost not found that the threshold voltage of the p-channel HK/MG transistor increases and the gate leakage current thereof decreases as the overlapped portion of the gate G of the Pch gate stack structure with the element separation portion IS is larger.

Accordingly, in the present invention, the overlapped portion of the gate G of the Nch gate stack structure and the element separation portion IS of the n-channel HK/MG transistor is made small, so that the quantity of the oxygen supplied from the element separation portion IS to the gate G of the Nch gate stack structure decreases, which results in suppressing of the increase in the threshold voltage of the n-channel HK/MG transistor.

First Embodiment

Figure 1:
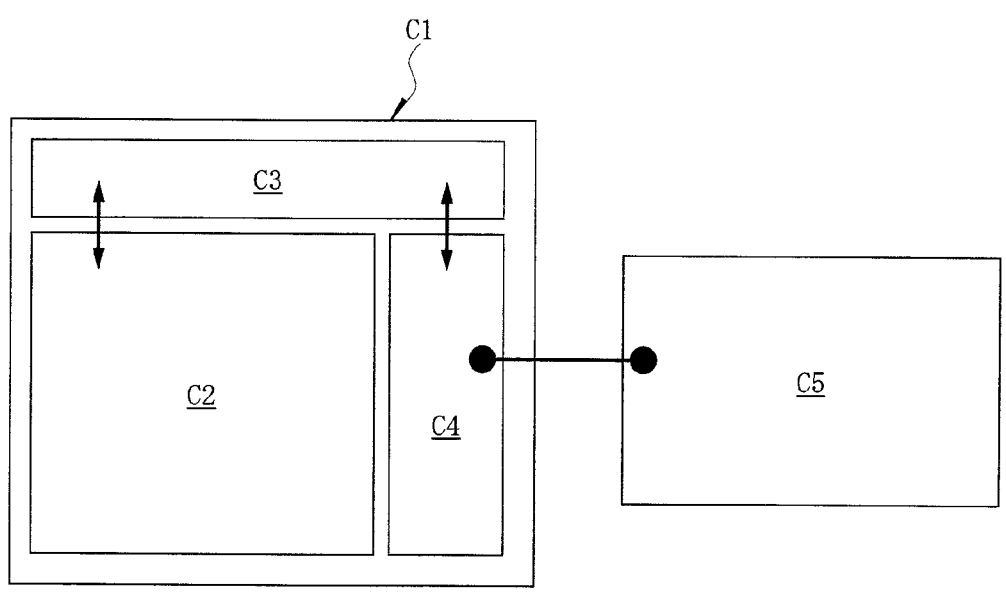
FIG. 1 is an internal configuration diagram of a semiconductor device according to a first embodiment.

FIG. 1 illustrates an internal configuration diagram of a semiconductor device according to a first embodiment.

A semiconductor device C1 is configured by a plurality of circuits such as a memory circuit C2, a processor circuit C3, an I/O (Input/Output) circuit C4, and others. A data and a program are stored in the memory circuit C2, a computing process or a controlling process for the data is performed in the processor circuit C3, and transferring and receiving processes of the data or the program are performed between the memory circuit C2 and the processor circuit C3. Moreover, transferring and receiving processes of the data are performed between the processor circuit C3 and the I/O circuit C4, and the data is transferred and received to/from a peripheral device C5 via the I/O circuit C4. Further, a voltage required for a circuit operation is intermittently supplied as a signal to the memory circuit C2 and the processor circuit C3 via the I/O circuit C4.

A plurality of memory transistors are formed in the memory circuit C2, a plurality of core transistors are formed in the processor circuit C3, and a plurality of I/O transistors are formed in the I/O circuit C4. The core transistors include n-channel HK/MG transistors and p-channel HK/MG transistors, and the I/O transistors include n-channel HK/MG transistors and p-channel HK/MG transistors.

A structure of the gate electrode of the n-channel HK/MG transistor of each core transistor is the same as a structure of the gate electrode of the n-channel HK/MG transistor of each I/O transistor. However, since a higher voltage is applied to the I/O transistor than that of the core transistor, the gate insulating film of the n-channel HK/MG transistor of the I/O transistor is formed thicker than the gate insulating film of the n-channel HK/MG transistor of the core transistor. Similarly, a structure of the gate electrode of the p-channel HK/MG transistor of each core transistor is the same as a structure of the gate electrode of the p-channel HK/MG transistor of each I/O transistor. However, since a higher voltage than that of the core transistor is applied to the I/O transistor, the gate insulating film of the p-channel HK/MG transistor of the I/O transistor is formed thicker than the gate insulating film of the p-channel HK/MG transistor of the core transistor.

Figure 4:
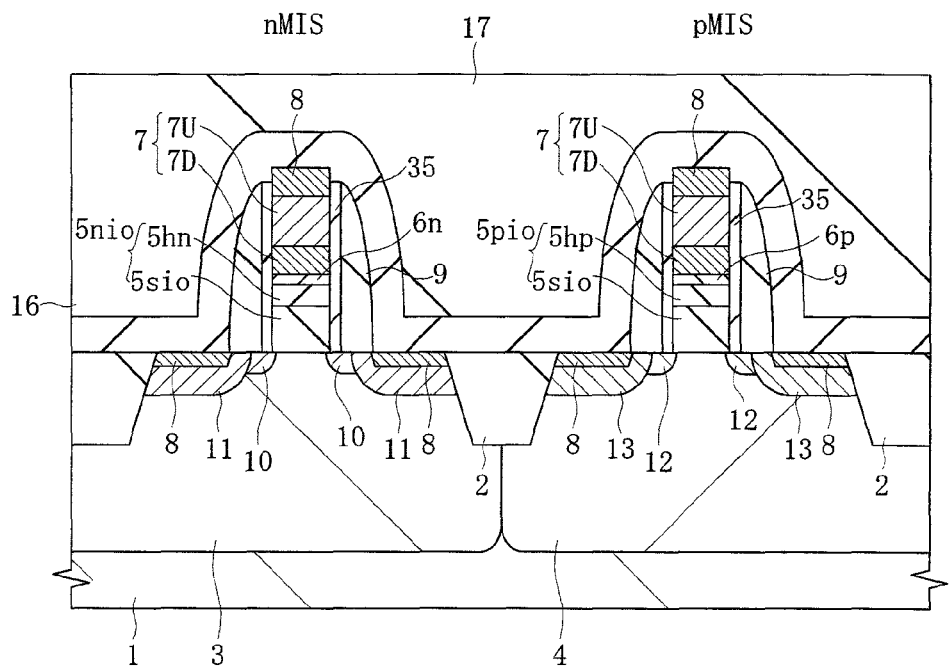
FIG. 4 is a cross-sectional view of a principal part along a gate length direction of an n-channel HK/MG transistor of an I/O transistor and a p-channel HK/MG transistor thereof according to the first embodiment.
Figure 5:
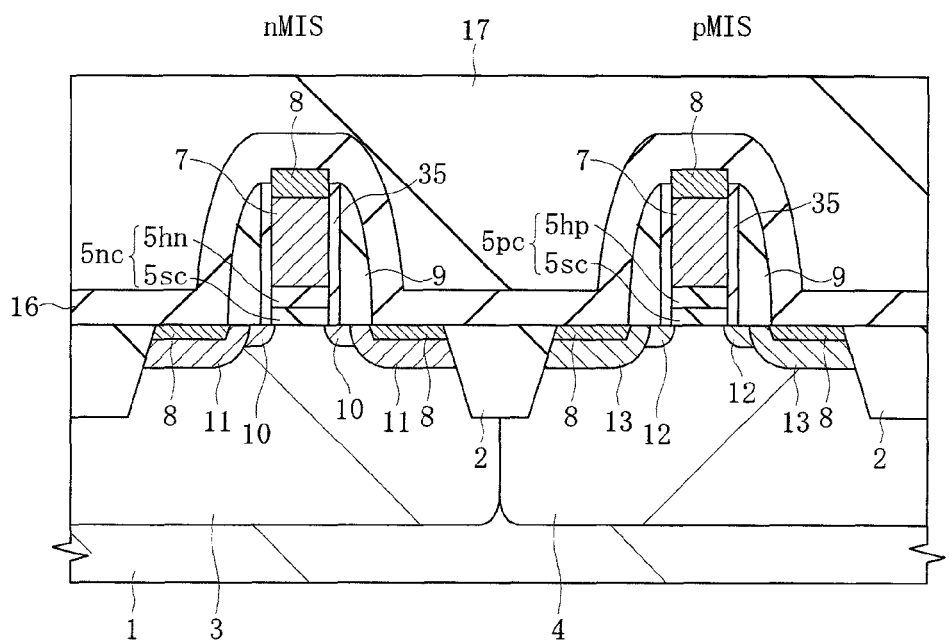
FIG. 5 is a cross-sectional view of a principal part of a resistor element according to the first embodiment.

Next, structures of the core transistor, the I/O transistor, and a resistor element according to the first embodiment will be explained with reference to FIGS. 2 to 5. FIG. 2 is a cross-sectional view of a principal part along a gate length direction of the n-channel HK/MG transistor and the p-channel HK/MG transistor of the core transistors according to the first embodiment, FIG. 3 is a cross-sectional view of a principal part along a gate width direction of the n-channel HK/MG transistor and the p-channel HK/MG transistor of the core transistors according to the first embodiment, FIG. 4 is a cross-sectional view of a principal part along a gate length direction of the n-channel HK/MG transistor and the p-channel HK/MG transistor of the I/O transistors according to the first embodiment, and FIG. 5 is a cross-sectional view of a principal part of an n-channel resistor element and a p-channel resistor element which are formed in the processor circuit according to the first embodiment.

First, with reference to FIGS. 2 and 3, structures of the n-channel HK/MG transistor of the core transistor (hereinafter, referred to as "core nMIS") and the p-channel HK/MG transistor of the core transistor (hereinafter, referred to as "core pMIS") according to the first embodiment will be explained.

In a main surface of a semiconductor substrate 1 in which the core nMIS and core pMIS according to the first embodiment are formed, an element separation portion 2 is formed. The element separation portion 2 has a function of preventing interference between elements formed in the semiconductor substrate 1, and is formed by, for example, an STI (Shallow Trench Isolation) method of forming a trench in the semiconductor substrate 1 and embedding an insulating film into the trench. An active region divided by this element separation portion 2 becomes a core nMIS formation region or a core pMIS formation region. The insulating film embedded into the trench is, for example, a TEOS film formed by a plasma CVD (Chemical Vapor Deposition) method with using TEOS (Tetra Ethyl Ortho Silicate; $Si(OC_2H_5)_4$) and ozone as source gases, a $SiO_2$ film, a polysilazane ($SiH_2NH$) film, or others formed by a high density plasma CVD method. A width "L" of the element separation portion 2 formed between the core nMIS and the core pMIS is formed to be about 80 nm at minimum in order to prevent the interference between both of them.

A p-type well 3 serving as a semiconductor region is formed in the core nMIS formation region of the main surface of the semiconductor substrate 1, and an n-type well 4 serving as a semiconductor region is formed in the core pMIS formation region of the main surface of the semiconductor substrate 1. A p-type impurity such as B is introduced into the p-type well 3, and an n-type impurity such as P or As is introduced into the n-type well 4.

Subsequently, the structure of the core nMIS will be explained.

A gate insulating film "$5nc$" is formed on the p-type well 3 formed in the core nMIS formation region of the main surface of the semiconductor substrate 1.

This gate insulating film $5nc$ is mainly formed of, for example, a high dielectric film "$5hn$" whose dielectric constant is higher than that of $SiO_2$. As the high dielectric film $5hn$, for example, a hafnium-based insulating film such as a $HfO_x$ film, a HfON film, a $HfSiO_x$ film, or a HfSiON film, is used. In this hafnium-based insulating film, a metal element such as La for adjusting a work function so as to obtain a desired threshold voltage of the core nMIS is contained. Therefore, as a typical component material for the high dielectric film $5hn$, for example, HfLaON can be exemplified. A thickness of the high dielectric film $5hn$ is set to, for example, about 1 nm.

An oxide film "$5sc$", for example, a $SiO_2$ film, is formed between the semiconductor substrate 1 and the high dielectric film $5hn$. When the semiconductor substrate 1 and the high dielectric film $5hn$ are in direct contact with each other, there is a risk that mobility of the core nMIS is reduced. However, by interposing the oxide film $5sc$ between the semiconductor substrate 1 and the high dielectric film $5hn$, the reduction of the mobility can be prevented. A thickness of the oxide film $5sc$ is set to, for example, about 1 nm.

A cap film "$6n$" is formed on the gate insulating film $5nc$. This cap film $6n$ is, for example, a LaO film, and this film is formed for adding a metal element, that is, La, for obtaining the threshold voltage of the core nMIS into the hafnium-based insulating film forming the high dielectric film $5hn$. Note that La is exemplified as the metal element added into the hafnium-based insulating film forming the high dielectric film $5hn$. However, other metal element may be used. Therefore, for the cap film $6n$, a $La_2O_5$ film, a La film, a MgO film, a Mg film, a BiSr film, a SrO film, a Y film, a $Y_2O_3$ film, a Ba film, a BaO film, a Se film, a ScO film, or others may be used. Note that all the metal elements forming the cap film $6n$ may be added to the high dielectric film $5hn$ in some cases.

A gate electrode 7 is formed on the cap film $6n$. This gate electrode 7 has a structure obtained by stacking a lower-layer gate electrode 7D and an upper-layer gate electrode 7U. The lower-layer gate electrode 7D is formed of, for example, a TiN film, but not limited to this. The lower-layer gate electrode 7D may be formed of, for example, any one of a TaN film, a TaSiN film, a TiAlN film, a HfN film, a $Ni_xSi_{1-x}$ film, a PtSi film, a $Ni_xTa_{1-x}Si$ film, a $Ni_xPt_{1-x}Si$ film, a HfSi film, a WSi film, an $Ir_xSi_{1-x}$ film, a TaGe film, a TaCx film, a Mo film, and a W film. A thickness of the lower-layer gate electrode 7D is set to, for example, about 5 to 20 nm. Moreover, the upper-layer gate electrode 7U is formed of, for example, a polycrystalline Si film to which an impurity of about $1 \times 10^{20}$ cm$^{-3}$ is introduced. A thickness of the upper-layer gate electrode 7U is set to, for example, about 30 to 80 nm.

Further, a silicide film 8 is formed on the gate electrode 7. This silicide film 8 is, for example, a NiSi film or a PtSi film.

On side walls on both sides of the stacked film formed of the gate electrode 7 and the gate insulating film $5nc$, for example, an off set side wall 35 and a side wall 9 both of which are formed of insulating films are formed sequentially in an order from inside outward. An n-type diffusion region 10 serving as a semiconductor region is formed in the semiconductor substrate 1 (in the p-type well 3) right below these offset side wall 35 and side wall 9, and an n-type diffusion region 11 is formed outside the n-type diffusion region 10. An n-type impurity such as P or As is introduced into the n-type diffusion region 10 and n-type diffusion region 11, and the n-type impurity is introduced to the n-type diffusion region 11 with a higher concentration than that to the n-type diffusion region 10. By the n-type diffusion region 10 and the n-type diffusion region 11, source and drain regions of the core nMIS having an LDD (Lightly Doped Drain) structure are formed. A channel region to which an impurity for adjusting a threshold value of the core nMIS is introduced but not illustrated is formed in the semiconductor substrate 1 (in the p-type well 3) between the source and drain regions right below the gate electrode 7.

A silicide film 8 formed in the same process as that of the silicide film 8 formed on the gate electrode 7 is formed on a surface of the n-type diffusion region 11.

Subsequently, the structure of the core pMIS will be explained.

A gate insulating film "5pc" is formed on the n-type well 4 formed in the core pMIS formation region of the main surface of the semiconductor substrate 1.

This gate insulating film 5pc is mainly formed of, for example, a high dielectric film "5hp" whose dielectric constant is higher than that of $SiO_2$. As the high dielectric film 5hp, for example, a hafnium-based insulating film such as a $HfO_x$ film, a HfON film, a $HfSiO_x$ film, or a HfSiON film, is used. In this hafnium-based insulating film, a metal element such as Al for adjusting a work function so as to obtain a desired threshold voltage of the core pMIS is contained. Therefore, as a typical component material for the high dielectric film 5hp, for example, HfAlON can be exemplified. A thickness of the high dielectric film 5hp is set to, for example, about 1 nm.

Also, an oxide film. "5sc", for example, a $SiO_2$ film, is formed between the semiconductor substrate 1 and the high dielectric film 5hp. When the semiconductor substrate 1 and the high dielectric film. 5hp are in direct contact with each other, there is a risk that mobility of the core pMIS is reduced. However, by interposing the oxide film 5sc between the semiconductor substrate 1 and the high dielectric film 5hp, the reduction of the mobility can be prevented. A thickness of the oxide film 5sc is set to, for example, about 1 nm.

A cap film "6p" is formed on the gate insulating film 5pc. This cap film 6p is, for example, an Ala film, and this film is formed for adding a metal element, that is, Al, for obtaining the threshold voltage of the core pMIS into the hafnium-based insulating film forming the high dielectric film 5hp. Note that the AlO film is exemplified as the cap film 6p. However, an Al film may be used. Note that all the metal elements forming the cap film 6p may be added to the high dielectric film 5hp in some cases.

A gate electrode 7 is formed on the cap film. 6p, and a silicide film 8 is formed on the gate electrode 7. These gate electrode 7 and silicide film 8 have the same structures as the above-described gate electrode 7 and silicide film. 8 of the core nMIS, respectively.

On side walls on both sides of the stacked film formed of the gate electrode 7 and the gate insulating film 5pc, for example, an off set side wall 35 and a side wall 9 both of which are formed of insulating films are formed sequentially from an inside thereof. A p-type diffusion region 12 serving as a semiconductor region is formed in the semiconductor substrate 1 (in the n-type well 4) right below these offset side wall 35 and side wall 9, and a p-type diffusion region 13 is formed outside the p-type diffusion region 12. A p-type impurity such as B is introduced into the p-type diffusion region 12 and p-type diffusion region 13, and the p-type impurity is introduced to the p-type diffusion region 13 with a higher concentration than that to the p-type diffusion region 12. By the p-type diffusion region 12 and the p-type diffusion region 13, source and drain regions of the core pMIS having the LDD structure are formed. A channel region to which an impurity for adjusting a threshold value of the core pMIS is introduced but not illustrated is formed in the semiconductor substrate 1 (in the n-type well 4) between the source and drain regions right below the gate electrode 7.

A silicide film 8 formed in the same process as that of the silicide film 8 formed on the gate electrode 7 is formed on a surface of the p-type diffusion region 13. Further, the core nMIS and the core pMIS are covered by a $Si_3N_4$ film 16 and an interlayer insulating film 17.

Next, structures of the n-channel HK/MG transistor of the I/O transistor according to the first embodiment (hereinafter, referred to as "I/O nMIS") and the p-channel HK/MG transistor thereof (hereinafter, referred to as "I/O pMIS") will be explained with reference to FIG. 4.

The structure of the I/O nMIS is the same as that of the above-described core nMIS. However, a thickness of an oxide film "5sio" forming a gate insulating film. "5nio" of the I/O nMIS is made thicker than a thickness of an oxide film "5sc" forming the gate insulating film 5nc of the core nMIS. For example, the thickness of the oxide film 5sio formed between the semiconductor substrate 1 and the high dielectric film 5hn is set to, for example, 2 to 6 nm.

Also, the structure of the I/O pMIS is the same as that of the above-described core pMIS. However, a thickness of an oxide film "5sio" forming a gate insulating film "5pio" of the I/O pMIS is made thicker than a thickness of an oxide film "5sc" forming the gate insulating film 5pc of the core pMIS. For example, the thickness of the oxide film 5sio formed between the semiconductor substrate 1 and the high dielectric film. 5hp is set to, for example, 2 to 6 nm.

Next, structures of an n-channel resistor element and a p-channel resistor element formed in the processor circuit according to the first embodiment will be explained with reference to FIG. 5.

As the structure of the n-channel resistor element, the above-described core nMIS is utilized, and the structure is the same as the structure of the above-described core nMIS except that the cap film 6n and the lower-layer gate electrode 7D of the gate electrode 7 are not formed. Similarly, as the structure of the p-channel resistor element, the above-described core pMIS is utilized, and the structure is the same as the structure of the above-described core pMIS except that the cap film 6p and the lower-layer gate electrode 7D of the gate electrode 7 are not formed.

Next, a planar layout of the core nMIS according to the first embodiment will be explained with reference to FIG. 6. Further, a modified example of the planar layout of the core nMIS according to the first embodiment will be explained with reference to FIGS. 7 to 10. Here, an example that the present invention is applied to the core nMIS and the core pMIS will be explained. However, it is needless to say that the present invention is applicable to the I/O nMIS and the I/O pMIS as well.

Figure 6:
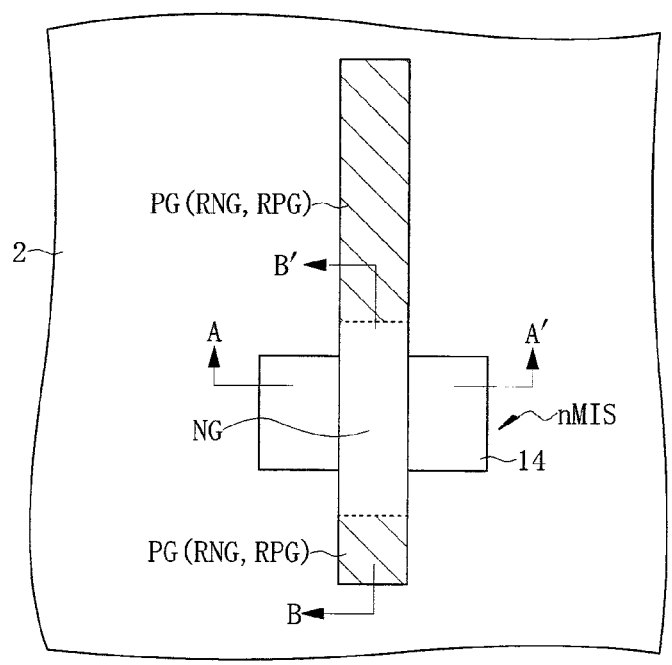
FIG. 6 is a plan view of a principal part of a core nMIS according to the first embodiment.

FIG. 6 is a plan view of a principal part of the core nMIS according to the first embodiment. A cross-sectional surface along line A-A' illustrated in FIG. 6 corresponds to the cross-sectional view of the principal part of the core nMIS illustrated in the above-described FIG. 2, and a cross-sectional surface along line B-B' illustrated in FIG. 6 corresponds to the cross-sectional view of the principal part of the core nMIS illustrated in the above-described FIG. 3.

Figure 2:
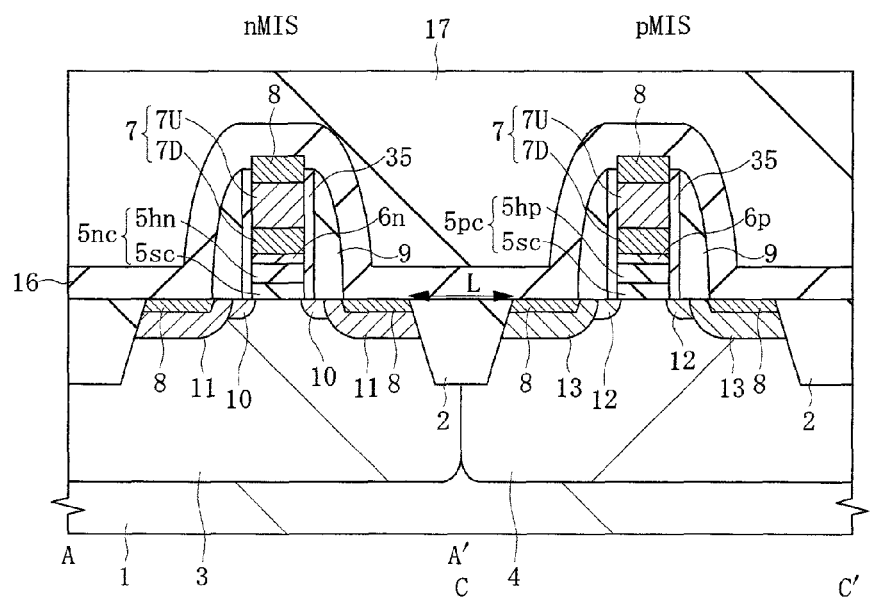
FIG. 2 is a cross-sectional view of a principal part along a gate length direction of an n-channel HK/MG transistor of a core transistor and a p-channel HK/MG transistor thereof according to the first embodiment.
Figure 3:
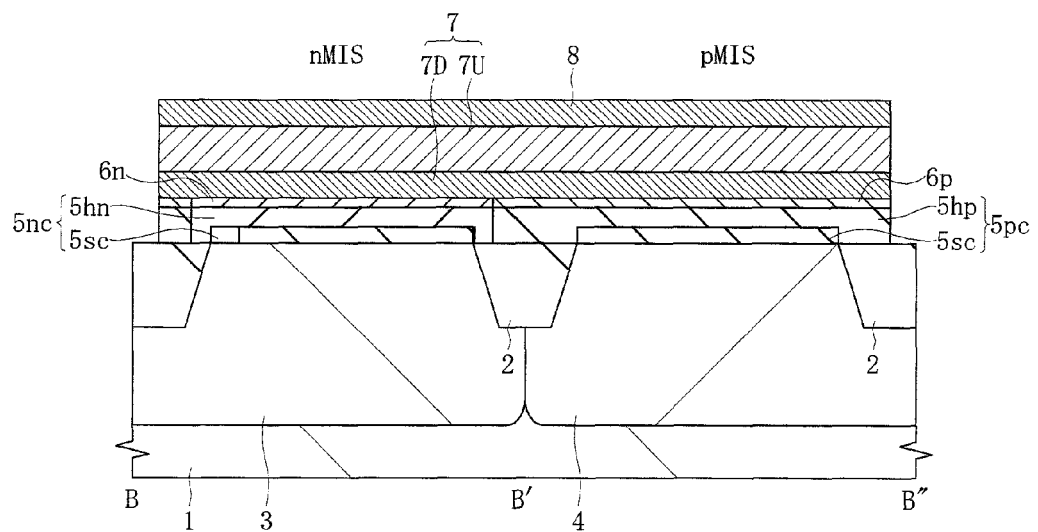
FIG. 3 is a cross-sectional view of a principal part along a gate width direction of the n-channel HK/MG transistor of the core transistor and the p-channel HK/MG transistor thereof according to the first embodiment.

As illustrated in FIG. 6, as the gate of the core nMIS positioned in an active region 14 surrounded by the element separation portion 2, an Nch gate stack structure NG is used, the Nch gate stack structure being configured by: the gate insulating film 5nc (the stacked film formed of the oxide film 5sc and the high dielectric film 5hn); the cap film 6n; and the gate electrode 7 (the stacked film formed of the lower-layer gate electrode 7D and the upper-layer gate electrode "7U), which are for the core nMIS illustrated in FIGS. 2 and 3.

However, as the gate of the core nMIS which rides on the element separation portion 2, a Pch gate stack structure PG is used, the Pch gate stack structure being configured by: the gate insulating film 5pc (high dielectric film 5hp); the cap film 6p; and the gate electrode 7 (the stacked film formed of the lower-layer gate electrode 7D and the upper-layer gate electrode 7U), which are for the core pMIS illustrated in FIGS. 2 and 3.

Alternatively, as the gate of the core nMIS which rides on the element separation portion 2, an Nch gate structure RNG or a Pch gate structure RPG is used, the Nch gate structure RNG being formed by removing metal materials, that is, the cap film 6n and the lower-layer gate electrode 7D, from the above-described Nch gate stack structure NG, and the Pch gate structure RPG being formed by removing metal materials, that is, the cap film 6p and the lower-layer gate electrode 7D, from the above-described Pch gate stack structure PG. The Nch gate structure RNG has the same gate structure configured by, for example, the gate insulating film 5nc (high dielectric film 5hn) and the gate electrode 7 (upper-layer gate electrode 7U) which are for the n-channel resistor element illustrated in the above-described FIG. 5, and the Pch gate structure RPG has the same gate structure configured by the gate insulating film 5pc (high dielectric film 5hp) and the gate electrode 7 (upper-layer gate electrode 7U) which are for the p-channel resistor element illustrated in the above-described FIG. 5.

That is, even in the core nMIS, as the gate of the core nMIS which rides on the element separation portion 2, the gate having the Pch gate stack structure PG of the core pMIS, the gate having the Nch gate structure RNG of the n-channel resistor element, or the gate having the Pch gate structure RPG of the p-channel resistor element is partially used.

Therefore, the gate structure of the core nMIS positioned in the active region 14 is configured by, for example: the gate insulating film 5nc formed of the stacked film of the SiO₂ film and the HfLaON film; the cap film 6n formed of the LaO film; and the gate electrode 7 formed of the stacked film of the TiN film and the polycrystalline Si film. On the other hand, a part of the gate structure of the core nMIS positioned on the element separation portion 2 is configured by, for example: the gate insulating film 5pc formed of the HfAlON film; the cap film 6p formed of the AlO film; and the gate electrode 7 formed of the stacked film of the TiN film and the polycrystalline Si film. Alternatively, a part of the gate structure of the core nMIS positioned on the element separation portion 2 is configured by, for example: the gate insulating film 5nc formed of the HfLaON film; and the gate electrode 7 formed of the polycrystalline Si film, or configured by, for example: the gate insulating film 5pc formed of the HfAlON film; and the gate electrode 7 formed of the polycrystalline Si film.

In this manner, the overlapped portion of the gate having the Nch gate stack structure NG with the element separation portion 2 is reduced, and therefore, the quantity of the oxygen atoms supplied from the element separation portion 2 to the gate having the Nch gate stack structure NG of the core nMIS can be reduced. As a result, the increase in the threshold voltage of the core nMIS can be suppressed.

In order to reduce the quantity of the oxygen atoms supplied to the gate having the Nch gate stack structure NG of the core nMIS, it is desired that, for example, all the gates which ride on the element separation portion 2 have the Pch gate stack structure PG of the core pMIS. However, when the gate having the Pch gate stack structure PG of the core pMIS is formed in the active region 14 in which the core nMIS is formed, there is a problem that the core nMIS does not normally operate due to misalignment or others in the manufacturing process of the semiconductor device. Therefore, in consideration of alignment margin and processing precision in the manufacturing process of the semiconductor device, a boundary between the gate having the Nch gate stack structure NG and the gate having the Pch gate stack structure PG is set at a position shifted toward the element separation portion 2 side from a boundary between the active region 14 in which the core nMIS is formed and the element separation portion 2.

Figure 7:
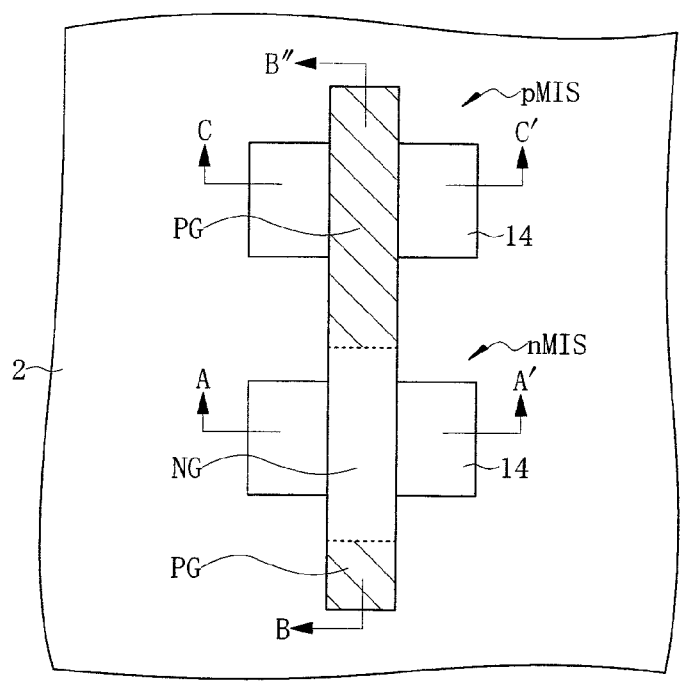
FIG. 7 is a plan view of a principal part of a core nMIS and a core pMIS which share a gate electrode, according to the first embodiment.

FIG. 7 is a plan view of a principal part of the core nMIS and the core pMIS which share the gate electrode, according to the first embodiment. A cross-sectional surface along line A-A' illustrated in FIG. 7 corresponds to the cross-sectional view of the principal part of the core nMIS illustrated in the above-described FIG. 2, a cross-sectional surface along line C-C' illustrated in FIG. 7 corresponds to the cross-sectional view of the principal part of the core pMIS illustrated in the above-described FIG. 2, and a cross-sectional surface along line B-B" illustrated in FIG. 7 corresponds to the cross-sectional view of the principal part of the core nMIS and the core pMIS illustrated in the above-described FIG. 3.

As illustrated in FIG. 7, the gate having the Nch gate stack structure NG is used as the core nMIS positioned in the active region 14 of the core nMIS formation region surrounded by the element separation portion 2, the gate having the Pch gate stack structure PG is used as the core pMIS gate positioned in the active region 14 of the core pMIS formation region surrounded by the element separation portion 2, and the Pch gate stack structure PG is mainly used on the element separation portion 2.

In this manner, the overlapped portion of the gate having the Nch gate stack structure NG with the element separation portion 2 is reduced, and therefore, the quantity of the oxygen atoms supplied from the element separation portion 2 to the gate having the Nch gate stack structure NG of the core nMIS can be reduced. As a result, the increase in the threshold voltage of the core nMIS can be suppressed.

Figure 8:
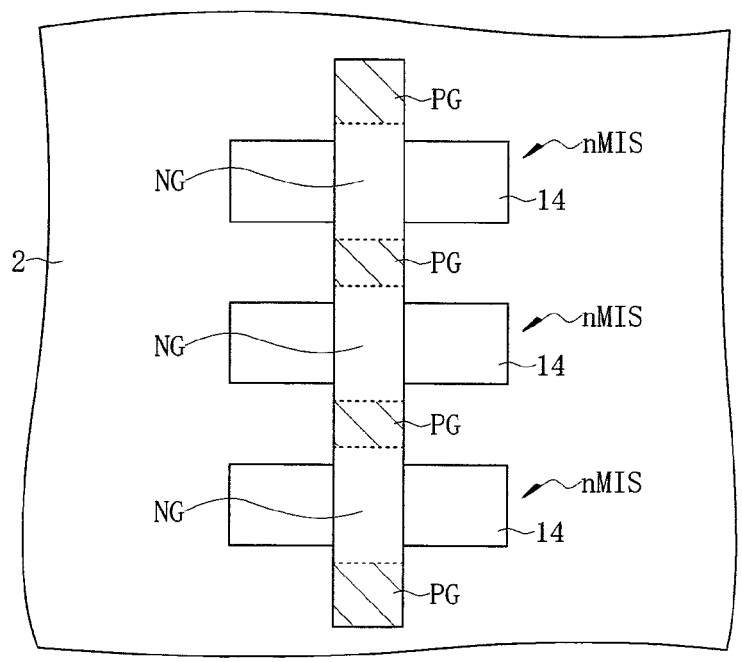
FIG. 8 is a plan view of a principal part of three core nMISes which share a gate electrode, according to the first embodiment.

FIG. 8 is a plan view of a principal part of three core nMISes which share the gate electrode, according to the first embodiment.

As illustrated in FIG. 8, the gate having the Nch gate stack structure NG is used as the core nMIS positioned in the active region 14 of the core nMIS formation region surrounded by the element separation portion 2. However, on the element separation portion 2, the gate having the Pch gate stack structure PG of the core pMIS, the gate having the Nch gate stack structure RNG of the n-channel resistor element, or the gate having the Pch gate stack structure RPG of the p-channel resistor element is partially used.

In this manner, the overlapped portion of the gate having the Nch gate stack structure NG with the element separation portion 2 is reduced, and therefore, the quantity of the oxygen atoms supplied from the element separation portion 2 to the gate having the Nch gate stack structure NG of the core nMIS can be reduced. As a result, the increase in the threshold voltage of the core nMIS can be suppressed.

Figure 9:
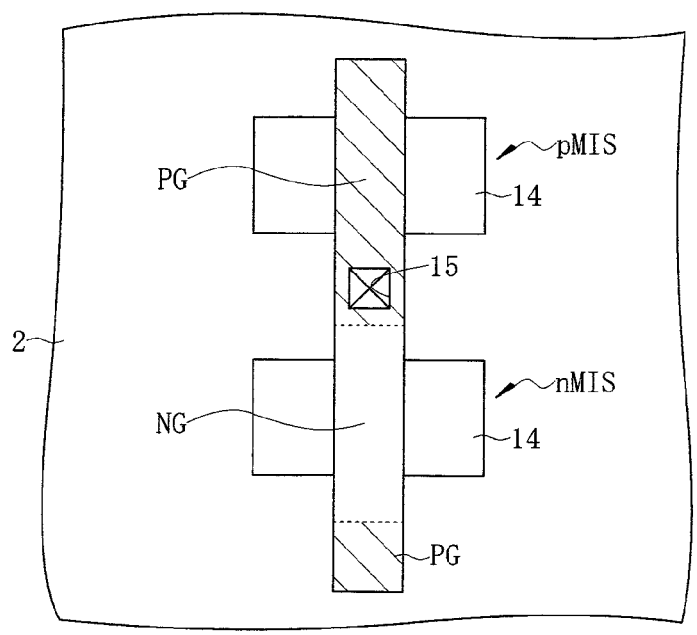
FIG. 9 is a plan view of a principal part of a core nMIS and a core pMIS which share a gate electrode, according to the first embodiment.
Figure 10:
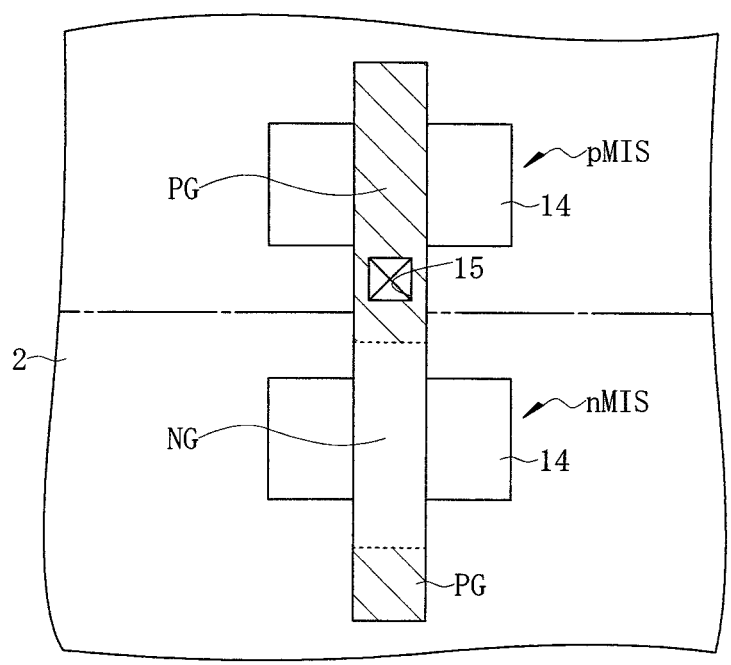
FIG. 10 is a plan view of a principal part of a core nMIS and a core pMIS which share a gate electrode, according to the first embodiment.

Each of FIGS. 9 and 10 is a plan view of a principal part of the core nMIS and the core pMIS which share the gate electrode, according to the first embodiment.

As illustrated in the above-described FIG. 7, in the core nMIS and the core pMIS which share the gate electrode 7, the gate having the Pch gate stack structure PG is mainly used on the element separation portion 2 between the core nMIS and the core pMIS. When a contact 15 for connecting this gate electrode 7 with an upper-layer wiring is formed in the gate electrode 7 shared by the core nMIS and the core pMIS, the contact 15 is formed in a portion of the gate having the Pch gate stack structure PG on the element separation portion 2 as illustrated in FIG. 9. Alternatively, as illustrated in FIG. 10, the contact 15 is formed on the core pMIS side shifted from the middle of the element separation portion 2 (in the drawing, an intermediate line indicated by a dashed line) between the core nMIS and the core pMIS.

In this manner, the increase in the threshold voltage of the core nMIS can be suppressed, and besides, a contact resistance can be stabilized because the silicide layer 8 formed on the gate electrode 7 of the core pMIS is formed thick.

Next, a method of manufacturing the semiconductor device according to the first embodiment will be explained in an order of steps with reference to FIGS. 11 to 28. Each of FIGS. 11 to 28 illustrates a cross-sectional view of a principal part including the core nMIS (Nch Core), the core pMIS (Pch Core), the I/O nMIS (Nch I/O), the I/O pMIS (Pch I/O), the n-channel resistor element (Nch resistor element), and the p-channel resistor element (Pch resistor element) among circuit elements formed in the semiconductor device.

Figure 11:
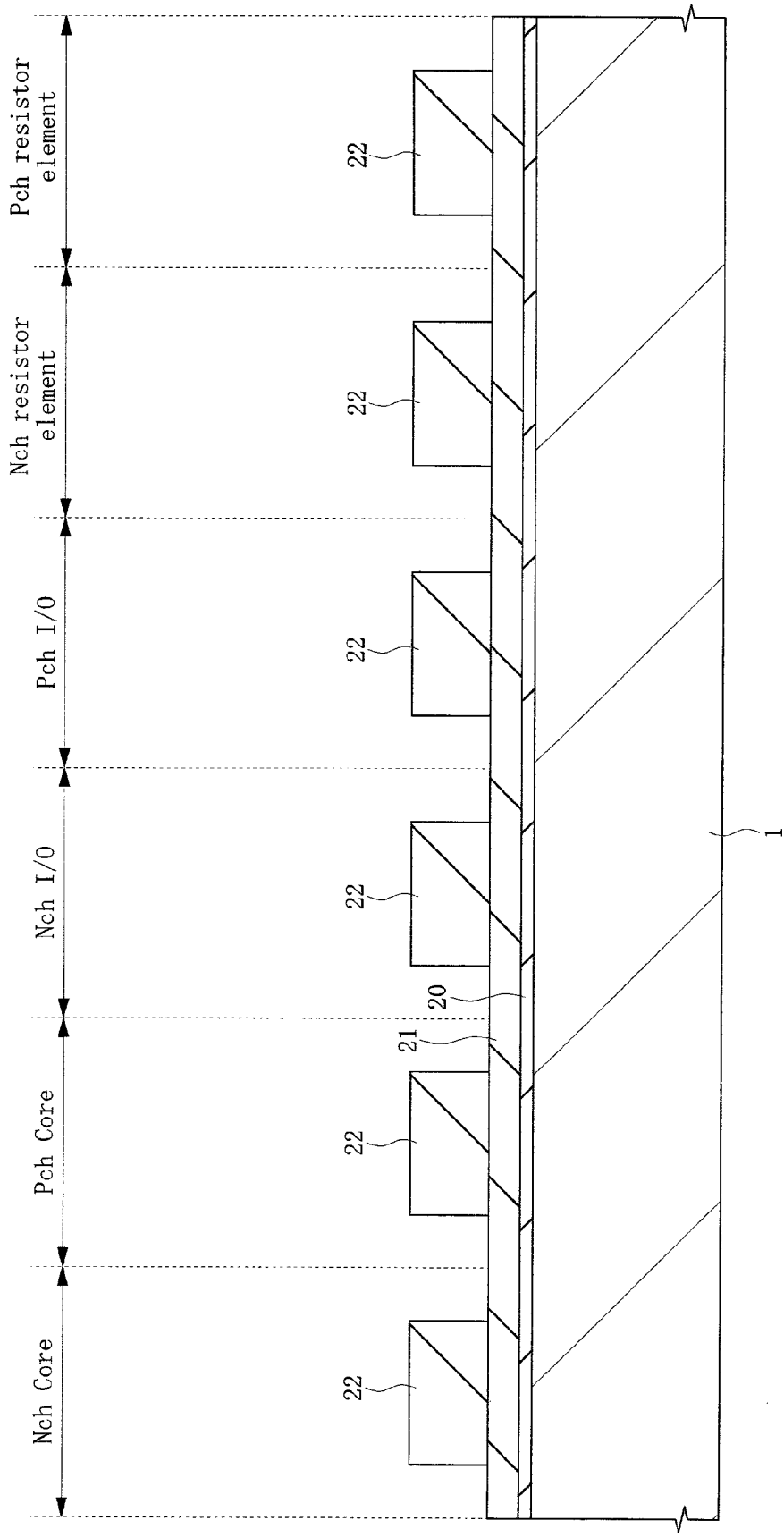
FIG. 11 is a cross-sectional view of a principal part illustrating a step of manufacturing the semiconductor device according to the first embodiment.

First, as illustrated in FIG. 11, a semiconductor substrate 1 (a thin semiconductor plate having a substantially planar circular shape, which is referred to as a semiconductor wafer at this stage) is prepared, the semiconductor substrate being formed by, for example, introducing a p-type impurity such as B into a monocrystalline Si. Subsequently, on a main surface of the semiconductor substrate 1, a $SiO_2$ film 20 and a $Si_3N_4$ film 21 are sequentially formed. A thickness of the $SiO_2$ film 20 is, for example, about 10 nm, and a thickness of the $Si_3N_4$ film 21 is, for example, about 80 nm. Subsequently, a resist pattern 22 for covering a region which is to be an active region is formed by using a photolithography method.

Figure 12:
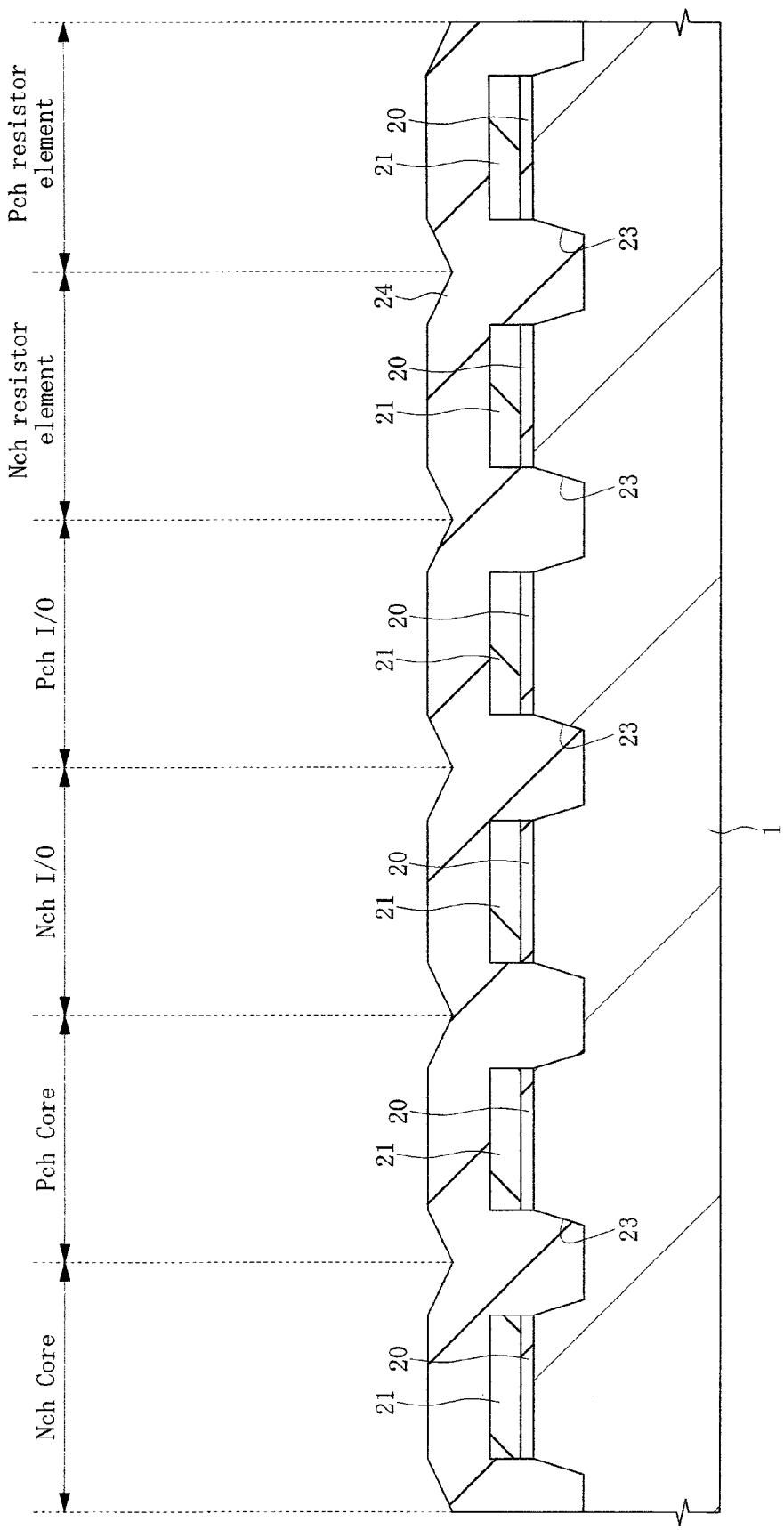
FIG. 12 is a cross-sectional view of the same principal part as that of FIG. 11 in the step of manufacturing the semiconductor device, which is continued from FIG. 11.

Next, as illustrated in FIG. 12, the $Si_3N_4$ film 21, the $SiO_2$ film 20, and the semiconductor substrate 1, which expose from the resist pattern 22, are sequentially removed with using the resist pattern 22 as a mask by using, for example, a dry etching method, and a trench 23 is formed in the semiconductor substrate 1, and then, the resist pattern 22 is removed. Subsequently, an inner wall of the trench 23 is subjected to nitriding and oxidizing processes, and then, an oxide film 24 is formed on the main surface of the semiconductor substrate 1 so as to be embedded inside the trench 23. This oxide film is, for example, a TEOS film formed by using a plasma CVD method with using TEOS and ozone as source gases, a $SiO_2$ film or a polysilazane film formed by using a high density plasma CVD method, or others. Subsequently, a thermal treatment is performed thereto. This thermal treatment is performed at, for example, 1100° C.

Figure 13:
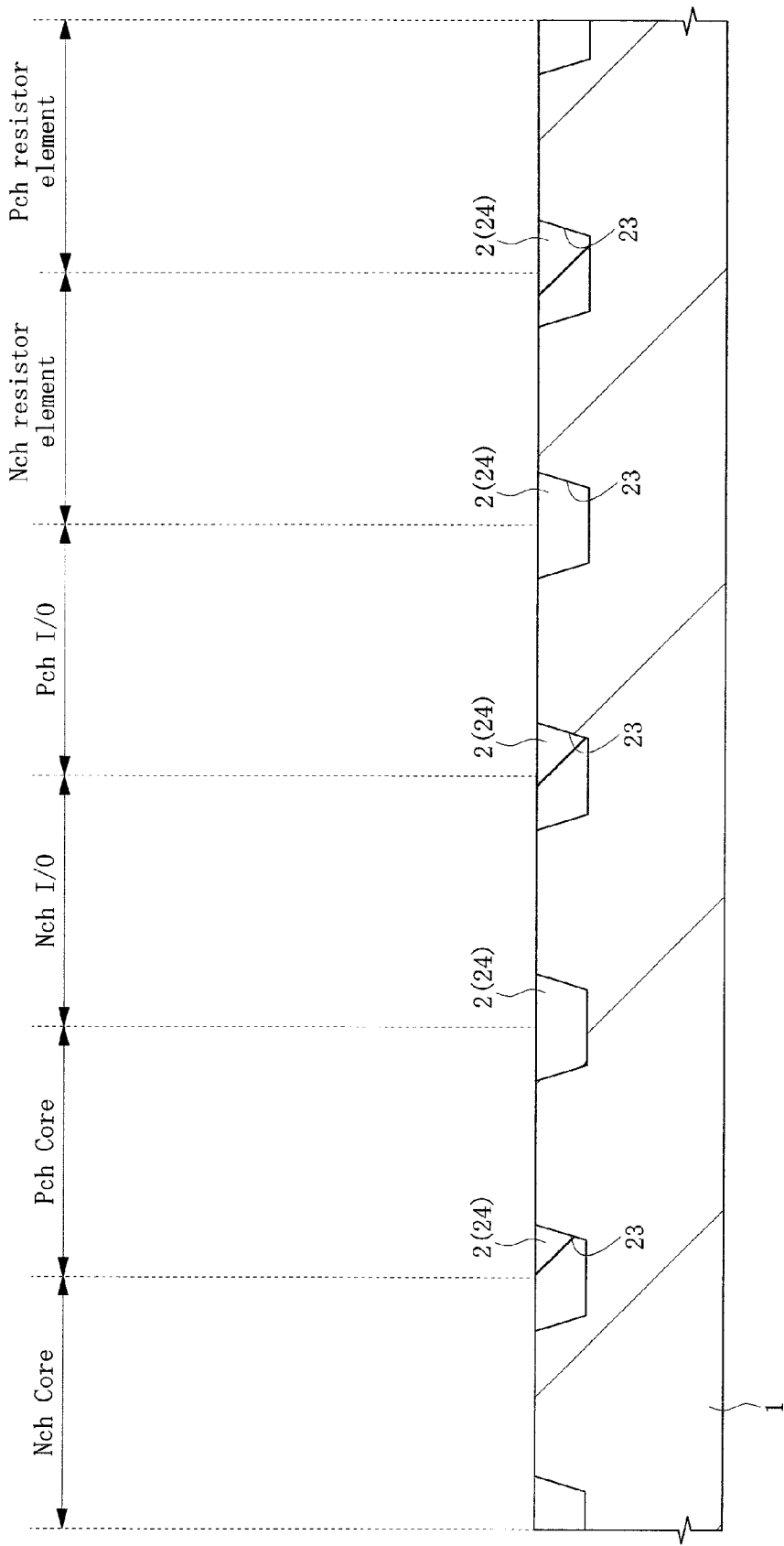
FIG. 13 is a cross-sectional view of the same principal part as that of FIG. 11 in the step of manufacturing the semiconductor device, which is continued from FIG. 12.

Next, as illustrated in FIG. 13, a surface of the oxide film 24 is polished by using, for example, a CMP (Chemical Vapor Deposition) method so as to form the element separation portion 2 in which the oxide film 24 is embedded inside the trench 23. The active region is divided by the element separation portion 2 so as to form the core nMIS formation region, the core pMIS formation region, the I/O nMIS formation region, the I/O pMIS formation region, the n-channel resistor element formation region, and the p-channel resistor element formation region.

Figure 14:
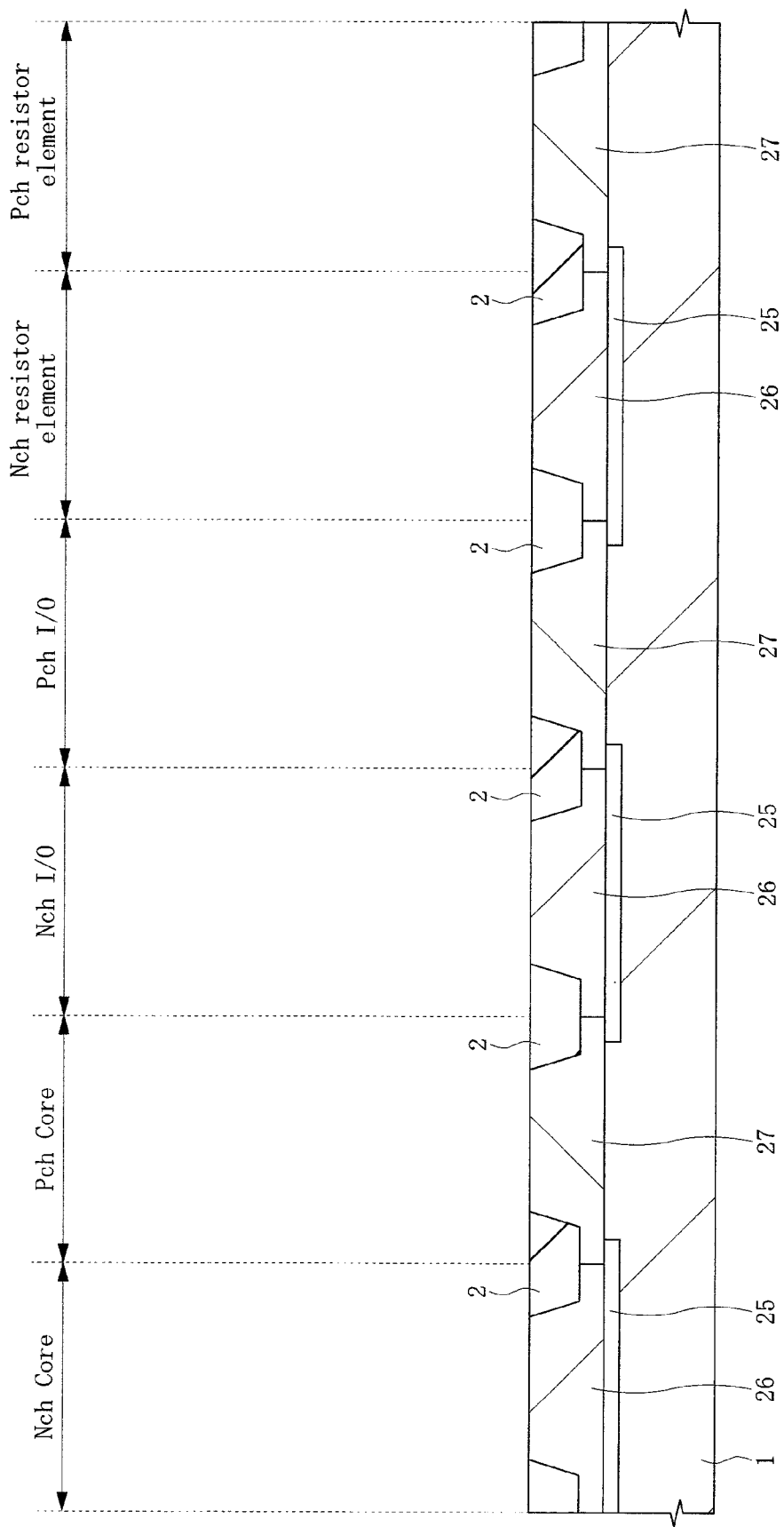
FIG. 14 is a cross-sectional view of the same principal part as that of FIG. 11 in the step of manufacturing the semiconductor device, which is continued from FIG. 13.

Next, as illustrated in FIG. 14, an embedded n-well 25 is formed by selectively introducing an n-type impurity into the core nMIS formation region, the I/O nMIS formation region, and the n-channel resistor element formation region of the semiconductor substrate 1 by using an ion injection method. Subsequently, a p-well 26 is formed by selectively introducing a p-type impurity into the core nMIS formation region, the I/O nMIS formation region, and the n-channel resistor element formation region of the semiconductor substrate 1 by using the ion injection method. Similarly, an n-well 27 is formed by selectively introducing an n-type impurity into the core pMIS formation region, the I/O pMIS formation region, and the p-channel resistor element formation region of the semiconductor substrate 1 by using the ion injection method.

Figure 15:
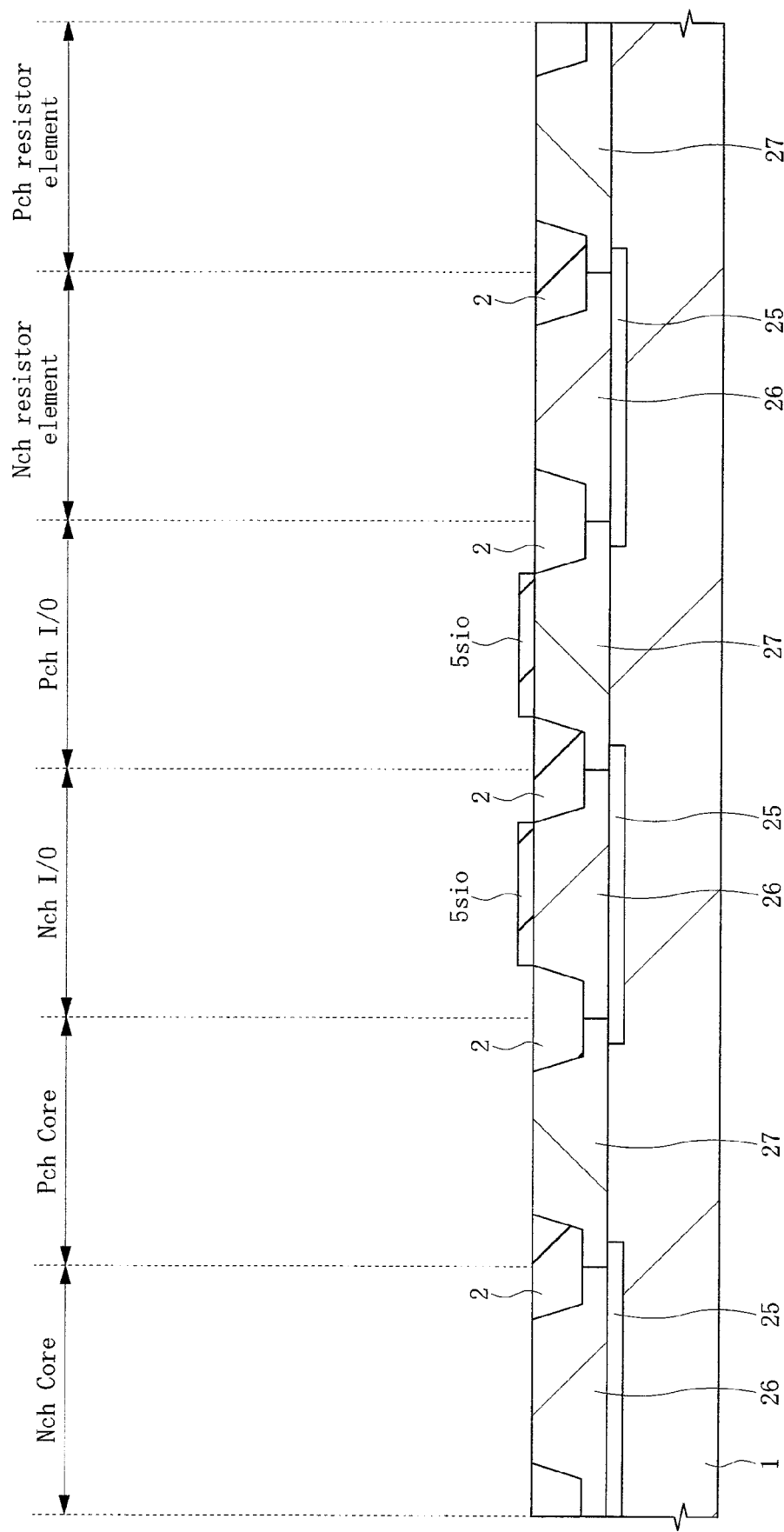
FIG. 15 is a cross-sectional view of the same principal part as that of FIG. 11 in the step of manufacturing the semiconductor device, which is continued from FIG. 14.

Next, as illustrated in FIG. 15, the oxide film 5sio is formed on the main surface of the semiconductor substrate 1 by using, for example, a thermal oxidizing method. A thickness of the oxide film 5sio is set to, for example, about 2 to 6 nm. Subsequently, the oxide film 5sio formed in the I/O nMIS formation region and the I/O pMIS formation region remains by removing the oxide films 5sio in the core nMIS formation region, the core pMIS formation region, the n-channel resistor element formation region, and the p-channel resistor element formation region.

Figure 16:
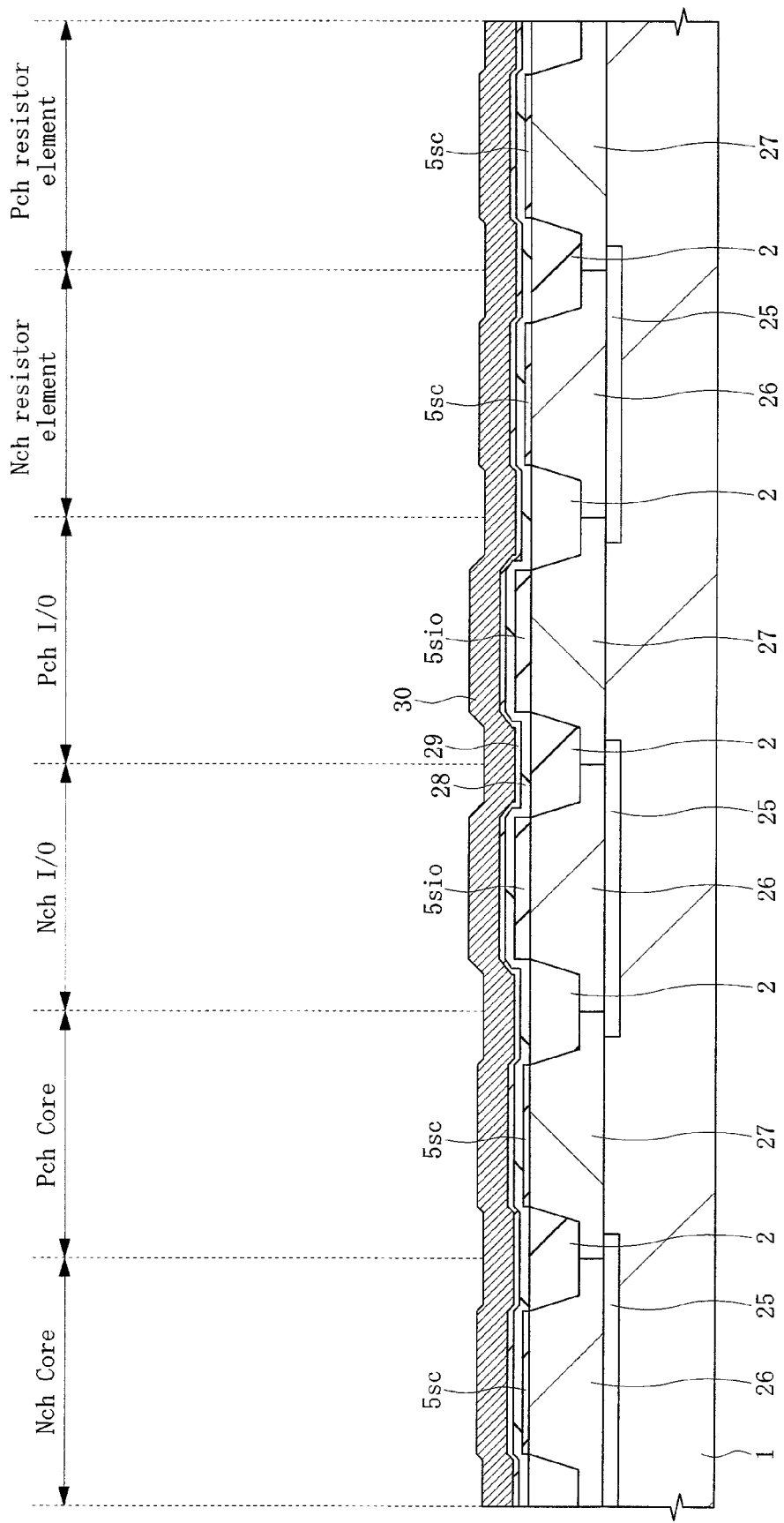
FIG. 16 is a cross-sectional view of the same principal part as that of FIG. 11 in the step of manufacturing the semiconductor device, which is continued from FIG. 15.

Next, as illustrated in FIG. 16, an oxide film 5sc is formed on the main surface of the semiconductor substrate 1 by using, for example, a thermal oxidizing method. A thickness of the oxide film 5sc is set to, for example, about 1 nm. In this manner, the oxide film 5sc is formed in the core nMIS formation region, the core pMIS formation region, the n-channel resistor element formation region and the p-channel resistor element formation region in the main surface of the semiconductor substrate 1, and the oxide film 5sio is formed in the I/O nMIS formation region and the I/O pMIS formation region in the main surface of the semiconductor substrate 1.

Subsequently, for example, a HfON film 28 is formed on the main surface of the semiconductor substrate 1. The HfON film 28 is formed by using, for example, a CVD method or an ALD (Atomic Layer Deposition) method, and a thickness thereof is set to, for example, about 1 nm. Instead of the HfON film 28, for example, other hafnium-based insulating film such as a HfSiON film, a HfSiO film, or a $HfO_2$ film, may also be used.

Subsequently, it is subjected to a nitriding process, and then, for example, an AlO film 29 (cap film 6p) is deposited on the HfON film 28. The AlO film 29 is formed by using, for example, a sputtering method, and a thickness thereof is set to, for example, about 0.1 to 1.5 nm. Subsequently, for example, a TiN film 30 is deposited on the AlO film 29. The TiN film 30 is formed by using, for example, the sputtering method, and a thickness thereof is set to, for example, about 5 to 15 nm.

Figure 17:
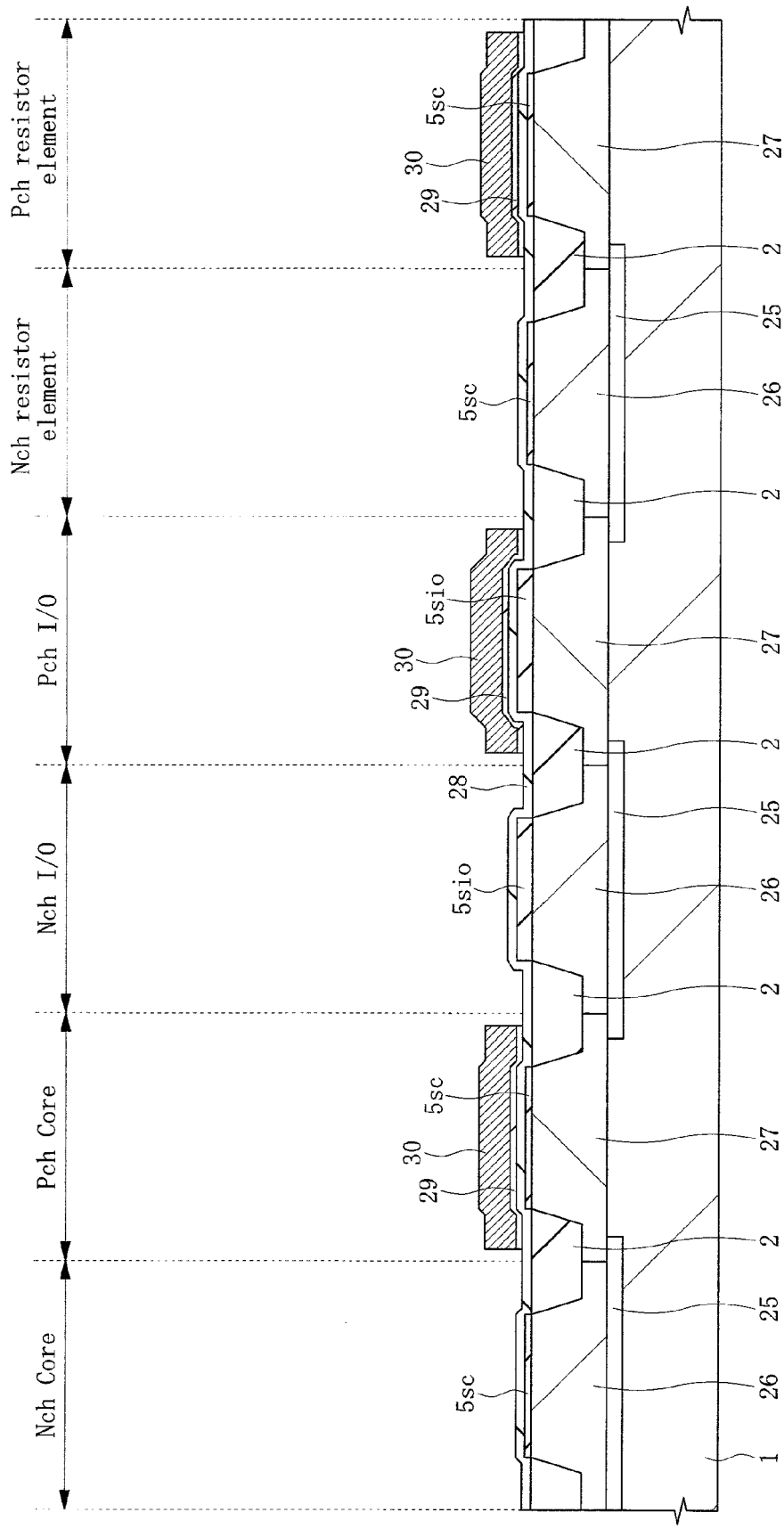
FIG. 17 is a cross-sectional view of the same principal part as that of FIG. 11 in the step of manufacturing the semiconductor device, which is continued from FIG. 16.

Next, as illustrated in FIG. 17, by using a photolithography method, a resist pattern (whose illustration is omitted) for covering the core pMIS formation region, the I/O pMIS formation region, and the p-channel resistor element formation region, is formed. Subsequently, the TiN film 30 and the AlO film 29 which expose from the resist pattern are removed with using the resist pattern as a mask, and then, the resist pattern is removed.

Figure 18:
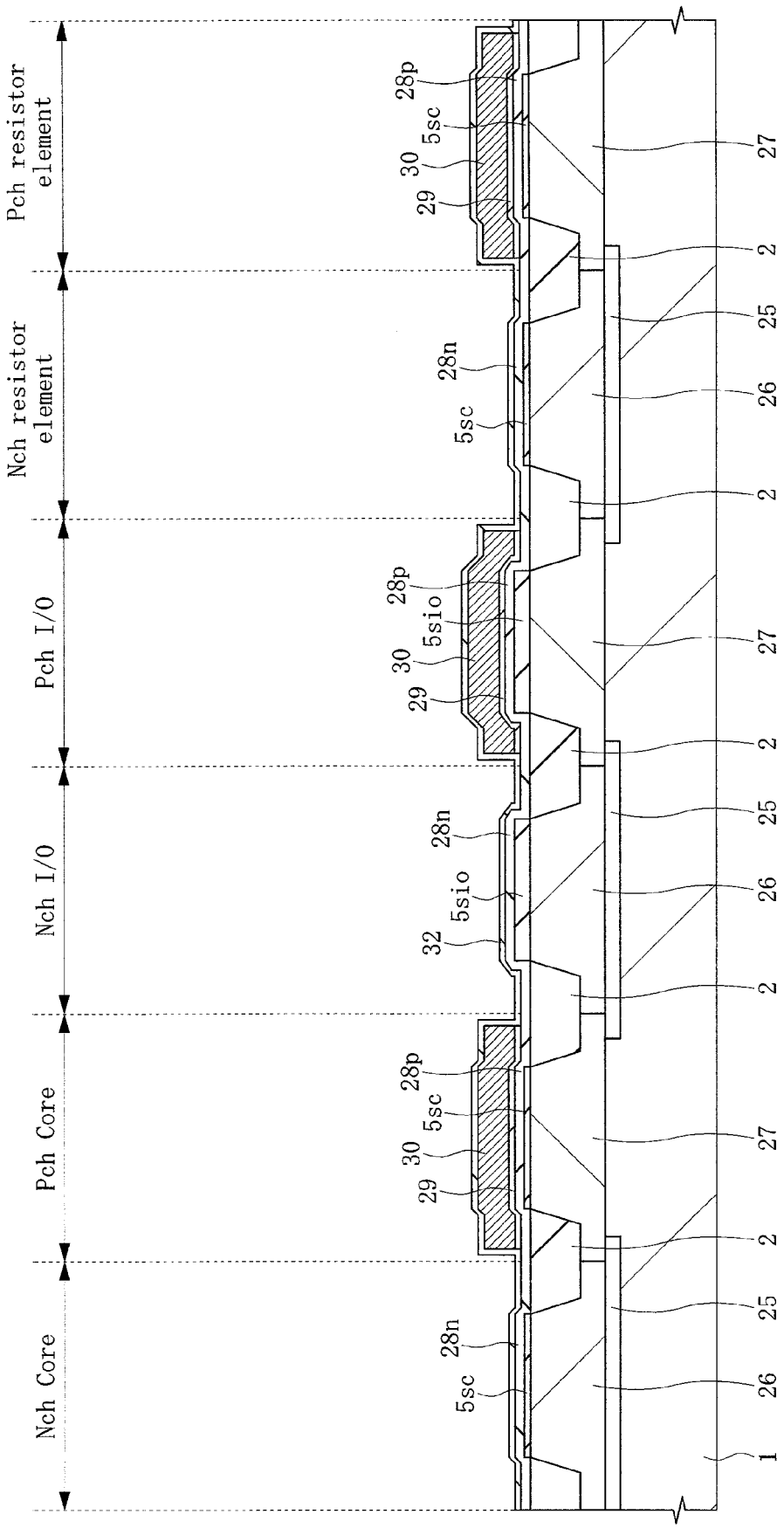
FIG. 18 is a cross-sectional view of the same principal part as that of FIG. 11 in the step of manufacturing the semiconductor device, which is continued from FIG. 17.

Next, as illustrated in FIG. 18, for example, a LaO film 32 (cap film 6n) is deposited on the main surface of the semiconductor substrate 1. The LaO film 32 is formed by using, for example, the sputtering method, and a thickness thereof is set to, for example, about 0.1 to 1.5 nm. Subsequently, a thermal treatment is performed. This thermal treatment is performed, for example, at 1000° C. for 10 seconds. By this thermal treatment, Al is thermally diffused from the AlO film 29 to the HfON film 28 so that each of the HfON films 28 in the core pMIS formation region, the I/O pMIS formation region, and the p-channel resistor element formation region becomes a HfAlON film 28p (high dielectric film 5hp). Moreover, by this thermal treatment, La is thermally diffused from the LaO film 32 to the HfON film 28 so that each of the HfON films 28 in the core nMIS formation region, the I/O nMIS formation region, and the n-channel resistor element formation region becomes an HfLaON film 28n (high dielectric film 5hn).

Figure 19:
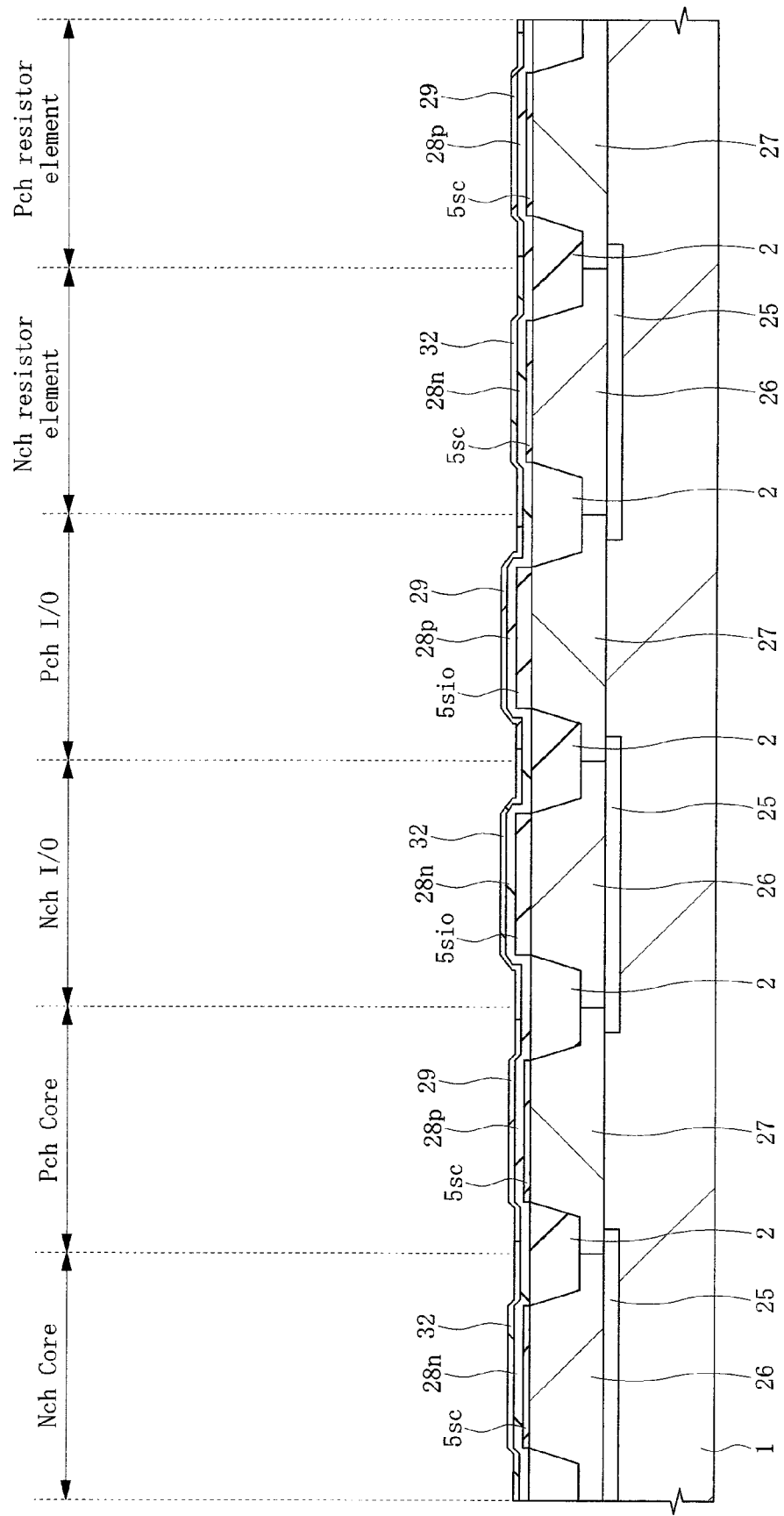
FIG. 19 is a cross-sectional view of the same principal part as that of FIG. 11 in the step of manufacturing the semiconductor device, which is continued from FIG. 18.

Next, as illustrated in FIG. 19, the TiN film 30, the AlO film 29, and the LaO film 32 are removed. Note that all the TiN film 30, the AlO film 29, and the LaO film 32 may be removed.

However, in FIG. 19, the AlO film 29 and the LaO film 32 are not partially removed to remain. In this manner, a gate insulating film (gate insulating film 5nc) formed of the oxide film 5sc and the HfLaON film 28n is formed in the core nMIS formation region and the n-channel resistor element formation region, and a gate insulating film (gate insulating film 5pc) formed of the oxide film 5sc and the HfAlON film 28p is formed in the core pMIS formation region and the p-channel resistor element formation region. Moreover, a gate insulating film (gate insulating film 5nio) formed of the oxide film 5sio and the HfLaON film 28n is formed in the I/O nMIS formation region, and a gate insulating film (gate insulating film 5pio) formed of the oxide film 5sio and the HfAlON film 28p is formed in the I/O pMIS formation region.

Figure 20:
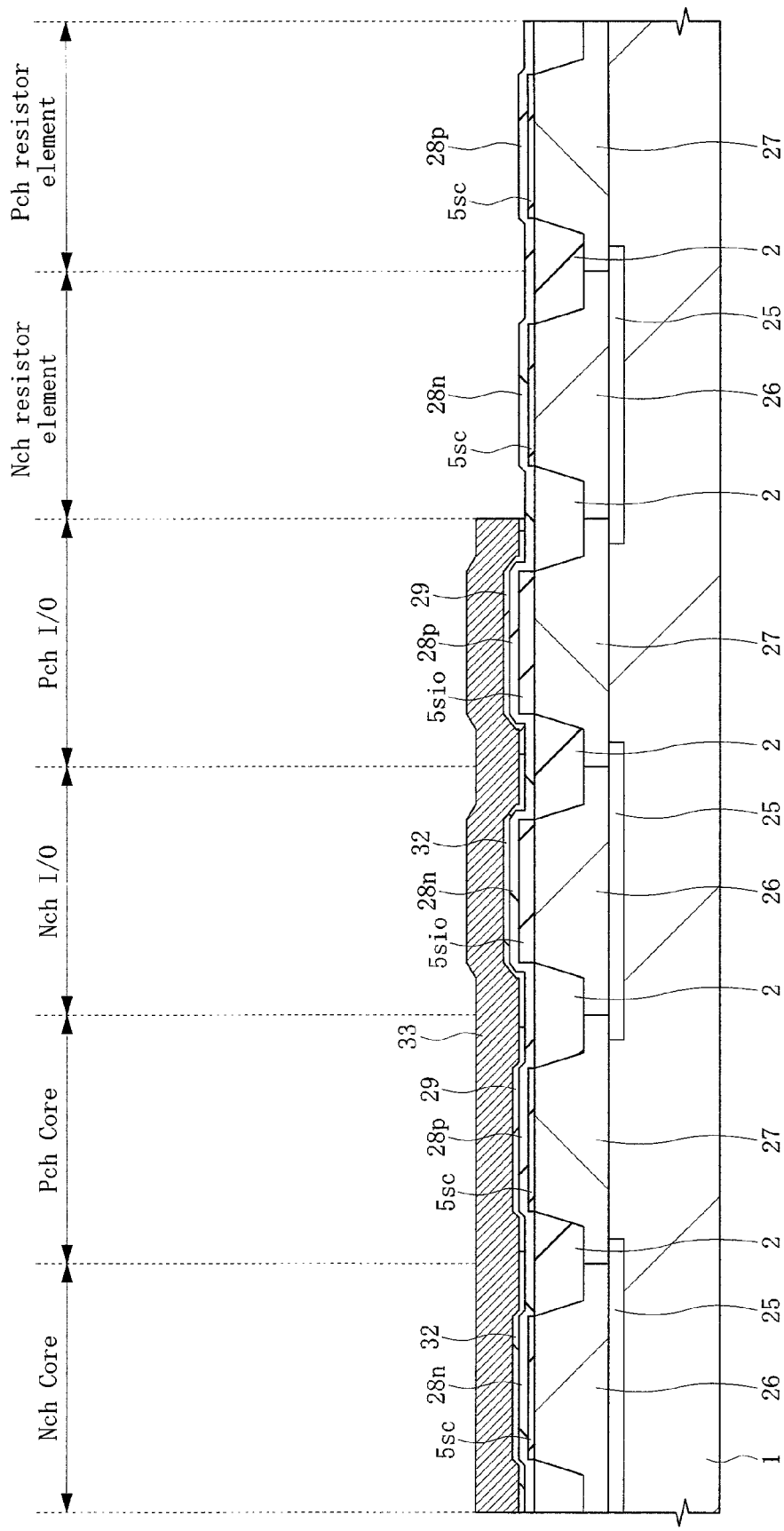
FIG. 20 is a cross-sectional view of the same principal part as that of FIG. 11 in the step of manufacturing the semiconductor device, which is continued from FIG. 19.

Next, as illustrated in FIG. 20, for example, a TiN film 33 is deposited on the main surface of the semiconductor substrate 1. The TiN film 33 is formed by using, for example, a sputtering method, and a thickness thereof is set to, for example, about 5 to 20 nm. Subsequently, by using a photolithography method, a resist pattern (whose illustration is omitted) for covering the core nMIS formation region, the core pMIS formation region, the I/O nMIS formation region, and the I/O pMIS formation region is formed. Subsequently, the TiN film 33, the AlO film 29, and the LaO film 32 which expose from the resist pattern are removed with using the resist pattern as a mask, and then, the resist pattern is removed. Note that it is not required to remove the AlO film 29 and the LaO film 32. However, FIG. 20 illustrates the case that the AlO film 29 and the LaO film 32 are removed.

Figure 21:
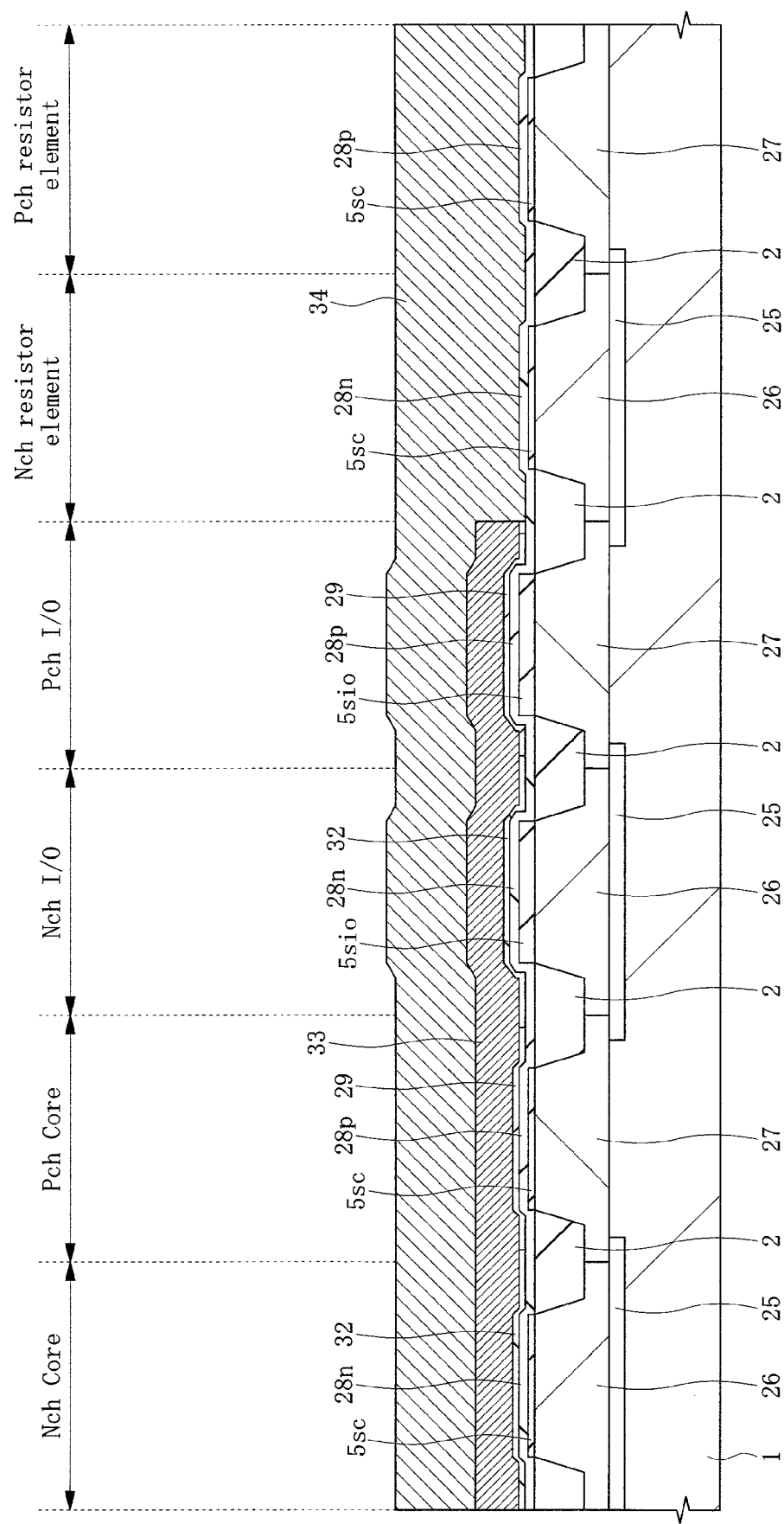
FIG. 21 is a cross-sectional view of the same principal part as that of FIG. 11 in the step of manufacturing the semiconductor device, which is continued from FIG. 20.

Next, as illustrated in FIG. 21, for example, a polycrystalline Si film 34 is deposited on the main surface of the semiconductor substrate 1. The polycrystalline Si film 34 is formed by using, for example, the CVD method, and a thickness thereof is set to, for example, about 30 to 80 nm. Subsequently, a thermal treatment is performed. This thermal treatment is performed, for example, at 1000° C. for 10 seconds.

Figure 22:
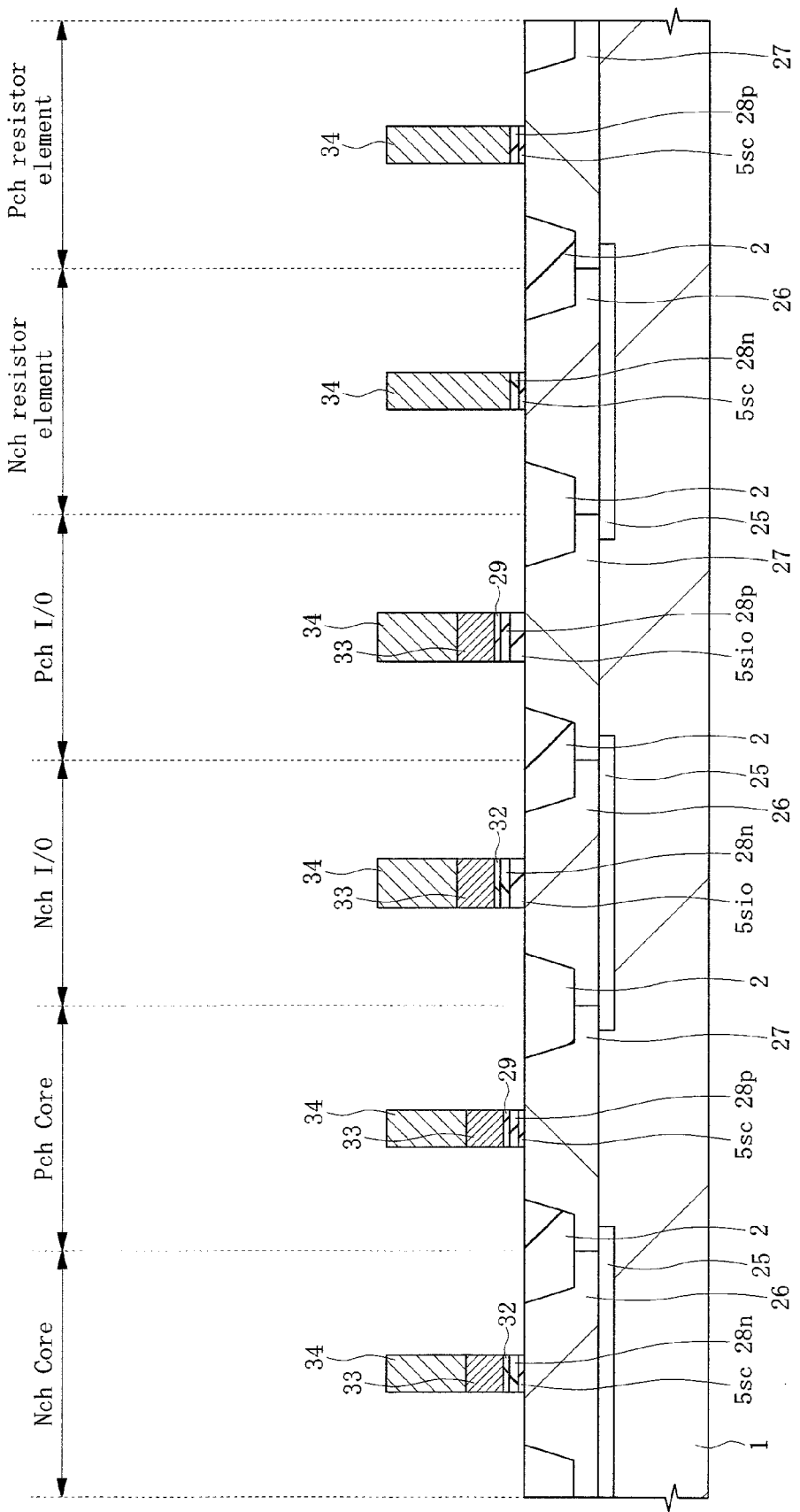
FIG. 22 is a cross-sectional view of the same principal part as that of FIG. 11 in the step of manufacturing the semiconductor device, which is continued from FIG. 21.

Next, as illustrated in FIG. 22, by using the photolithography method and the dry etching method, the polycrystalline Si film 34, the TiN film 33, the LaO film 32, the AlO film 29, the HfAlON film 28p, the HfLaON film 28n, the oxide film 5sio, and the oxide film 5sc are processed.

In this manner, the gate having the Nch stack gate structure is formed in the core nMIS formation region, the structure including: the gate insulating film (gate insulating film 5nc) formed of the stacked film of the oxide film 5sc and the HfLaON film 28n (high dielectric film 5hn); the LaO film 32 (cap film 6n); and the gate electrode (gate electrode 7) formed of the stacked film of the TiN film 33 (lower-layer gate electrode 7D) and the polycrystalline Si film 34 (upper-layer gate electrode 7U). Moreover, the gate having the Pch stack gate structure is formed in the core pMIS formation region, the structure including: the gate insulating film (gate insulating film 5pc) formed of the stacked film of the oxide film 5sc and the HfAlON film 28p (high dielectric film 5hp); the AlO film 29 (cap film 6p); and the gate electrode (gate electrode 7) formed of the stacked film of the TiN film 33 (lower-layer gate electrode 7D) and the polycrystalline Si film 34 (upper-layer gate electrode 7U).

Also, the gate having the Nch stack gate structure is formed in the I/O nMIS formation region, the structure including: the gate insulating film (gate insulating film 5nio) formed of the stacked film of the oxide film. 5sio and the HfLaON film. 28n (high dielectric film 5hn); the LaO film 32 (cap film 6n); and the gate electrode (gate electrode 7) formed of the stacked film of the TiN film 33 (lower-layer gate electrode 7D) and the polycrystalline Si film 34 (upper-layer gate electrode 7U). Moreover, the gate having the Pch stack gate structure is formed in the I/O pMIS formation region, the structure including: the gate insulating film (gate insulating film 5pio) formed of the stacked film of the oxide film 5sio and the HfAlON film 28p (high dielectric film 5hp); the AlO film 29 (cap film 6p); and the gate electrode (gate electrode 7) formed of the stacked film of the TiN film 33 (lower-layer gate electrode 7D) and the polycrystalline Si film 34 (upper-layer gate electrode 7U).

Further, the gate having the Nch gate structure is formed in the n-channel resistor element formation region, the structure including: the gate insulating film (gate insulating film 5nc) formed of the stacked film of the oxide film 5sc and the HfLaON film 28n (high dielectric film 5hn); and the gate electrode (gate electrode 7) formed of the polycrystalline Si film 34 (upper-layer gate electrode 7U). The gate having the Pch gate structure is formed in the p-channel resistor element formation region, the structure including: the gate insulating film (gate insulating film 5pc) formed of the stacked film of the oxide film 5sc and the HfAlON film 28p (high dielectric film 5hp); and the gate electrode (gate electrode 7) formed of the polycrystalline Si film 34 (upper-layer gate electrode 7U).

Figure 23:
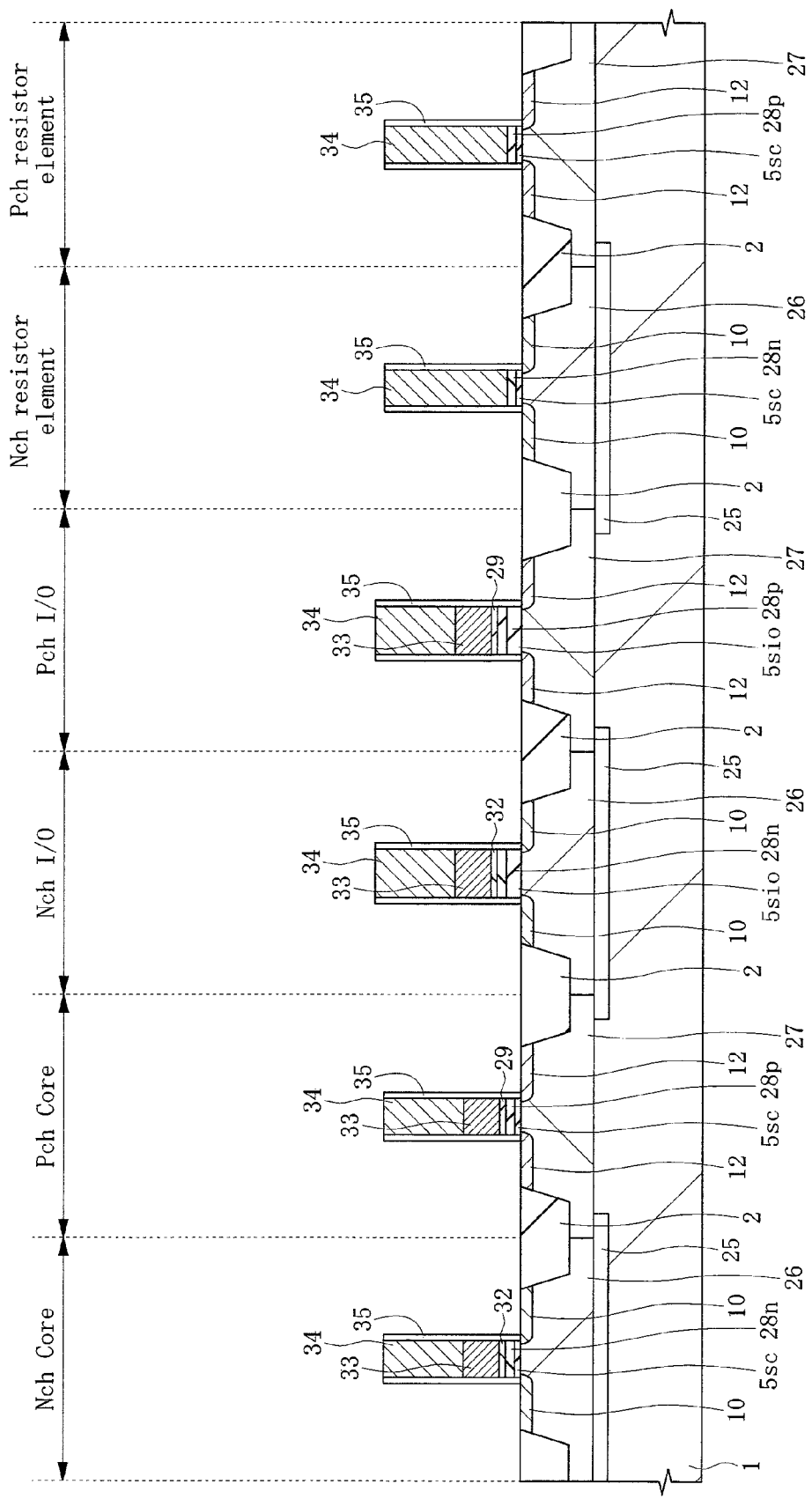
FIG. 23 is a cross-sectional view of the same principal part as that of FIG. 11 in the step of manufacturing the semiconductor device, which is continued from FIG. 22.

Next, as illustrated in FIG. 23, an offset side wall 35 formed of, for example, a $Si_3N_4$ film is formed on the side wall of the gate of each of the core nMIS, the core pMIS, the I/O nMIS, the I/O pMIS, the n-channel resistor element, and the p-channel resistor element. The offset side wall 35 is formed by using, for example, the CVD method, and a thickness thereof is set to, for example, about 5 nm. Subsequently, by using the ion injection method, the n-type diffusion region 10 is formed in a self-alignment process to the gate of each of the core nMIS formation region, the I/O nMIS formation region, and the n-channel resistor element formation region. The n-type diffusion region 10 is a semiconductor region, and is formed by introducing an n-type impurity such as P or As into the semiconductor substrate 1. Similarly, the p-type diffusion region 12 is formed in the self-alignment process to the gate of each of the core pMIS formation region, the I/O pMIS formation region, and the p-channel resistor element formation region. The p-type diffusion region 12 is a semiconductor region, and is formed by introducing a p-type impurity such as B into the semiconductor substrate 1.

Figure 24:
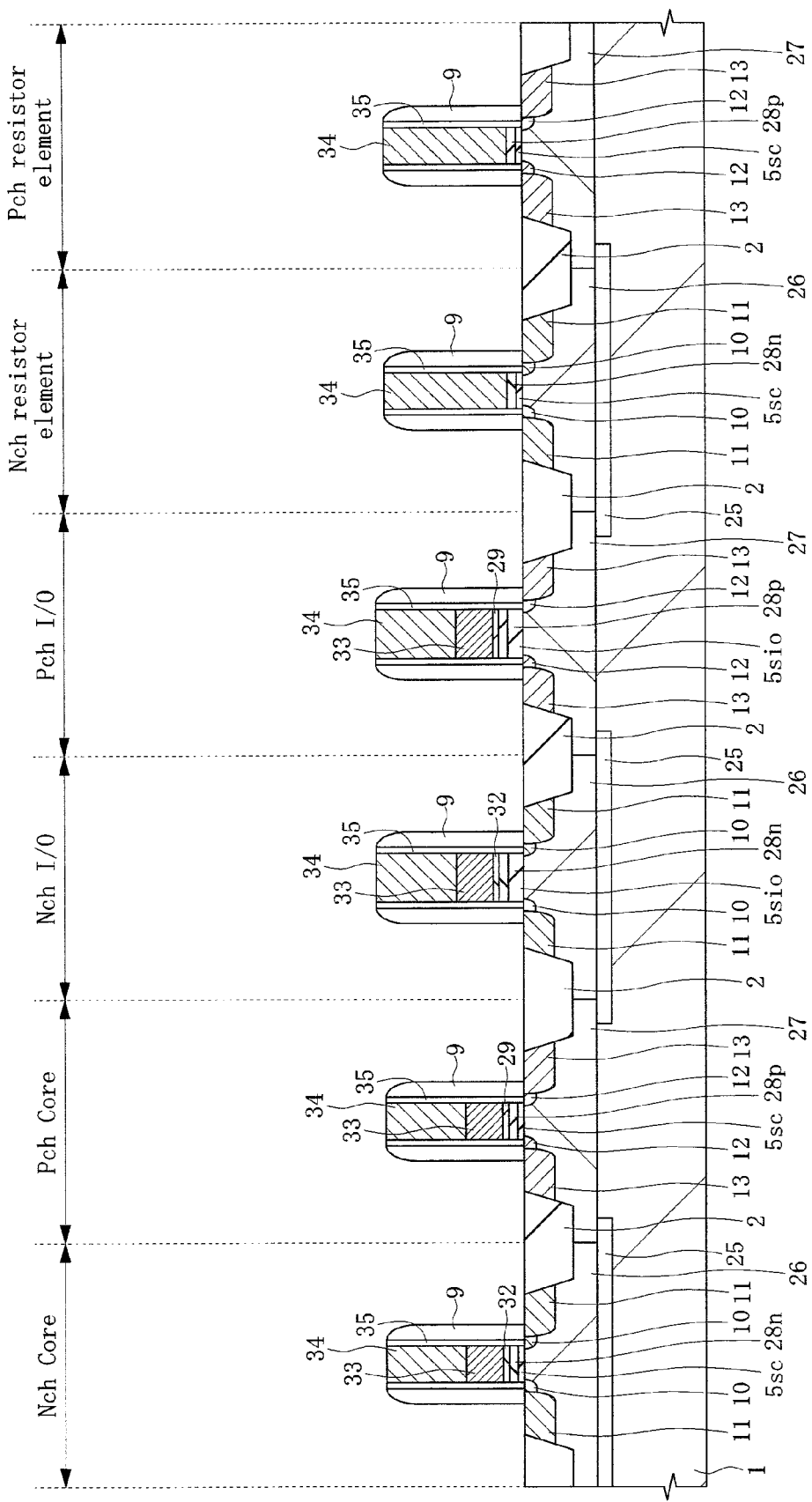
FIG. 24 is a cross-sectional view of the same principal part as that of FIG. 11 in the step of manufacturing the semiconductor device, which is continued from FIG. 23.

Next, as illustrated in FIG. 24, the $Si_3N_4$ film and the $SiO_2$ film are sequentially deposited on the main surface of the semiconductor substrate 1, and then, these $Si_3N_4$ film and $SiO_2$ film are anisotropically etched by using the dry etching method. In this manner, a sidewall 9 is formed on the side wall of the gate of each of the core nMIS, the core pMIS, the I/O nMIS, the I/O pMIS, the n-channel resistor element, and the p-channel resistor element.

Subsequently, by using the ion injection method, the n-type diffusion region 11 is formed in the self-alignment process to the gate and the sidewall 9 of each of the core nMIS formation region, the I/O nMIS formation region, and the n-channel resistor element formation region. The n-type diffusion region 11 is a semiconductor region, and is formed by introducing an n-type impurity such as P or As into the semiconductor substrate 1. Similarly, the p-type diffusion region 13 is formed in the self-alignment process to the gate and the side wall 9 of each of the core pMIS formation region, the I/O pMIS formation region, and the p-channel resistor element formation region. The p-type diffusion region 13 is a semiconductor region, and is formed by introducing a p-type impurity such as B into the semiconductor substrate 1.

Subsequently, a thermal treatment is performed. This thermal treatment is performed, for example, at 1000° C. for 10 seconds and at 1230° C. for several milliseconds. By this thermal treatment, the n-type impurity introduced into the n-type diffusion region 10 and the n-type diffusion region 11 in each of the core nMIS formation region, the I/O nMIS formation region, and the n-channel resistor element formation region is activated, and the p-type impurity introduced into the p-type diffusion region 12 and the p-type diffusion region 13 in each of the core pMIS formation region, the I/O pMIS formation region, and the p-channel resistor element formation region is activated, so that the source and drain regions are formed.

Figure 25:
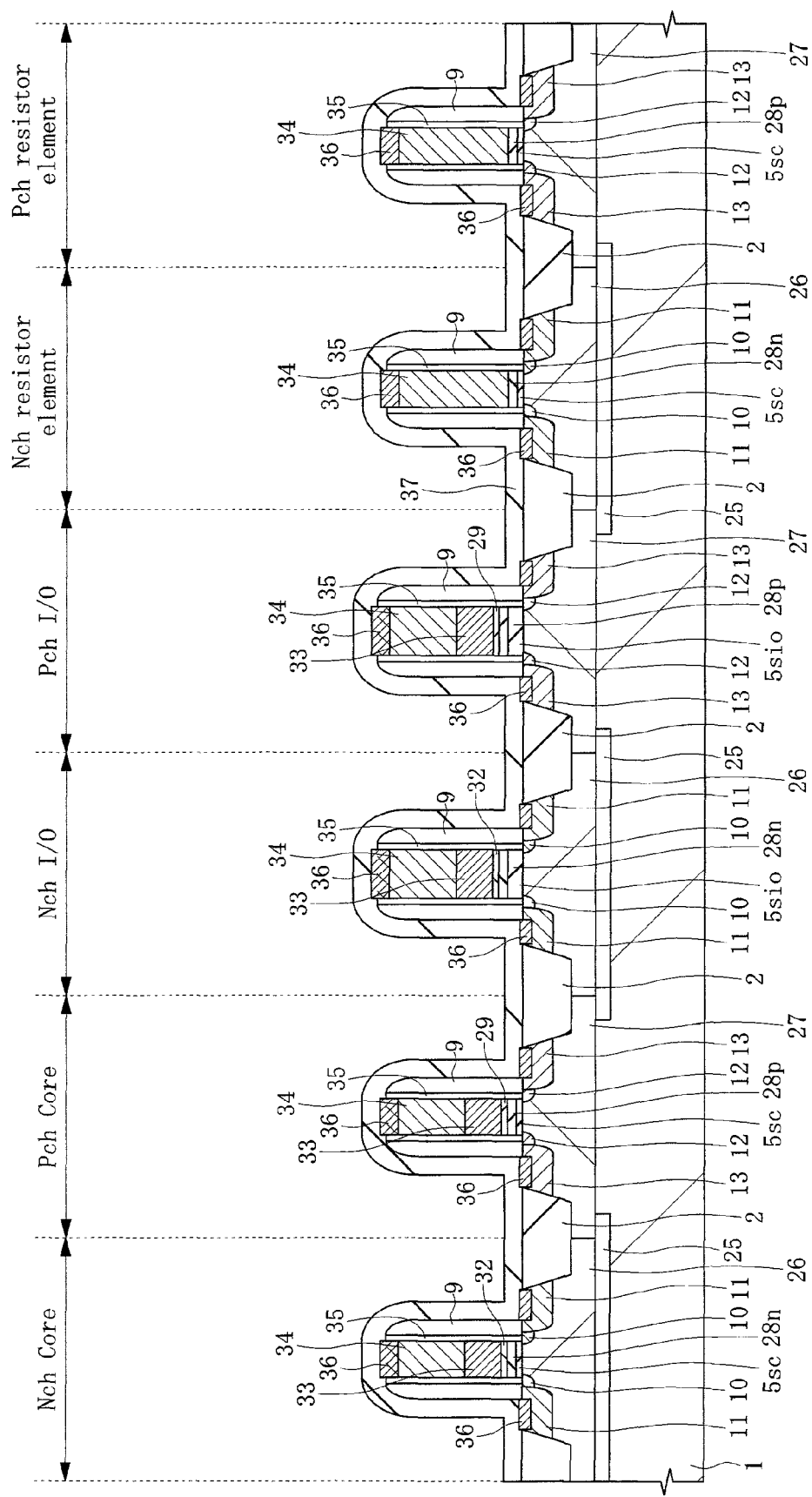
FIG. 25 is a cross-sectional view of the same principal part as that of FIG. 11 in the step of manufacturing the semiconductor device, which is continued from FIG. 24.

Next, as illustrated in FIG. 25, a Ni film is formed on the main surface of the semiconductor substrate 1, and then, a thermal treatment is performed. This thermal treatment is performed at, for example, 450° C. By this thermal treatment, solid-phase reactions between Si and Ni forming the semiconductor substrate 1 and between Si and Ni forming the polycrystalline Si film 34 are caused so as to form NiSi, and, subsequently, unreacted Ni is removed by using a mixed solution of $H_2SO_4$ and $H_2O_2$, so that a NiSi film 36 (silicide film 8) is formed on surfaces of the source and drain regions and on an upper surface of the gate electrode 7. Instead of the NiSi film 36, for example, a PtSi film or others may be also used.

Subsequently, a $Si_3N_4$ film 37 is deposited on the main surface of the semiconductor substrate 1. The $Si_3N_4$ film 37 is formed by using, for example, the CVD method, and a thickness thereof is set to, for example, about 30 nm.

Figure 26:
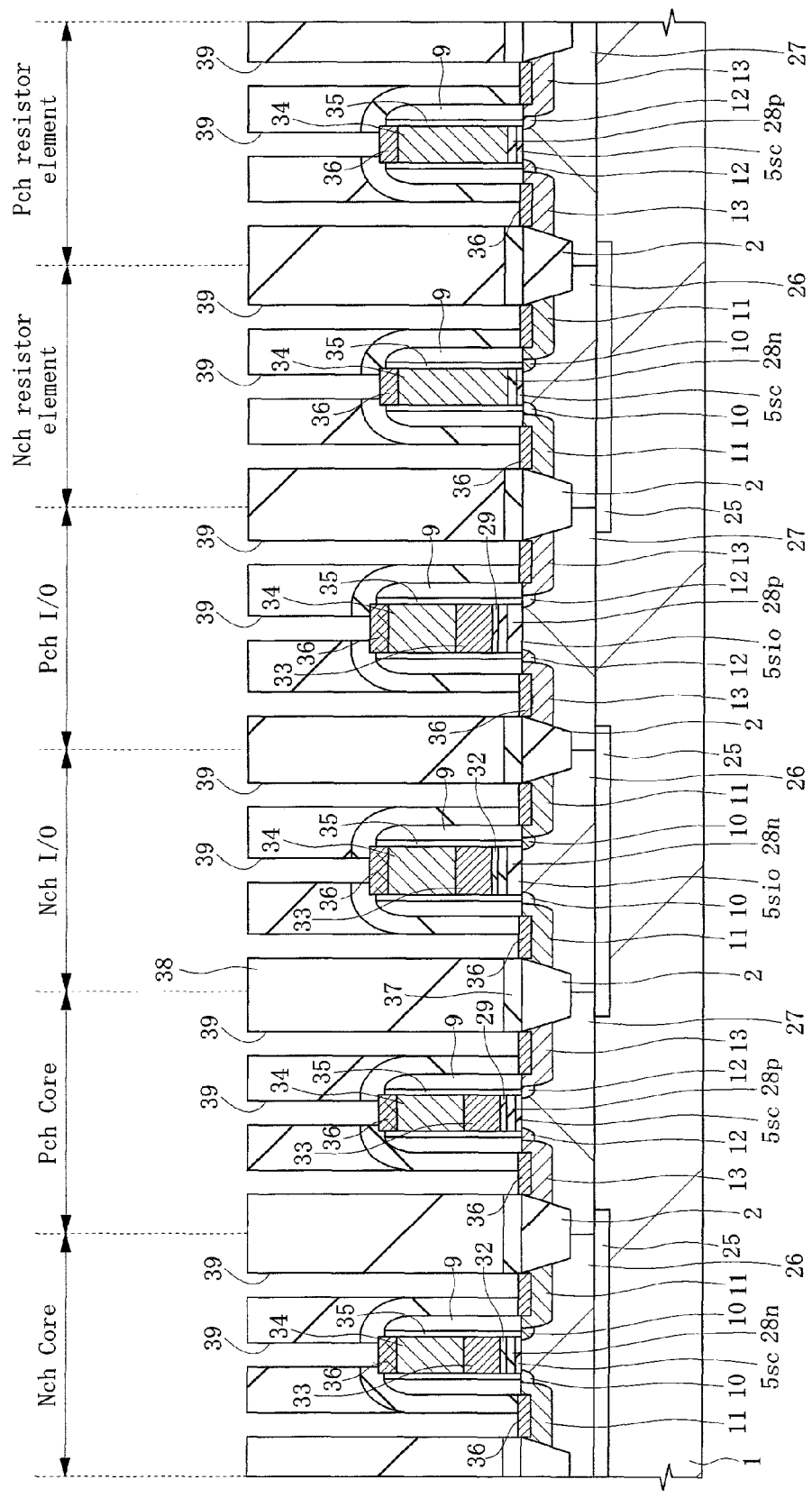
FIG. 26 is a cross-sectional view of the same principal part as that of FIG. 11 in the step of manufacturing the semiconductor device, which is continued from FIG. 25.

Next, as illustrated in FIG. 26, an interlayer insulating film 38 is formed on the main surface of the semiconductor substrate 1. The interlayer insulating film 38 is a TEOS film formed by, for example, the plasma CVD method. Subsequently, a surface of the interlayer insulating film 38 is flattened by using, for example, the CMP method, and then, a connection hole 39 is formed in the $Si_3N_4$ film 37 and the interlayer insulating film 38 by using the photolithography method and the dry etching method.

Figure 27:
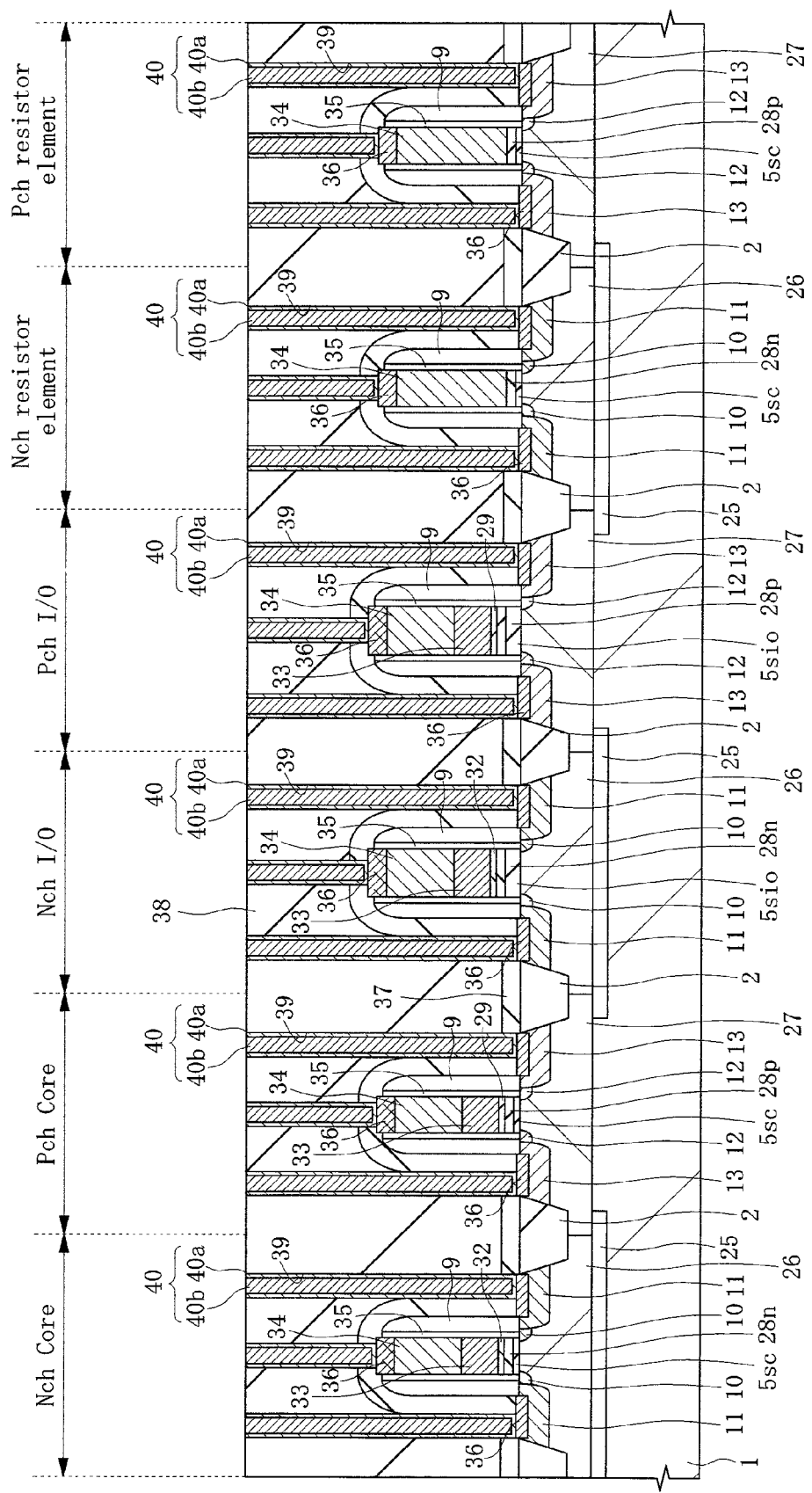
FIG. 27 is a cross-sectional view of the same principal part as that of FIG. 11 in the step of manufacturing the semiconductor device, which is continued from FIG. 26.

Next, as illustrated in FIG. 27, a TiN film 40a is formed on the interlayer insulating film 38 including a bottom surface and an inner wall of the connection hole 39 by using, for example, the sputtering method. The TiN film 40a has a so-called barrier function for, for example, preventing diffusion of a material to be embedded into the connection hole 39 in a later process. Subsequently, a W film 40b is formed on the main surface of the semiconductor substrate 1 so as to be embedded into the connection hole 39. This W film 40b is formed by using, for example, the CVD method. Subsequently, the W film 40b and the TiN film 40a are polished by using, for example, the CMP method, so that a plug 40 is formed inside the connection hole 39.

Figure 28:
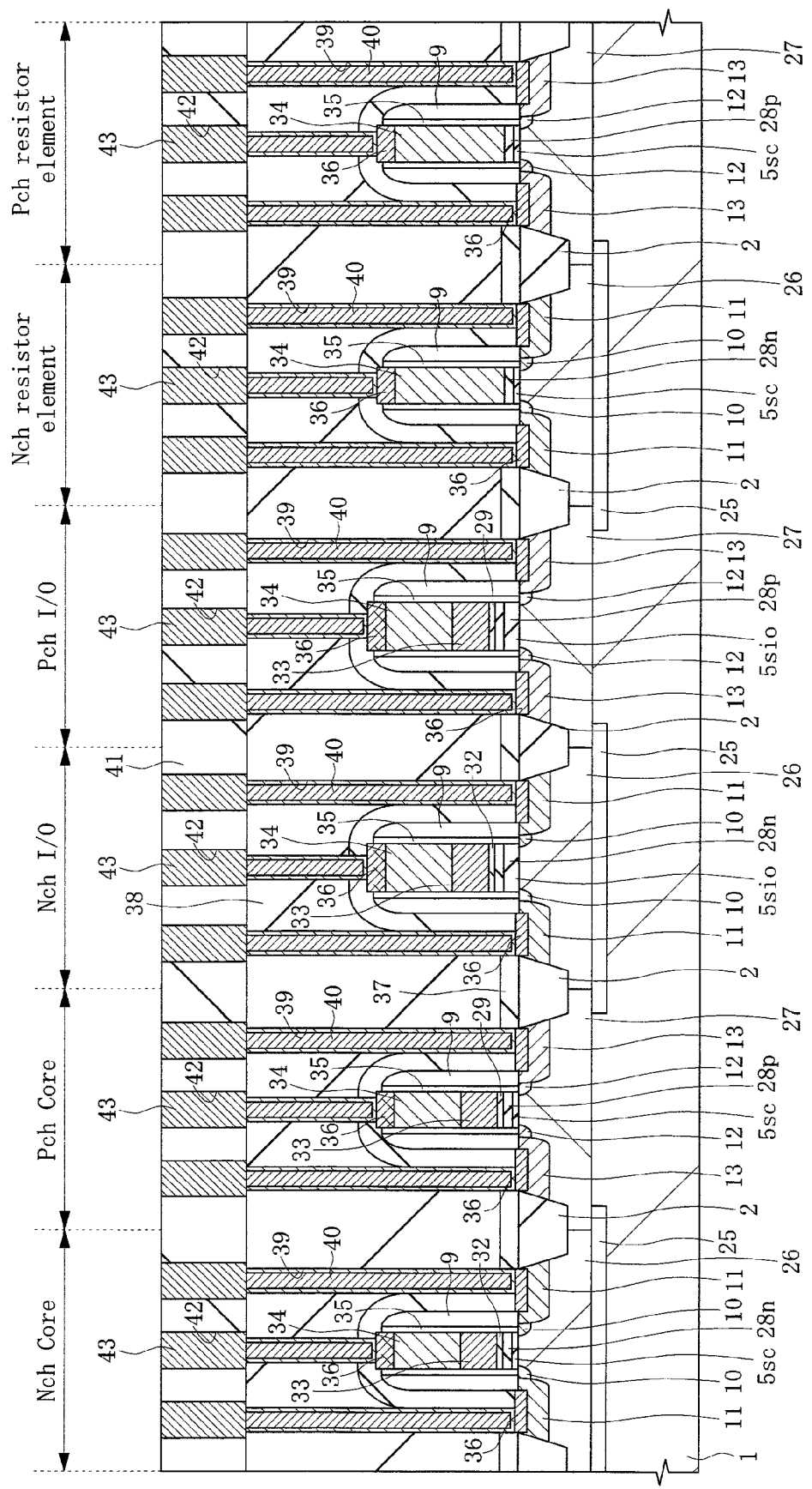
FIG. 28 is a cross-sectional view of the same principal part as that of FIG. 11 in the step of manufacturing the semiconductor device, which is continued from FIG. 27.

Next, as illustrated in FIG. 28, a wiring insulating film 41 is formed on the main surface of the semiconductor substrate 1. The wiring insulating film 41 is formed of, for example, a stacked film obtained by sequentially depositing a TEOS film, a SiCN film, and a $SiO_2$ film. Subsequently, by using the photolithography method and the dry etching method, a wiring trench 42 is formed in the wiring insulating film 41.

Subsequently, a Cu seed layer is formed on the wiring insulating film 41 including a bottom surface and an inner wall of the wiring trench 42 by using, for example, the sputtering method, and then, a Cu film is formed so as to be embedded into the wiring trench 42 by using a plating method. Subsequently, a thermal treatment is performed thereto, and then, the Cu film and the Cu seed layer are polished by using, for example, the CMP method, so that a wiring 43 formed of the Cu film is formed inside the wiring trench 42. Then, an upper-layer wiring is further formed. However, the explanation thereof is omitted here.

By the above-described manufacturing steps, the semiconductor device according to the first embodiment (including the core nMIS, the core pMIS, the I/O nMIS, the I/O pMIS, the n-channel resistor element, and the p-channel resistor element) is substantially completed.

In this manner, according to the first embodiment, the overlapped portion of the gate having the Nch gate stack structure with the element separation portion in the n-channel HK/MG transistor is reduced, so that the quantity of the oxygen supplied from the element separation portion to the gate having the Nch gate stack structure is reduced, and therefore, the increase in the threshold voltage of the n-channel HK/MG transistor can be suppressed. In this manner, in the semiconductor device including the HK/MG transistor, stable operation characteristics can be obtained.

Second Embodiment

The structure of the HK/MG transistor to which the present invention is applied is not limited to the core transistor and the I/O transistor explained in the first embodiment. In a second embodiment, a modified example of the structure of the HK/MG transistor to which the present invention is applied will be explained.

A different point of the core transistor and the I/O transistor according to the second embodiment from the core transistor and the I/O transistor according to the above-described first embodiment is the respective gate structures. More particularly, in the core transistor and the I/O transistor according to the second embodiment, the respective gate electrodes are formed of metal films.

In the above-described first embodiment, each nMIS of the core transistor and the I/O transistor includes, for example, the gate having the Nch gate stack structure including: the gate insulating film formed of the stacked film of the oxide film ($SiO_2$ film) and the high dielectric film (HfLaON film); the cap film (LaO film); and the gate electrode formed of the stacked film of the lower-layer gate electrode (TiN film) and the upper-layer gate electrode (polycrystalline Si film). Moreover, each pMIS of the core transistor and the I/O transistor includes, for example, the gate having the Pch gate stack structure including: the gate insulating film formed of the stacked film of the oxide film ($SiO_2$ film) and the high dielectric film (HfAlON film); the cap film (AlO film); and the gate electrode formed of the stacked film of the lower-layer gate electrode (TiN film) and the upper-layer gate electrode (polycrystalline Si film).

On the other hand, in the second embodiment, each nMIS of the core transistor and the I/O transistor includes a gate having a Nch gate stack structure including: a gate insulating film formed of a stacked film of an oxide film ($SiO_2$ film) and a high dielectric film (HfLaON film); a cap film (LaO film); and a gate electrode formed of a stacked film of a lower-layer gate electrode (TiN film), a middle-layer gate electrode (a work-function adjusting metal film for pMIS), and an upper-layer gate electrode (metal film). Moreover, each pMIS of the core transistor and the I/O transistor includes a gate having a Pch gate stack structure including: a gate insulating film formed of a stacked film of an oxide film ($SiO_2$ film) and a high dielectric film (HfON film); and a gate electrode formed of a stacked film of a middle-layer gate electrode (a work-function adjusting metal film for pMIS) and an upper-layer gate electrode (metal film).

Figure 29:
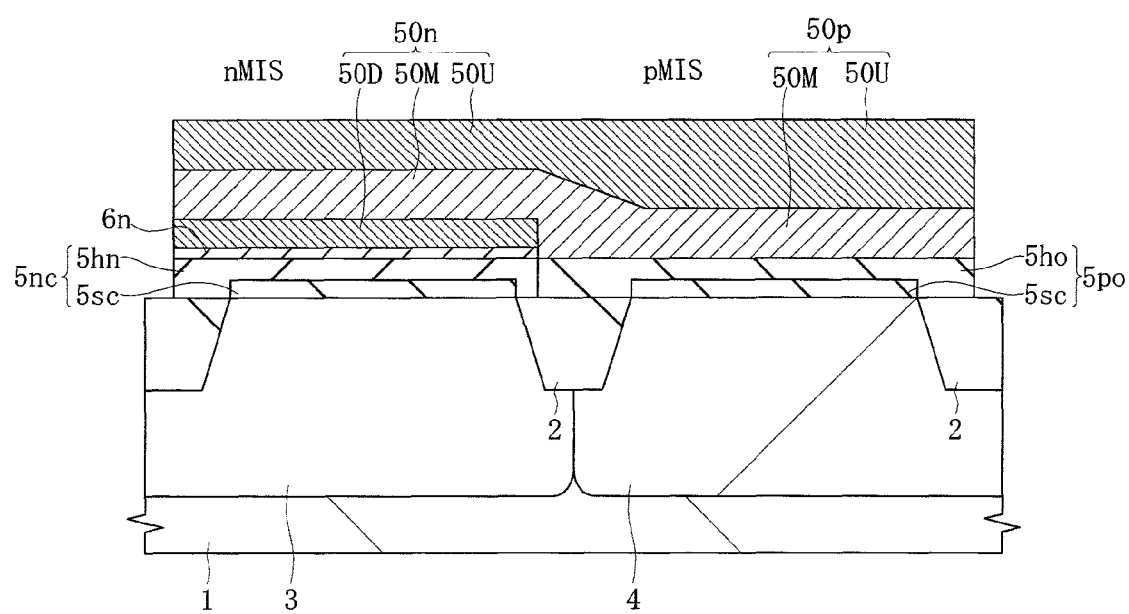
FIG. 29 is a cross-sectional view of a principal part along a gate width direction of an n-channel HK/MG transistor of a core transistor and a p-channel HK/MG transistor thereof according to a second embodiment.

A structure of the core transistor according to the second embodiment will be explained in detail with reference to FIG. 29. FIG. 29 is a cross-sectional view of a principal part along a gate width direction of an n-channel HK/MG transistor and a p-channel HK/MG transistor of the core transistor according to the second embodiment. Note that configuration portions of the I/O transistor and the core transistor are the same as each other except for the thickness of the oxide film forming a part of the gate insulating film, and therefore, the explanation of a structure of the I/O transistor will be omitted here. Also, the core transistor according to the second embodiment is the same as that according to the first embodiment except for the gate structure, and therefore, the explanation thereof will be omitted.

First, the gate structure of the core nMIS will be explained. The gate insulating film and the cap film of the gate of the core nMIS are the same as the gate insulating film 5nc and the cap film 6n of the first embodiment, respectively. However, the gate electrode thereof is different from the gate electrode 7 of the first embodiment.

That is, similarly to the first embodiment, the gate insulating film 5nc formed of the stacked film of the oxide film 5sc and the high dielectric film 5hn is formed on the p-type well 3 formed in the core nMIS formation region in the main surface of the semiconductor substrate 1. Further, the cap film 6n is formed on the gate insulating film 5nc.

However, on the cap film 6n, a gate electrode 50n formed by stacking a plurality of metal films is formed. This gate electrode 50n has a three-layer structure formed by, for example, stacking a lower-layer gate electrode 50D, a middle-layer gate electrode 50M, and an upper-layer gate electrode 50U. The lower-layer gate electrode 50D is formed of, for example, a TiN film. Moreover, the middle-layer gate electrode 50M is a metal film provided for adjusting the threshold voltage of the core pMIS (for adjusting a work function of the high dielectric film), and is formed of, for example, a TiN film. Also, the upper-layer gate electrode 50U is formed of, for example, a metal film containing Al. The silicide film as the first embodiment is not formed on the gate electrode 50n.

Subsequently, the gate structure of the core pMIS will be explained. While the gate insulating film of the gate of the core pMIS is formed of the stacked film of the oxide film and the high dielectric film similarly to the gate insulating film 5pc of the first embodiment, the metal element for adjusting the work function is not introduced into the high dielectric film. Further, the cap film is not formed, and the gate electrode is different from the gate electrode 7 of the first embodiment.

That is, a gate insulating film 5po formed of a stacked film of an oxide film 5sc and a high dielectric film 5ho is formed on the n-type well 4 formed in the core pMIS formation region on the main surface of the semiconductor substrate 1. The high dielectric film 5ho is, for example, a HfON film, and the metal element (such as Al element in the first embodiment) for adjusting the work function is not introduced therein. However, the work function of the high dielectric film 5ho is adjusted by the middle-layer gate electrode 50M formed on the high dielectric film 5ho, so that the threshold voltage of the core pMIS can be adjusted.

A gate electrode 50p is formed on the gate insulating film 5po. This gate electrode 50p has a two-layer structure formed by, for example, stacking a middle-layer gate electrode 50M and an upper-layer gate electrode 50U. The silicide film as the first embodiment is not formed on the gate electrode 50p.

Next, a method of manufacturing the semiconductor device according to the second embodiment will be explained in an order of steps with reference to FIGS. 30 to 42. Each of FIGS. 30 to 42 illustrates a cross-sectional view of a principal part along a gate length direction, including the core nMIS (Nch Core), the core pMIS (Pch Core), the I/O nMIS (Nch I/O), the I/O pMIS (Pch I/O), the n-channel resistor element (Nch resistor element), and the p-channel resistor element (Pch resistor element) among circuit elements formed in the semiconductor device.

First, the element separation portion 2 is formed in the semiconductor substrate 1 by the similar manufacturing steps to those of the above-described first embodiment, and the active region is divided by this element separation portion 2 so as to form the core nMIS formation region, the core pMIS formation region, the I/O nMIS formation region, the I/O pMIS formation region, the n-channel resistor element formation region, and the p-channel resistor element formation region. Subsequently, an embedded n-well 25, a p-well 26, and an n-well 27 are formed therein. Further, the oxide film 5sc is formed in the core nMIS formation region, the core pMIS formation region, the n-channel resistor element formation region, and the p-channel resistor element formation region in the main surface of the semiconductor substrate 1, and the oxide film 5sio is formed in the I/O nMIS formation region and the I/O pMIS formation region in the main surface of the semiconductor substrate 1.

Figure 30:
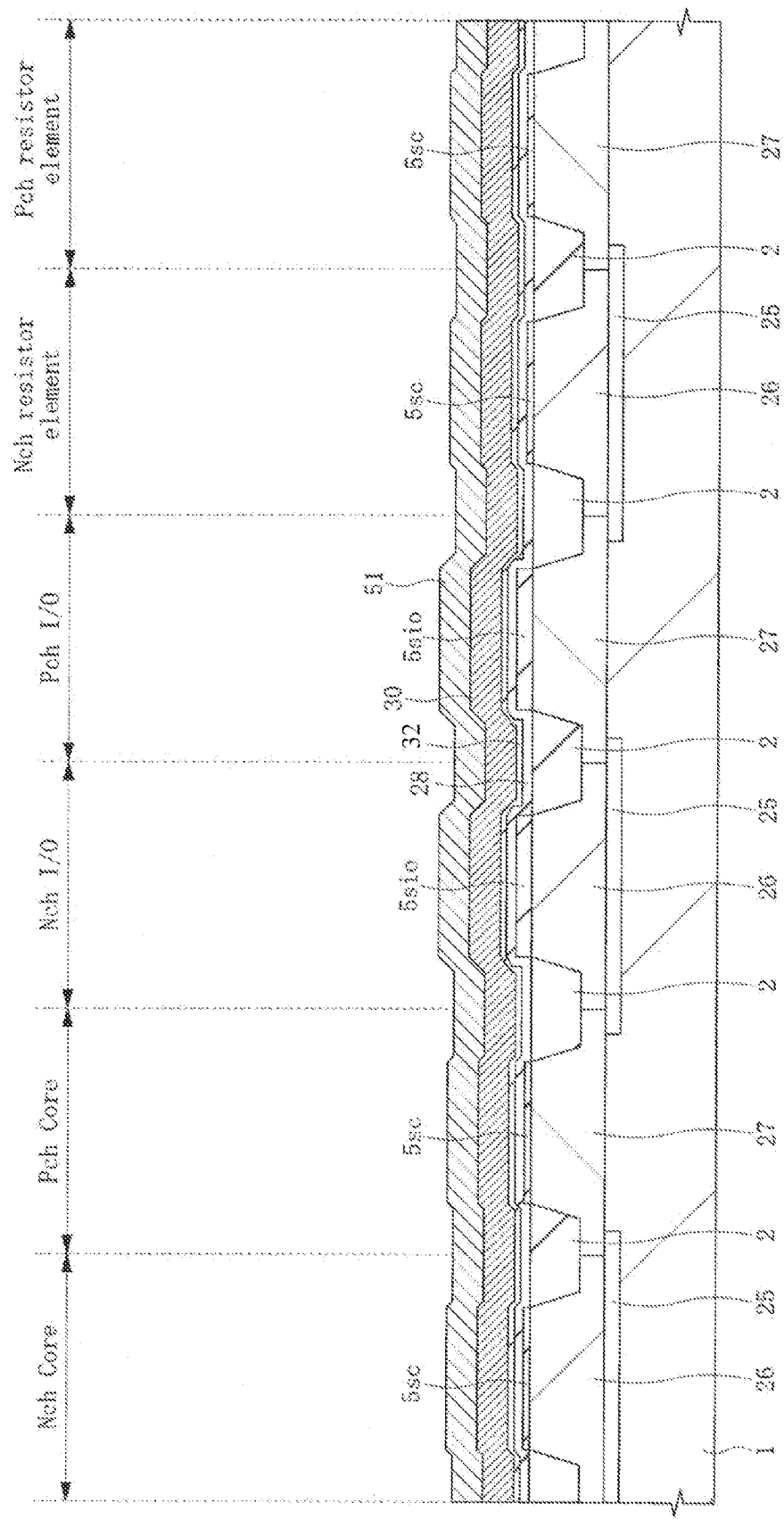
FIG. 30 is a cross-sectional view of a principal part illustrating a step of manufacturing a semiconductor device according to the second embodiment.

Next, as illustrated in FIG. 30, for example, a HfON film 28 is formed on the main surface of the semiconductor substrate 1. The HfON film 28 is formed by using, for example, a CVD method or an ALD method, and a thickness thereof is set to, for example, about 1 nm. Instead of the HfON film 28, for example, other hafnium-based insulating film such as a HfSiON film, a HfSiO film, or a $HfO_2$ film, can be also used.

Subsequently, it is subjected to a nitriding process, and then, for example, a LaO film 32 (cap film 6n) is deposited on the HfON film 28. The LaO film 32 is formed by using, for example, the sputtering method, and a thickness thereof is set to, for example, about 0.1 to 1.5 nm. Subsequently, for example, the TiN film 30 is deposited on the LaO film 32. The TiN film 30 is formed by using, for example, the sputtering method, and a thickness thereof is set to, for example, about 5 to 15 nm. Subsequently, for example, a first polycrystalline Si film 51 is deposited on the TiN film 30.

Figure 31:
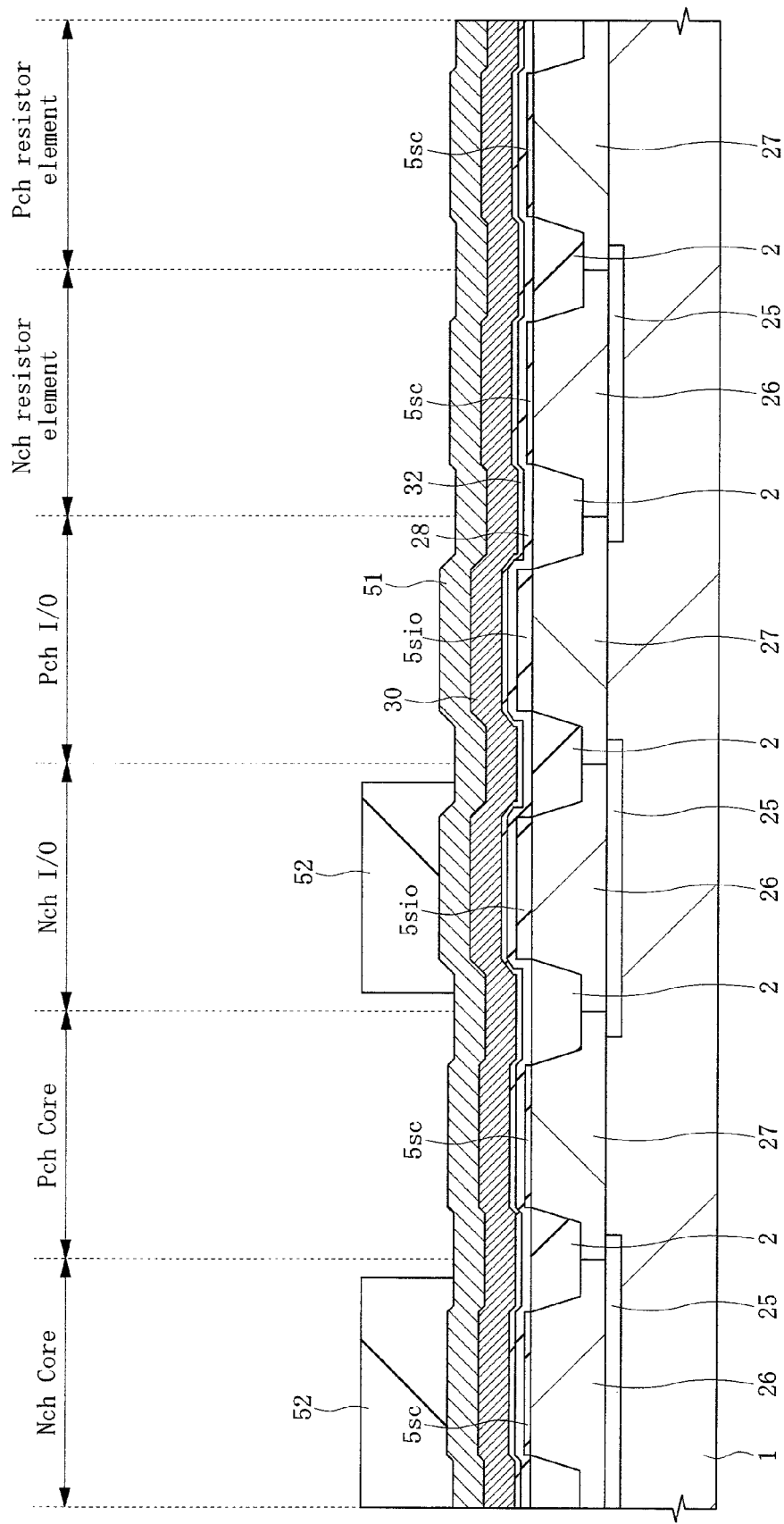
FIG. 31 is a cross-sectional view of the same principal part as that of FIG. 30 in the step of manufacturing the semiconductor device, which is continued from FIG. 30.

Next, as illustrated in FIG. 31, by using the photolithography method, a resist pattern 52 for covering the core nMIS formation region and the I/O nMIS formation region is formed.

Figure 32:
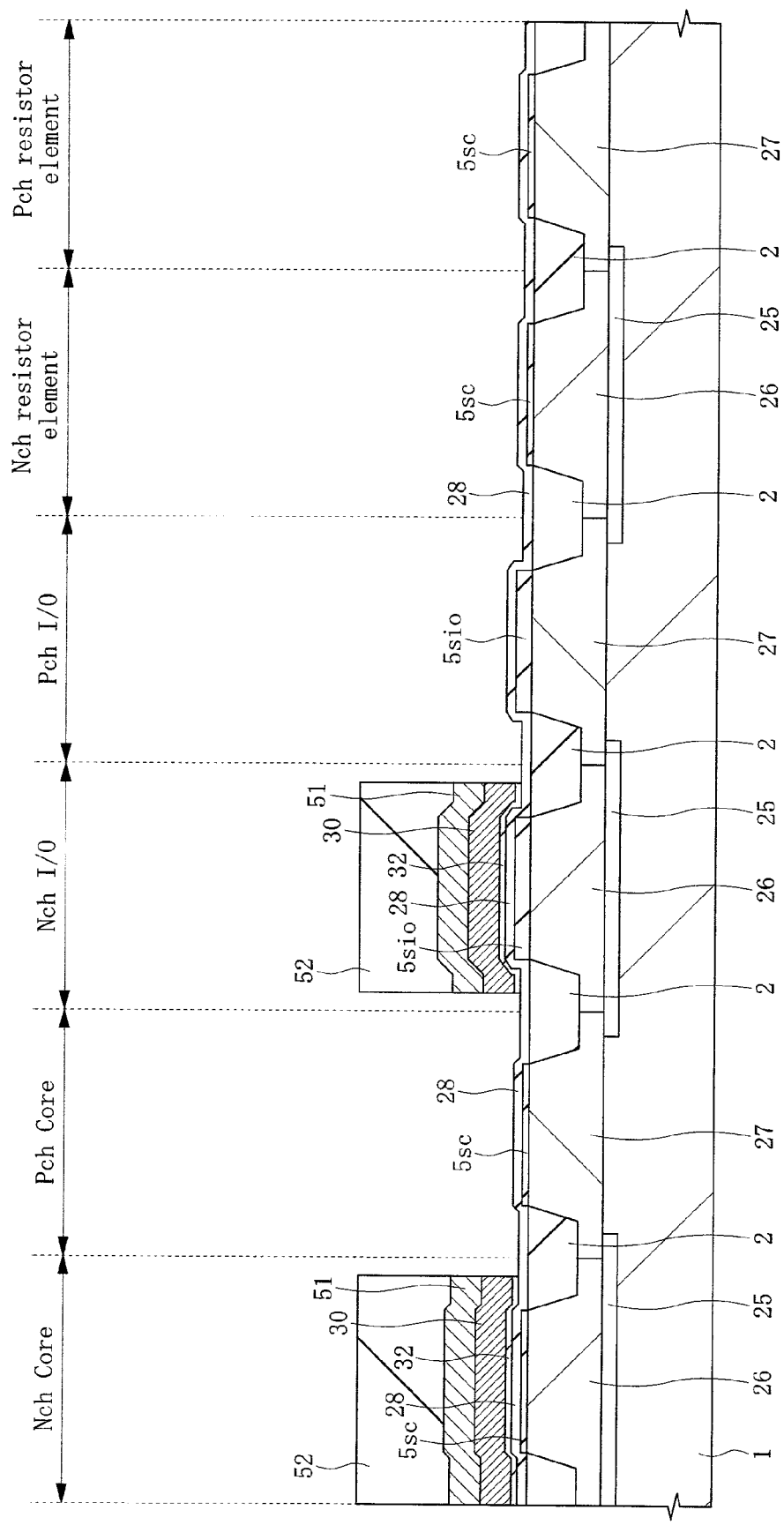
FIG. 32 is a cross-sectional view of the same principal part as that of FIG. 30 in the step of manufacturing the semiconductor device, which is continued from FIG. 31.

Next, as illustrated in FIG. 32, the first polycrystalline Si film 51, the TiN film 30, and the LaO film 32 which expose from the resist pattern 52 are removed with using the resist pattern 52 as a mask, and then, the resist pattern 52 is removed.

Figure 33:
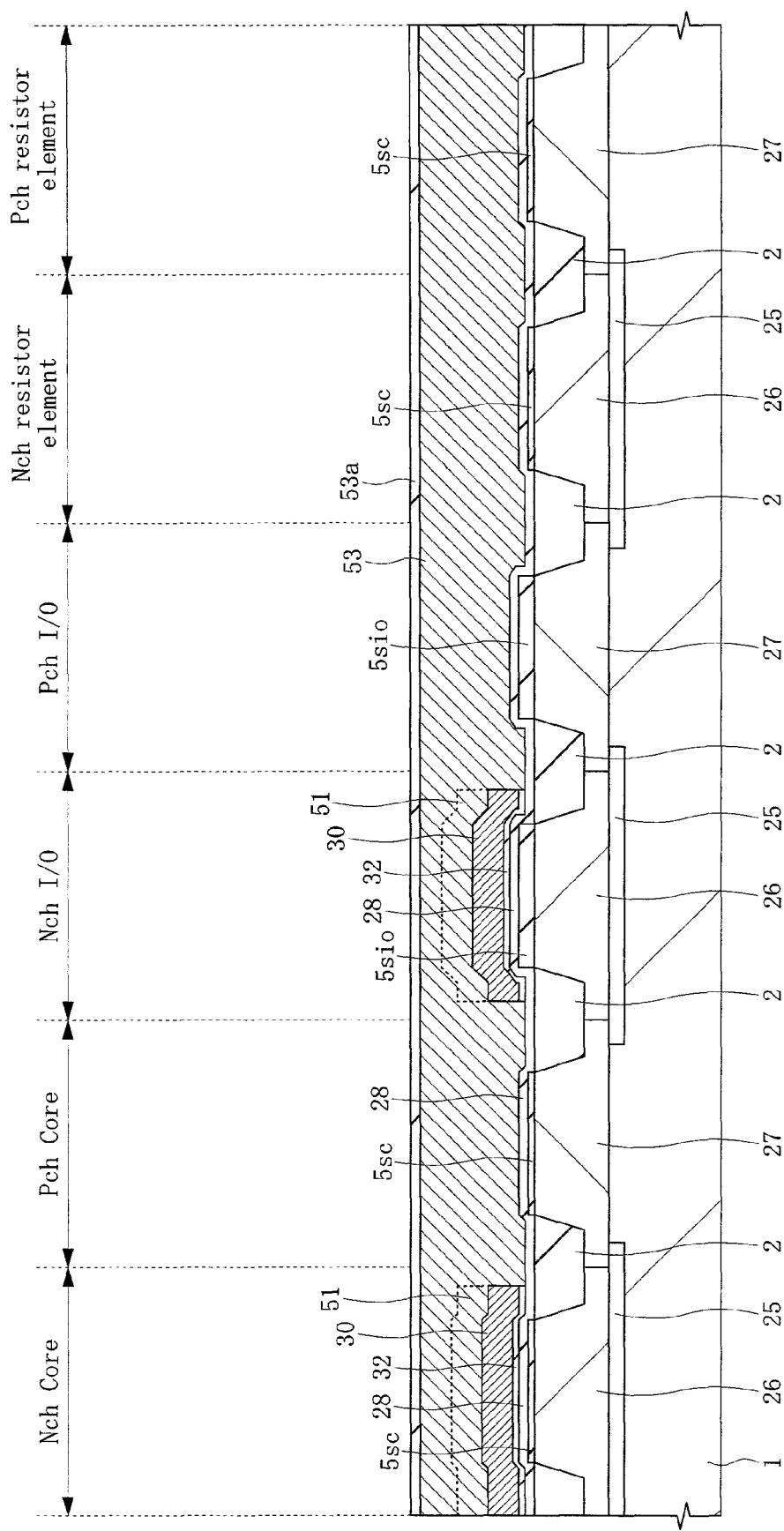
FIG. 33 is a cross-sectional view of the same principal part as that of FIG. 30 in the step of manufacturing the semiconductor device, which is continued from FIG. 32.

Next, as illustrated in FIG. 33, for example, a second polycrystalline Si film 53 is deposited on the main surface of the semiconductor substrate 1. The second polycrystalline Si film 53 is formed thicker than the first polycrystalline Si film 51. Subsequently, a surface of the second polycrystalline Si film 53 is polished and flattened by using, for example, the CMP method, and then, a dummy insulating film 53a made of, for example, $Si_3N_4$, $SiO_2$, or SiOC is formed on the second polycrystalline Si film 53.

Figure 34:
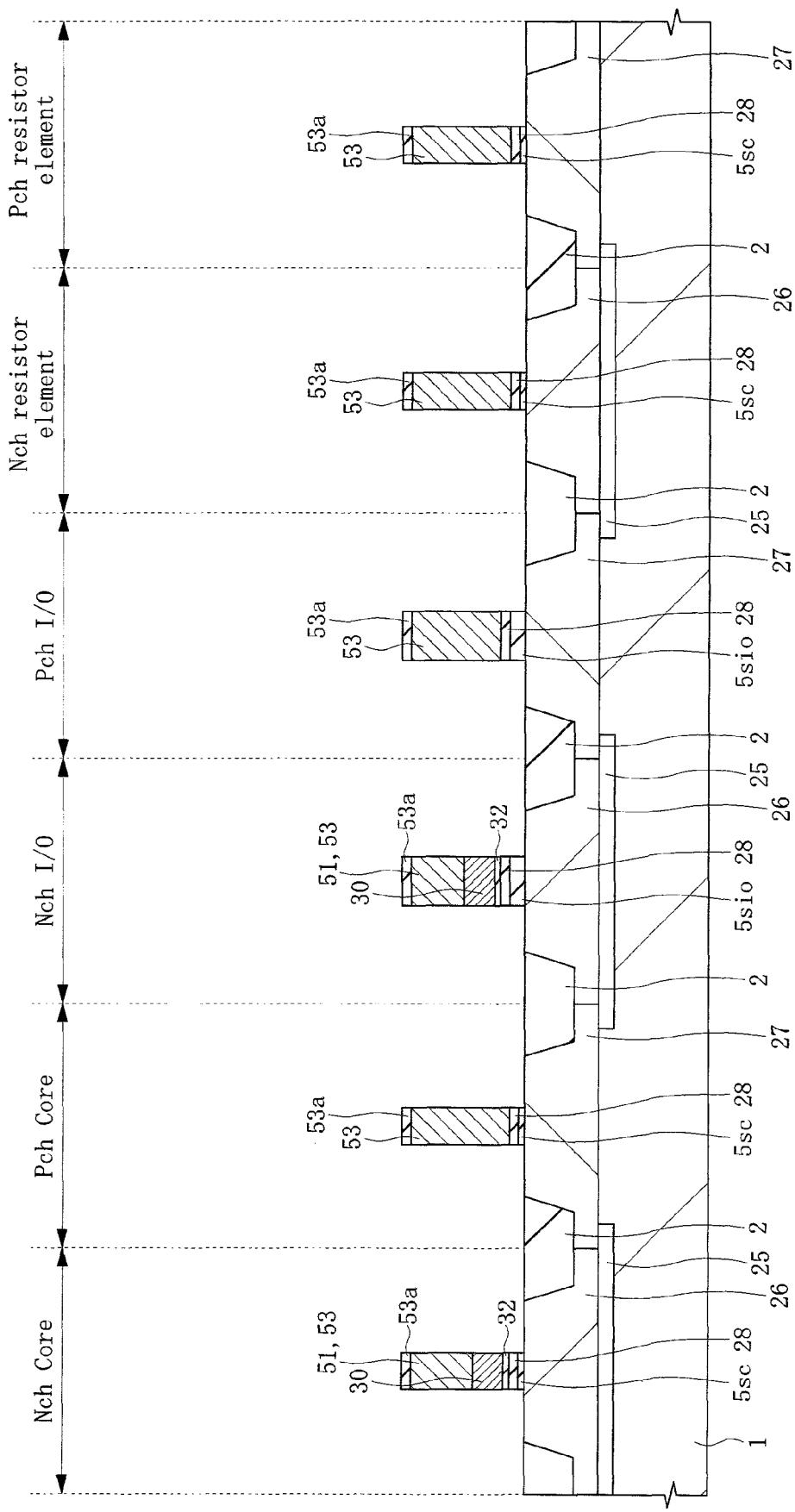
FIG. 34 is a cross-sectional view of the same principal part as that of FIG. 30 in the step of manufacturing the semiconductor device, which is continued from FIG. 33.

Next, as illustrated in FIG. 34, by using the photolithography method and the dry etching method, the dummy insulating film 53a, the second polycrystalline Si film 53, the first polycrystalline Si film 51, the TiN film 30, the LaO film 32, the HfON film 28, the oxide film 5sio, and the oxide film 5sc, are processed.

In this manner, a dummy gate is formed in the core nMIS formation region, the dummy gate including: a gate insulating film formed of a stacked film of the oxide film 5sc and the HfON film 28; the LaO film 32; a dummy gate electrode formed of a stacked film of the TiN film 30, the first polycrystalline Si film 51, and the second polycrystalline Si film 53;

and the dummy insulating film 53a. Moreover, a dummy gate is formed in the core pMIS formation region, the dummy gate including: a gate insulating film formed of a stacked film of the oxide film 5sc and the HfON film 28; a dummy gate electrode formed of the second polycrystalline Si film 53; and the dummy insulating film 53a.

Also, a dummy gate is formed in the I/O nMIS formation region, the dummy gate including: a gate insulating film formed of a stacked film of the oxide film 5sio and the HfON film 28; the LaO film 32; a dummy gate electrode formed of a stacked film of the TiN film 30, the first polycrystalline Si film 51, and the second polycrystalline Si film 53; and the dummy insulating film 53a. Moreover, a dummy gate is formed in the I/O pMIS formation region, the dummy gate including: the gate insulating film formed of the stacked film of the oxide film 5sio and the HfON film 28; and the dummy gate electrode formed of the second polycrystalline Si film 53; and the dummy insulating film 53a.

Further, the gates of the Nch gate structure and the Pch gate structure are formed in the n-channel resistor element formation region and the p-channel resistor element formation region, respectively, each of the structures including: the gate insulating film formed of the stacked film of the oxide film 5sc and the HfON film 28; the gate electrode formed of the second polycrystalline Si film 53; and the dummy insulating film 53a.

Figure 35:
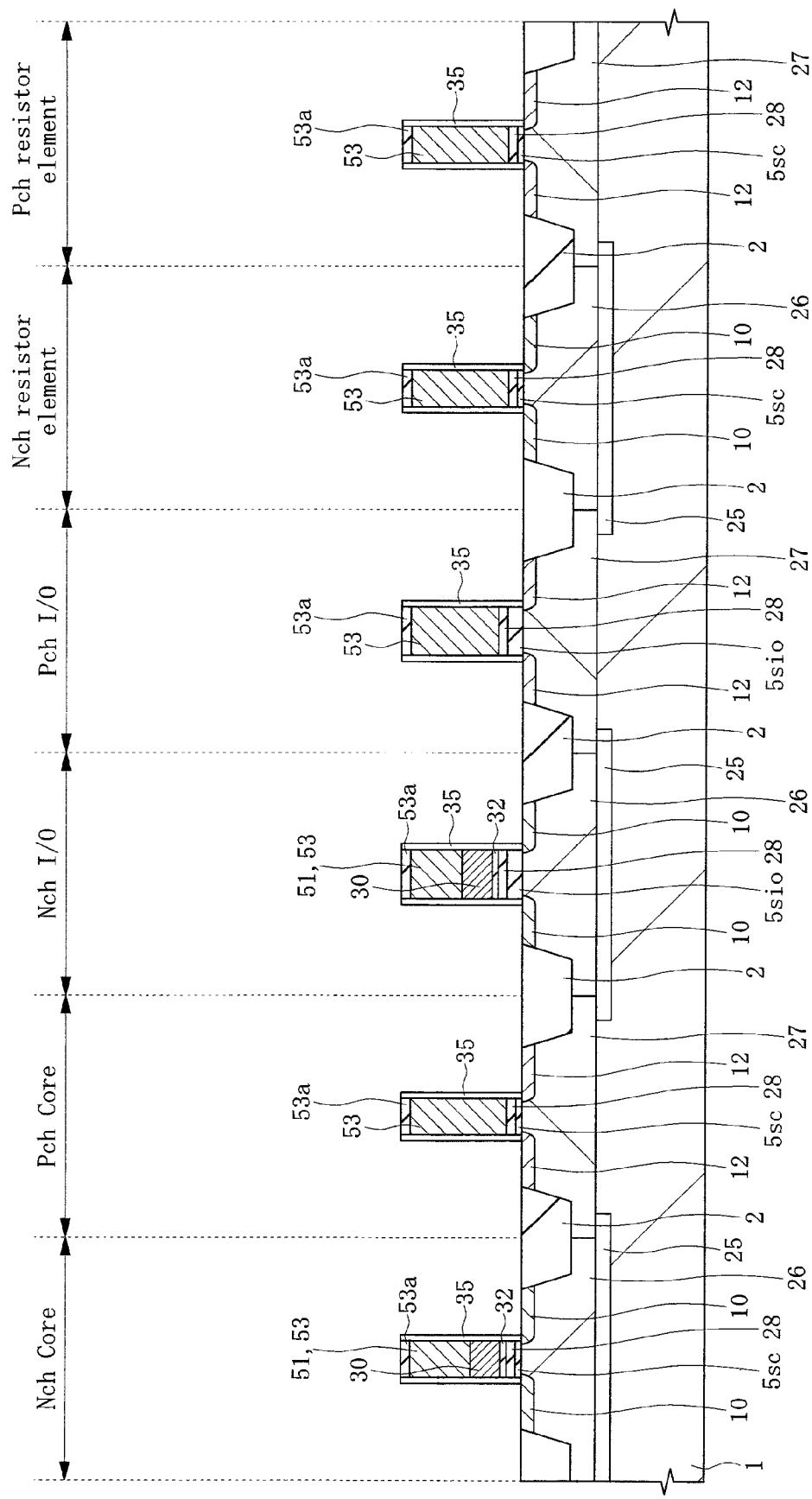
FIG. 35 is a cross-sectional view of the same principal part as that of FIG. 30 in the step of manufacturing the semiconductor device, which is continued from FIG. 34.

Next, as illustrated in FIG. 35, on the main surface of the semiconductor substrate 1, an offset side wall 35 formed of, for example, a $Si_3N_4$ or $SiO_2$ film is formed on a side wall of the dummy gate of each of the core nMIS, the core pMIS, the I/O nMIS, and the I/O pMIS, and the gate of each of the n-channel resistor element and the p-channel resistor element. The offset side wall 35 is formed by using, for example, the CVD method, and a thickness thereof is set to, for example, about 5 nm. Subsequently, by using the ion injection method, the n-type diffusion region 10 is formed in a self-alignment process to the dummy gate or the gate of each of the core nMIS formation region, the I/O nMIS formation region, and the n-channel resistor element formation region. The n-type diffusion region 10 is a semiconductor region, and is formed by introducing an n-type impurity such as P or As into the semiconductor substrate 1. Similarly, the p-type diffusion region 12 is formed in the self-alignment process to the dummy gate or the gate of each of the core pMIS formation region, the I/O pMIS formation region, and the p-channel resistor element formation region. The p-type diffusion region 12 is a semiconductor region, and is formed by introducing a p-type impurity such as B into the semiconductor substrate 1.

Figure 36:
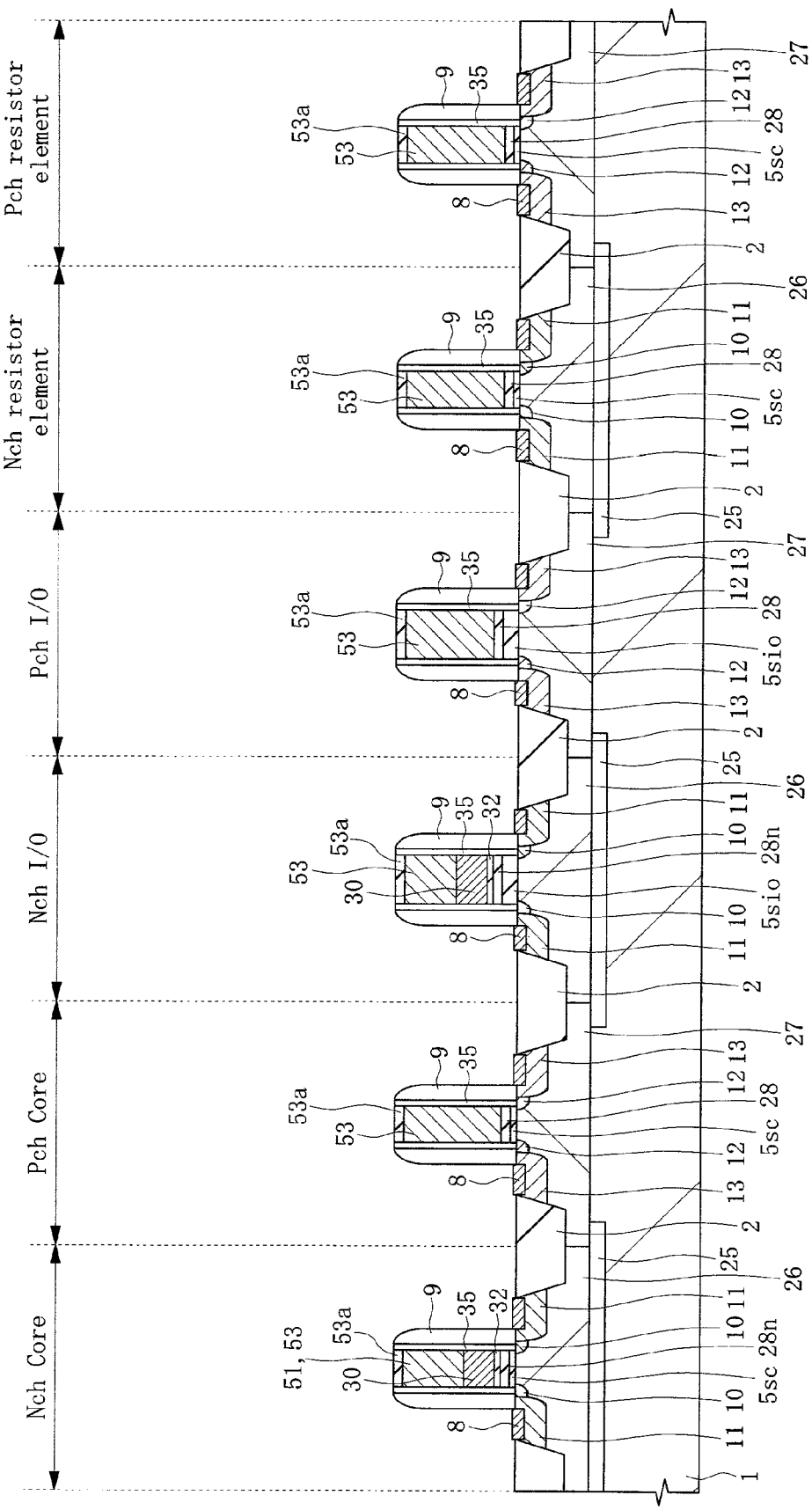
FIG. 36 is a cross-sectional view of the same principal part as that of FIG. 30 in the step of manufacturing the semiconductor device, which is continued from FIG. 35.

Next, as illustrated in FIG. 36, the $SiO_2$ film and the $Si_3N_4$ film are sequentially deposited on the main surface of the semiconductor substrate 1, and then, these $SiO_2$ film and $Si_3N_4$ film are anisotropically etched by using the dry etching method. In this manner, a sidewall 9 is formed on the side wall of the dummy gate of each of the core nMIS, the core pMIS, the I/O nMIS, and the I/O pMIS, and the gate of each of the n-channel resistor element and the p-channel resistor element.

Subsequently, by using the ion injection method, the n-type diffusion region 11 is formed in the self-alignment process to the dummy gate or the gate and the sidewall 9 of each of the core nMIS formation region, the I/O nMIS formation region, and the n-channel resistor element formation region. The n-type diffusion region 11 is a semiconductor region, and is formed by introducing an n-type impurity such as P or As into the semiconductor substrate 1. Similarly, the p-type diffusion region 13 is formed in the self-alignment process to the dummy gate or the gate and the side wall 9 of each of the core pMIS formation region, the I/O pMIS formation region, and the p-channel resistor element formation region. The p-type diffusion region 13 is a semiconductor region, and is formed by introducing a p-type impurity such as B into the semiconductor substrate 1.

Subsequently, a thermal treatment is performed. This thermal treatment is performed, for example, at 1000° C. for 10 seconds and at 1230° C. for several milliseconds. By this thermal treatment, the n-type impurity introduced into the n-type diffusion region 10 and the n-type diffusion region 11 in each of the core nMIS formation region, the I/O nMIS formation region, and the n-channel resistor element formation region is activated, and the p-type impurity introduced into the p-type diffusion region 12 and the p-type diffusion region 13 in each of the core pMIS formation region, the I/O pMIS formation region, and the p-channel resistor element formation region is activated, so that the source and drain regions are formed. Also, simultaneously, by this thermal treatment, the La is thermally diffused from the LaO film 32 to the HfON film 28, so that the HfON film 28 in each of the core nMIS formation region and the I/O nMIS formation region becomes the HfLaON film 28n (high dielectric film 5hn). At this time, while the thermal treatment may be performed so that the LaO films 32 remain, the thermal treatment may be performed so that all the LaO films 32 are reacted. The following drawings illustrate a case that apart of the LaO films 32 remains.

Figure 37:
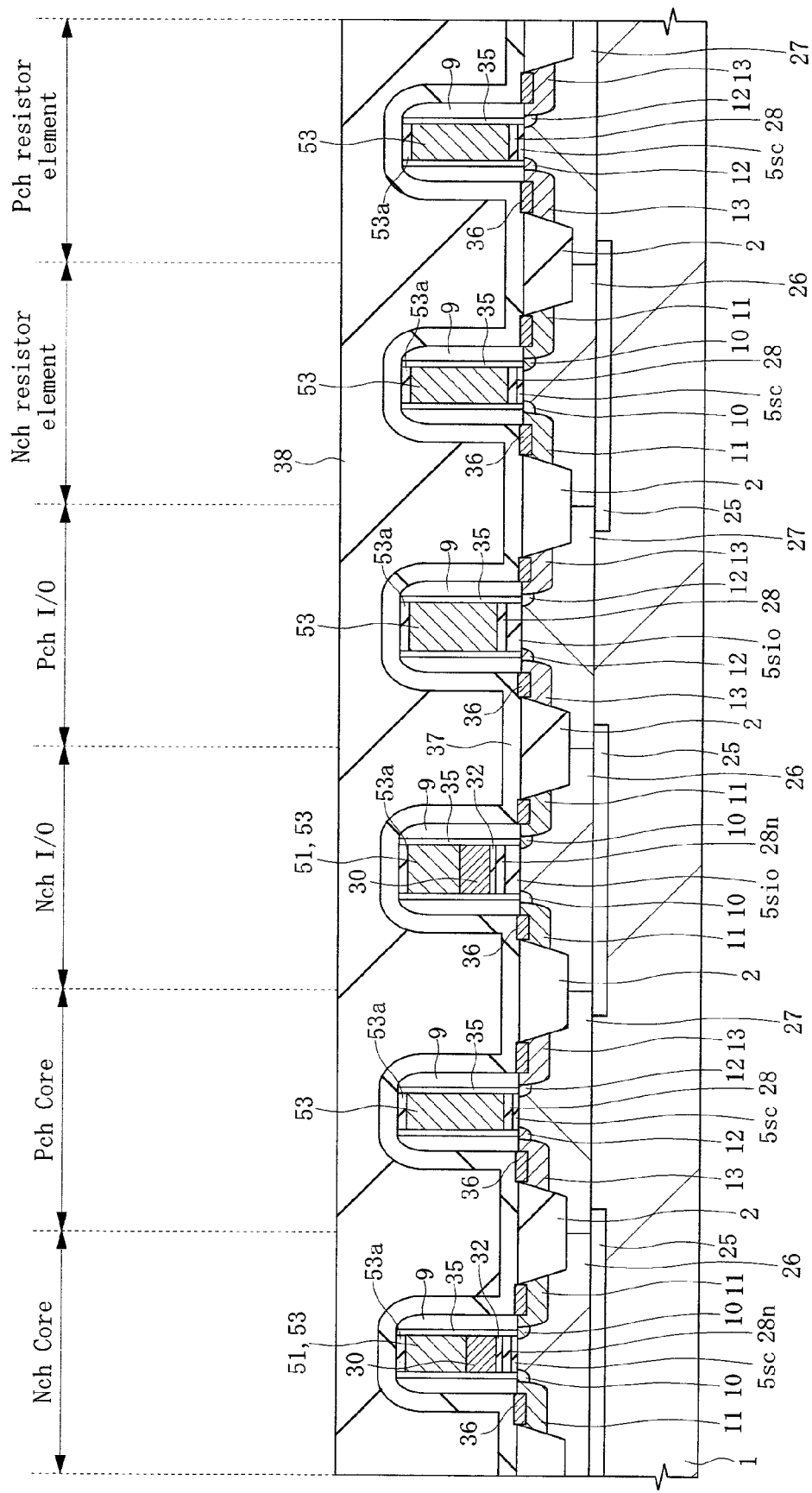
FIG. 37 is a cross-sectional view of the same principal part as that of FIG. 30 in the step of manufacturing the semiconductor device, which is continued from FIG. 36.

Next, as illustrated in FIG. 37, a NiSi film 36 is formed on surfaces of the source region and the drain region. Instead of the NiSi film 36, for example, a PtSi film or others can be also used. Subsequently, a $Si_3N_4$ film 37 is deposited on the main surface of the semiconductor substrate 1. The $Si_3N_4$ film 37 is formed by using, for example, the CVD method. Subsequently, an interlayer insulating film 38 is formed on the $Si_3N_4$ film 37, and a surface thereof is flattened by using, for example, the CMP method. The interlayer insulating film 38 is a TEOS film formed by using, for example, the plasma CVD method.

Figure 38:
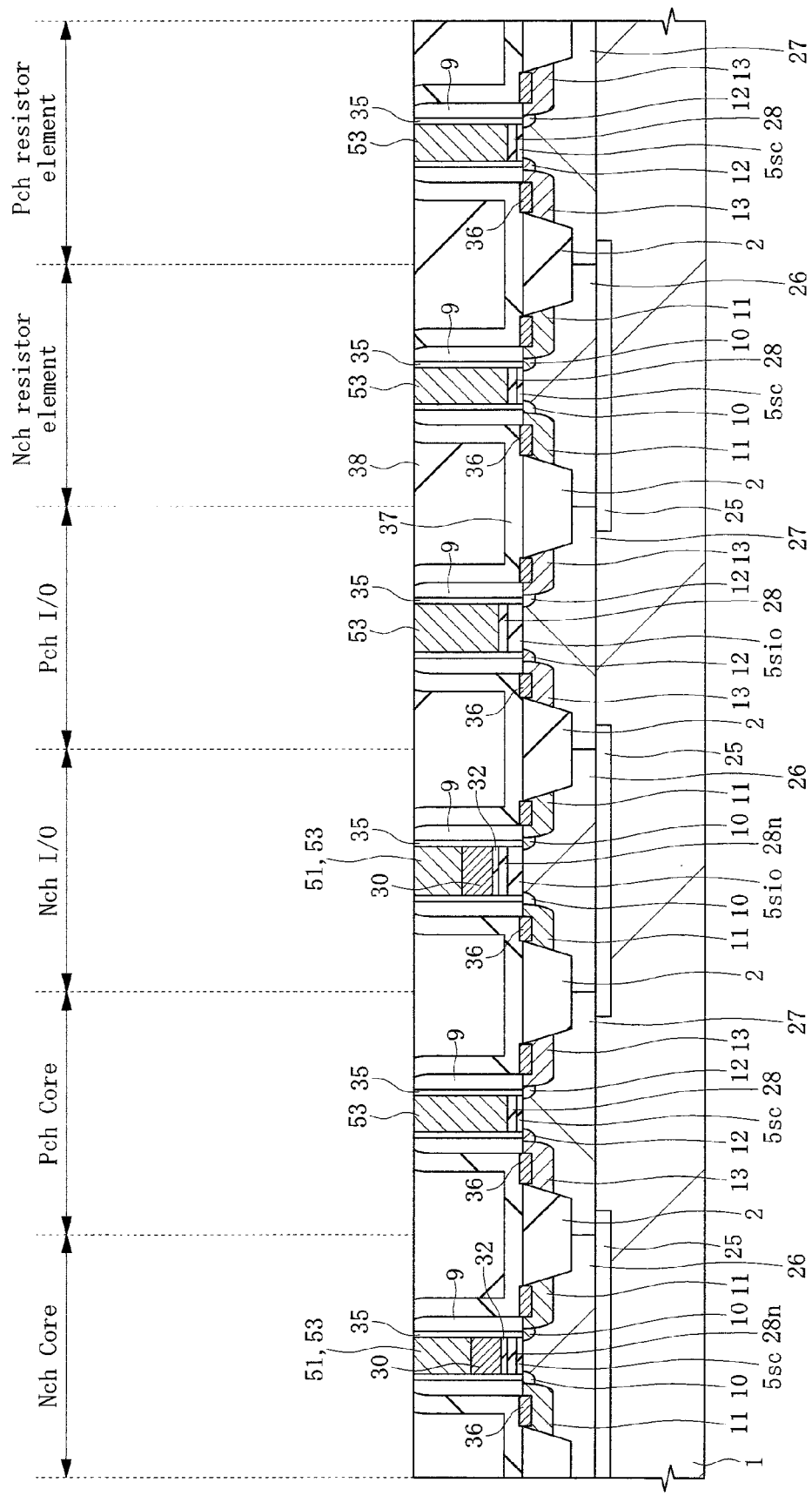
FIG. 38 is a cross-sectional view of the same principal part as that of FIG. 30 in the step of manufacturing the semiconductor device, which is continued from FIG. 37.

Next, as illustrated in FIG. 38, the interlayer insulating film 38, the $Si_3N_4$ film 37, and the dummy insulating film 53a are polished by using, for example, the CMP method until the second polycrystalline Si film 53 exposes.

Figure 39:
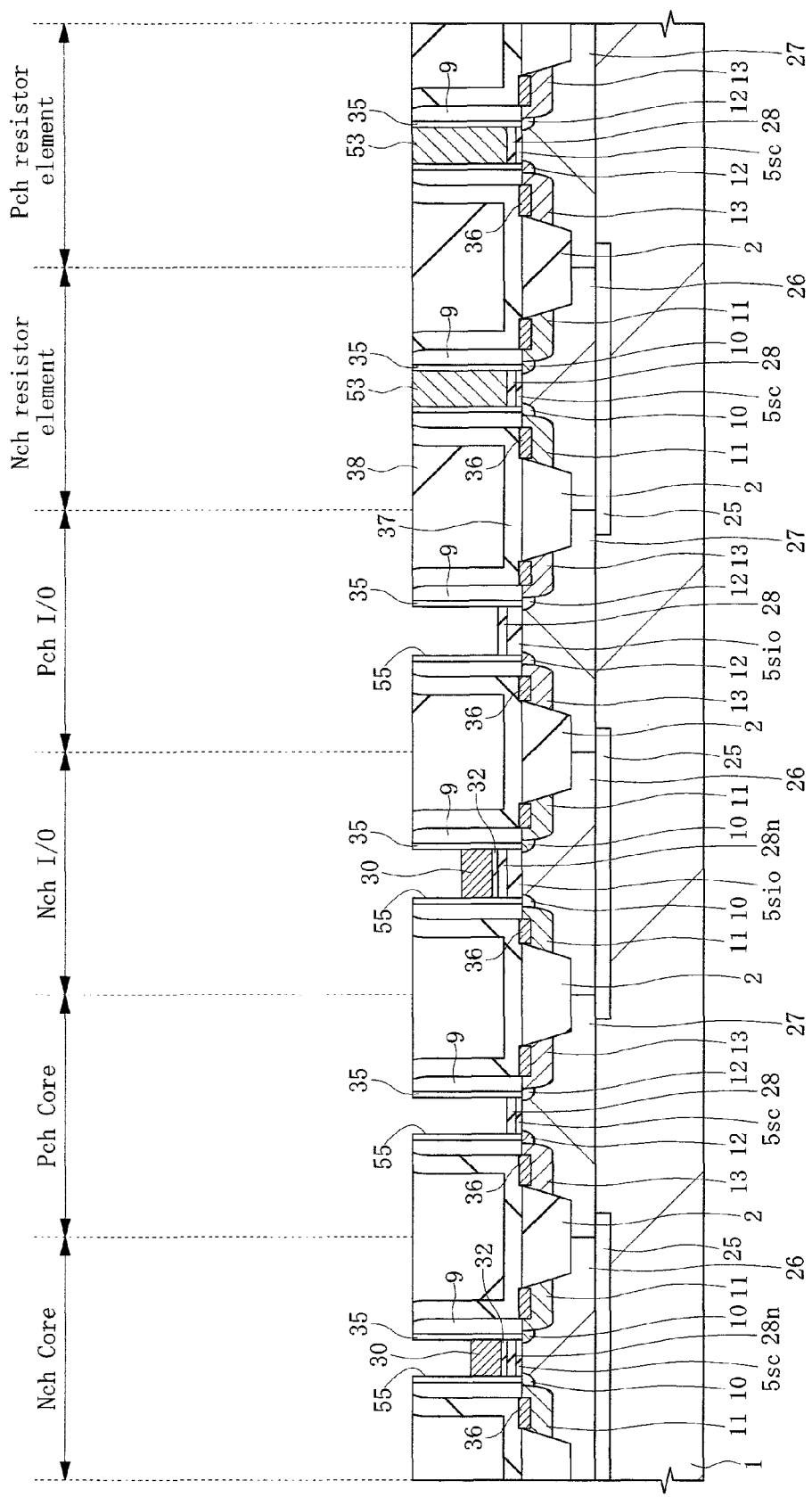
FIG. 39 is a cross-sectional view of the same principal part as that of FIG. 30 in the step of manufacturing the semiconductor device, which is continued from FIG. 38.

Next, as illustrated in FIG. 39, the first polycrystalline Si film 51 and the second polycrystalline Si film 53 are removed in the core nMIS formation region, the core pMIS formation region, the I/O nMIS formation region, and the I/O pMIS formation region. At this time, the Nch resistor element region and the Pch resistor element region are covered with a resist film or others. In this manner, a concave portion 55 is formed in each of portions where the dummy gates are formed in the respective core nMIS formation region, core pMIS formation region, I/O nMIS formation region, and I/O pMIS formation region, and the second polycrystalline Si films 53 in the Nch resistor element region and the Pch resistor element region remain. The TiN film 30 is exposed on bottom surfaces of the concave portions 55 in the core nMIS formation region and the I/O nMIS formation region, and the HfON film 28 is exposed on bottom surfaces of the concave portions 55 in the core pMIS formation region and the I/O pMIS formation region.

Figure 40:
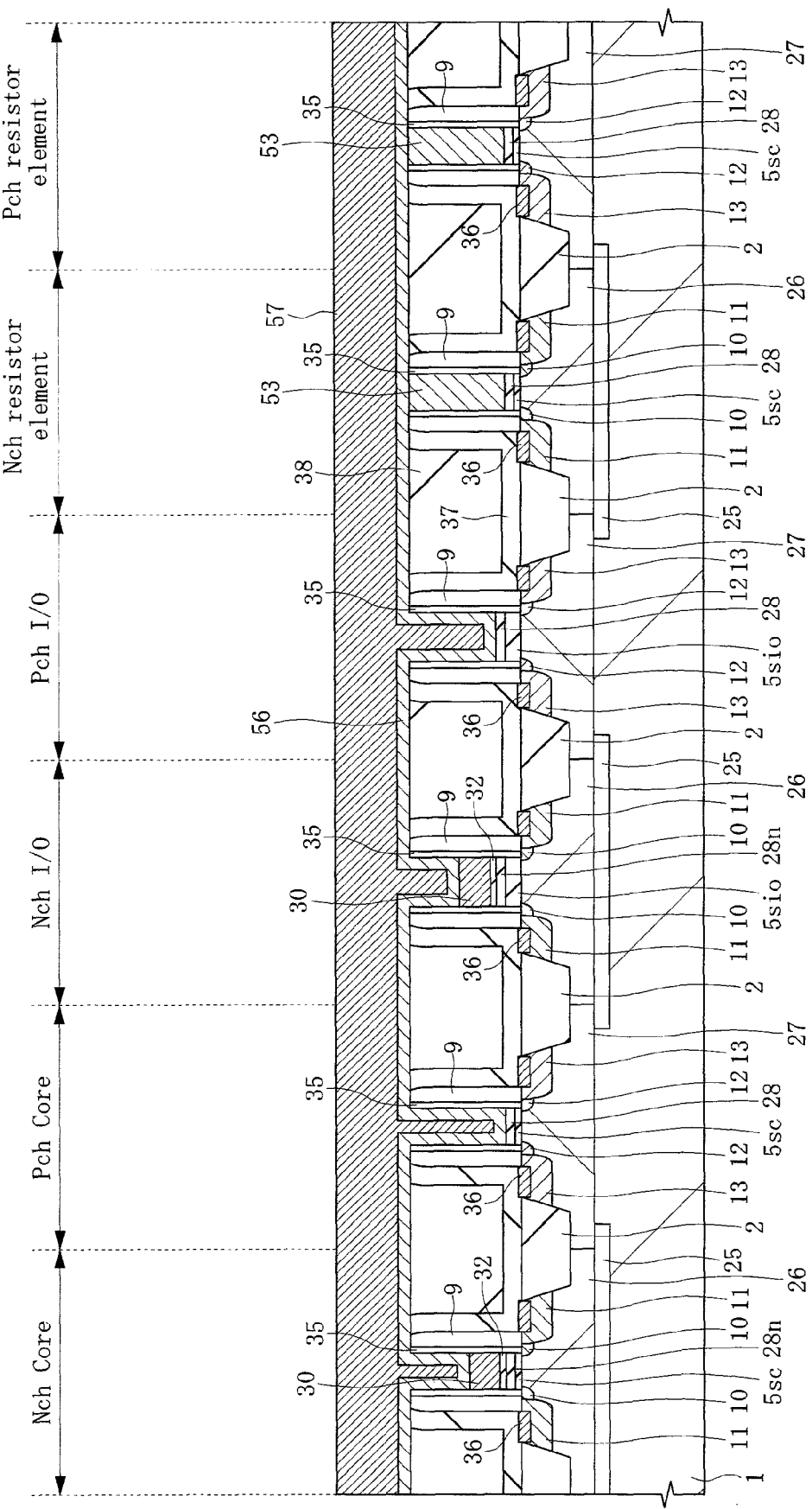
FIG. 40 is a cross-sectional view of the same principal part as that of FIG. 30 in the step of manufacturing the semiconductor device, which is continued from FIG. 39.

Next, as illustrated in FIG. 40, the first metal film 56 for adjusting the work functions of the core pMIS and the I/O pMIS is deposited on the main surface of the semiconductor substrate 1. The first metal film 56 is, for example, a TiN film. A thickness thereof is set to, for example, 15 nm, which does not completely embed an inside of the concave portion 55.

Subsequently, the second metal film 57 is formed on the first metal film 56 so as to embed the inside of the concave portion 55. The second metal film 57 is, for example, a metal film containing Al, and a thickness thereof is, for example, 100 nm.

Figure 41:
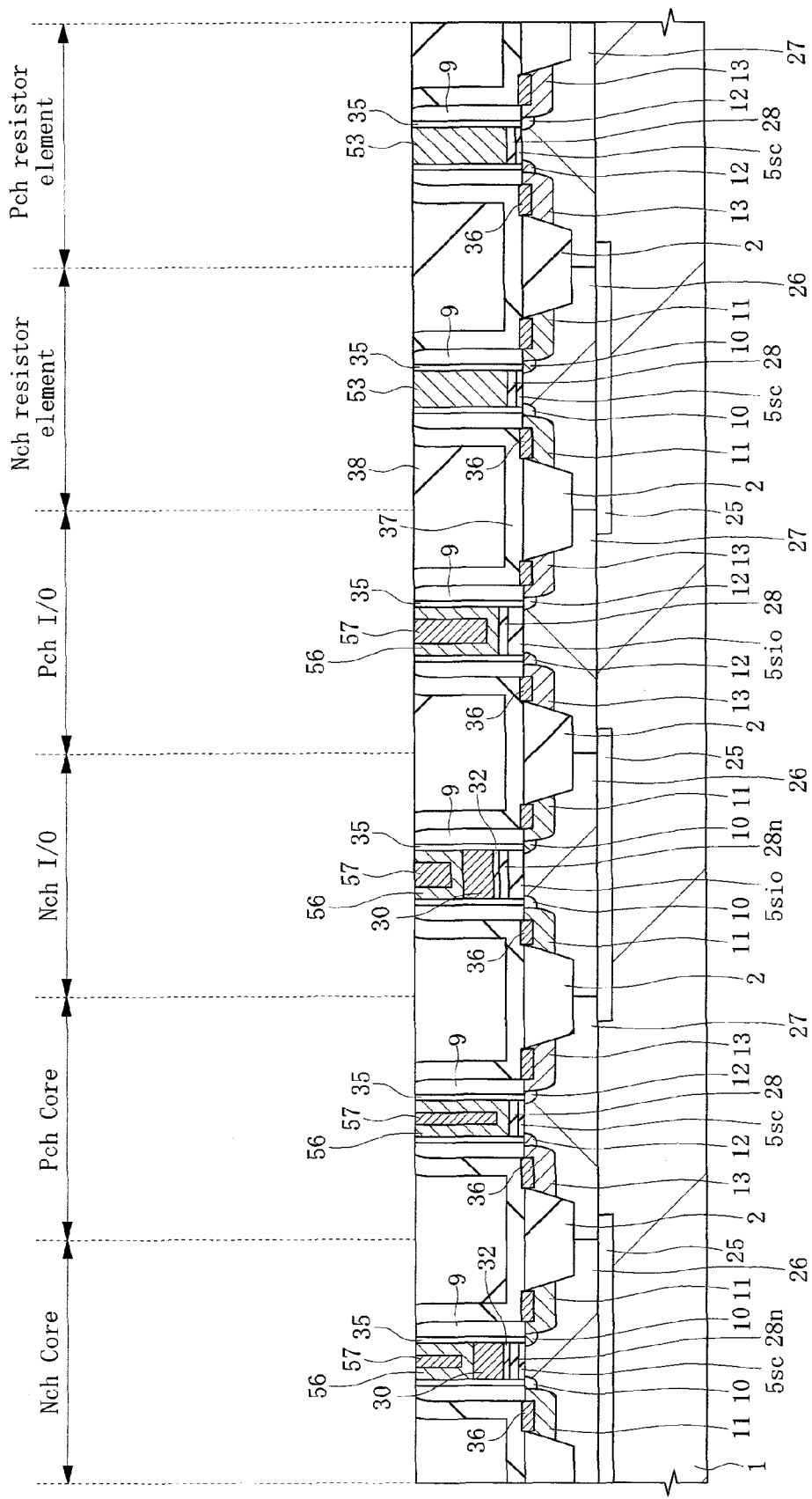
FIG. 41 is a cross-sectional view of the same principal part as that of FIG. 30 in the step of manufacturing the semiconductor device, which is continued from FIG. 40.

Next, as illustrated in FIG. 41, by polishing the first metal film 56 and the second metal film 57 with using, for example, the CMP method, the first metal film 56 and the second metal film 57 are embedded into the concave portion 55.

In this manner, the gate having the Nch stack gate structure is formed in the core nMIS formation region, the structure including: the gate insulating film (gate insulating film 5nc) formed of the stacked film of the oxide film 5sc and the HfLaON film 28n (high dielectric film 5hn); the LaO film 32 (cap film 6n); and a gate electrode (gate electrode 50n) formed of a stacked film of the TiN film 30 (lower-layer gate electrode 50D), the first metal film 56 (middle-layer gate electrode 50M), and the second metal film 57 (upper-layer gate electrode 50U). Moreover, the gate having the Pch stack gate structure is formed in the core pMIS formation region, the structure including: the gate insulating film (gate insulating film 5po) formed of the stacked film of the oxide film 5sc and the HfON film 28 (high dielectric film 5ho); and the gate electrode (gate electrode 50p) formed of the stacked film of the first metal film 56 (middle-layer gate electrode 50M) and the second metal film 57 (upper-layer gate electrode 50U).

Also, the gate having the Nch stack gate structure is formed in the I/O nMIS formation region, the structure including: the gate insulating film formed of the stacked film of the oxide film 5sio and the HfLaON film 28n; the LaO film 32; and the gate electrode formed of the stacked film of the TiN film 30, the first metal film 56, and the second metal film 57. Moreover, the gate having the Pch stack gate structure is formed in the I/O pMIS formation region, the structure including: the gate insulating film formed of the stacked film of the oxide film 5sio and the HfON film 28; and the gate electrode formed of the stacked film of the first metal film 56 and the second metal film 57.

Further, the gates having the Nch gate structure and the Pch gate structure are formed in the n-channel resistor element formation region and the p-channel resistor element formation region, respectively, each structure including: the gate insulating film formed of the stacked film of the oxide film 5sc and the HfON film 28; and the gate electrode formed of the second polycrystalline Si film 53.

Figure 42:
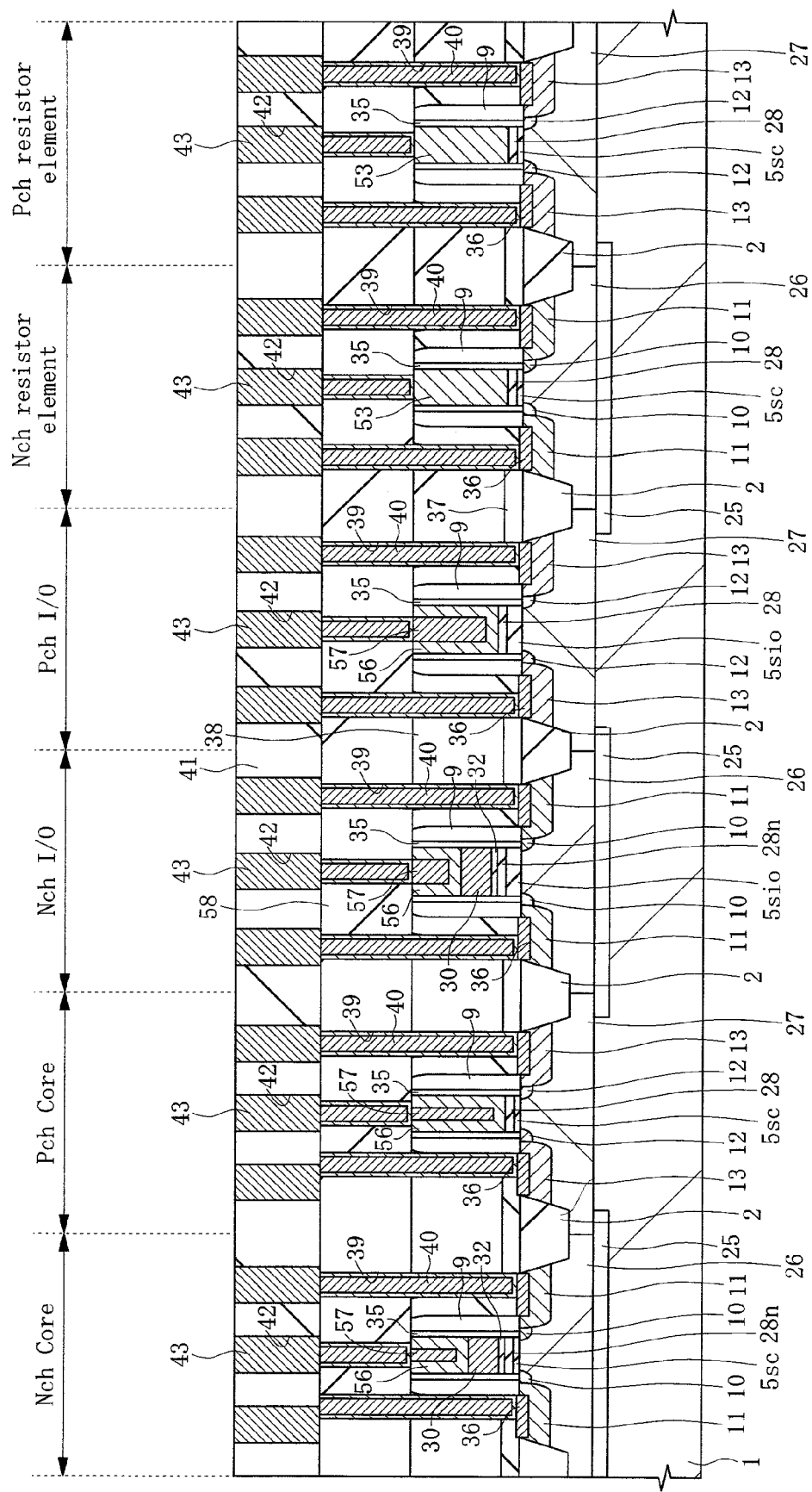
FIG. 42 is a cross-sectional view of the same principal part as that of FIG. 30 in the step of manufacturing the semiconductor device, which is continued from FIG. 41.

Next, as illustrated in FIG. 42, an interlayer insulating film 58 is formed on the main surface of the semiconductor substrate 1, and then, a contact hole 39 is formed in each of the interlayer insulating films 38 and 58 and the $Si_3N_4$ film 37 by using the photolithography method and the dry etching method. Subsequently, a plug 40 is formed inside the contact hole 39, and then, a wiring 43 is formed. Then, an upper-layer wiring is further formed. However, the explanation thereof is omitted here.

By the above-described manufacturing steps, the semiconductor device according to the second embodiment (including the core nMIS, the core pMIS, the I/O nMIS, the I/O pMIS, the n-channel resistor element, and the p-channel resistor element) is substantially completed.

In this manner, according to the second embodiment, also in the HK/MG transistor whose gate electrode is formed of only the metal film, the overlapped portion of the gate having the Nch gate stack structure with the element separation portion is reduced similarly to the above-described first embodiment, so that the quantity of the oxygen supplied from the element separation portion to the gate having the Nch gate stack structure is reduced, and therefore, the increase in the threshold voltage of the n-channel HK/MG transistor can be suppressed.

Third Embodiment

In a third embodiment, first to fourth examples each that the present invention is applied to an SRAM (Static Random Access Memory) will be explained. As the structure of the HK/MG transistor, the structures explained in the first or second embodiment can be used. A memory cell of the SRAM according to the third embodiment is configured by a flip-flop circuit for storing information for one bit therein and two information transferring MISes, and the above-described flip-flop circuit is configured by, for example, a pair of load MISes and a pair of driving MISes, and therefore, it is configured as a so-called complete CMOS (Complementary Metal Oxide Semiconductor) type with using six MISes.

Figure 43A:
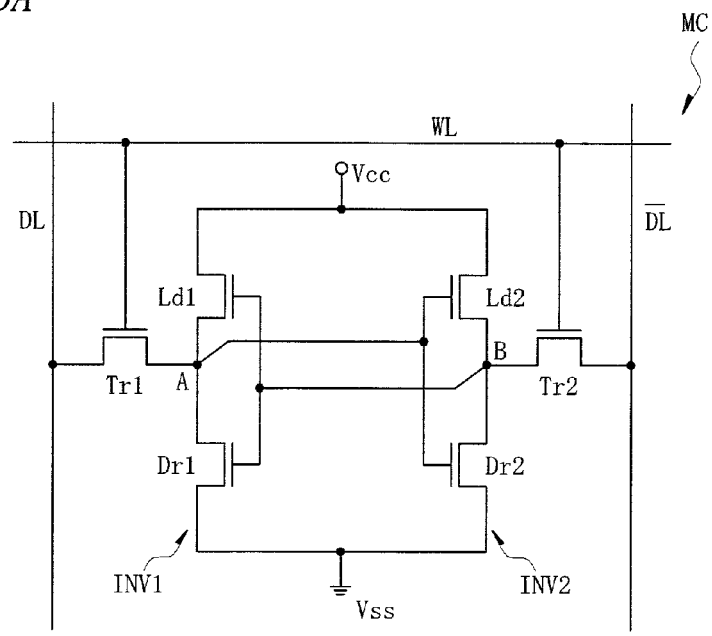
FIGS. 43A and 43B are an equivalent circuit diagram of a memory cell for 1 bit of an SRAM according to a third embodiment and a plan view of a principal part of an SRAM memory cell for 1 bit according to a first example of the third embodiment, respectively.
Figure 43B:
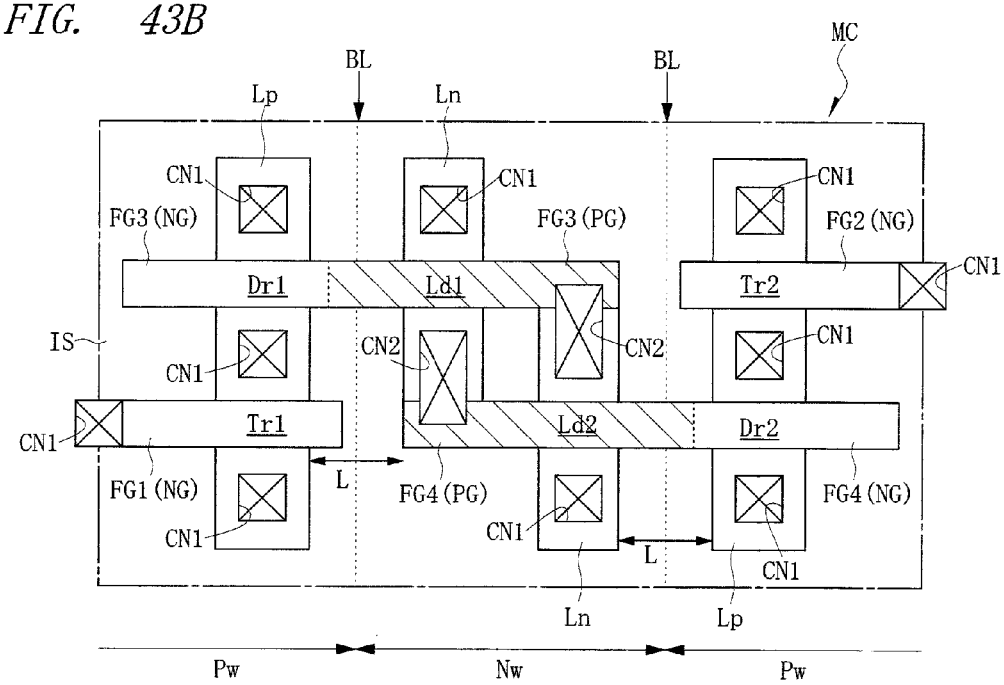
Figure 44:
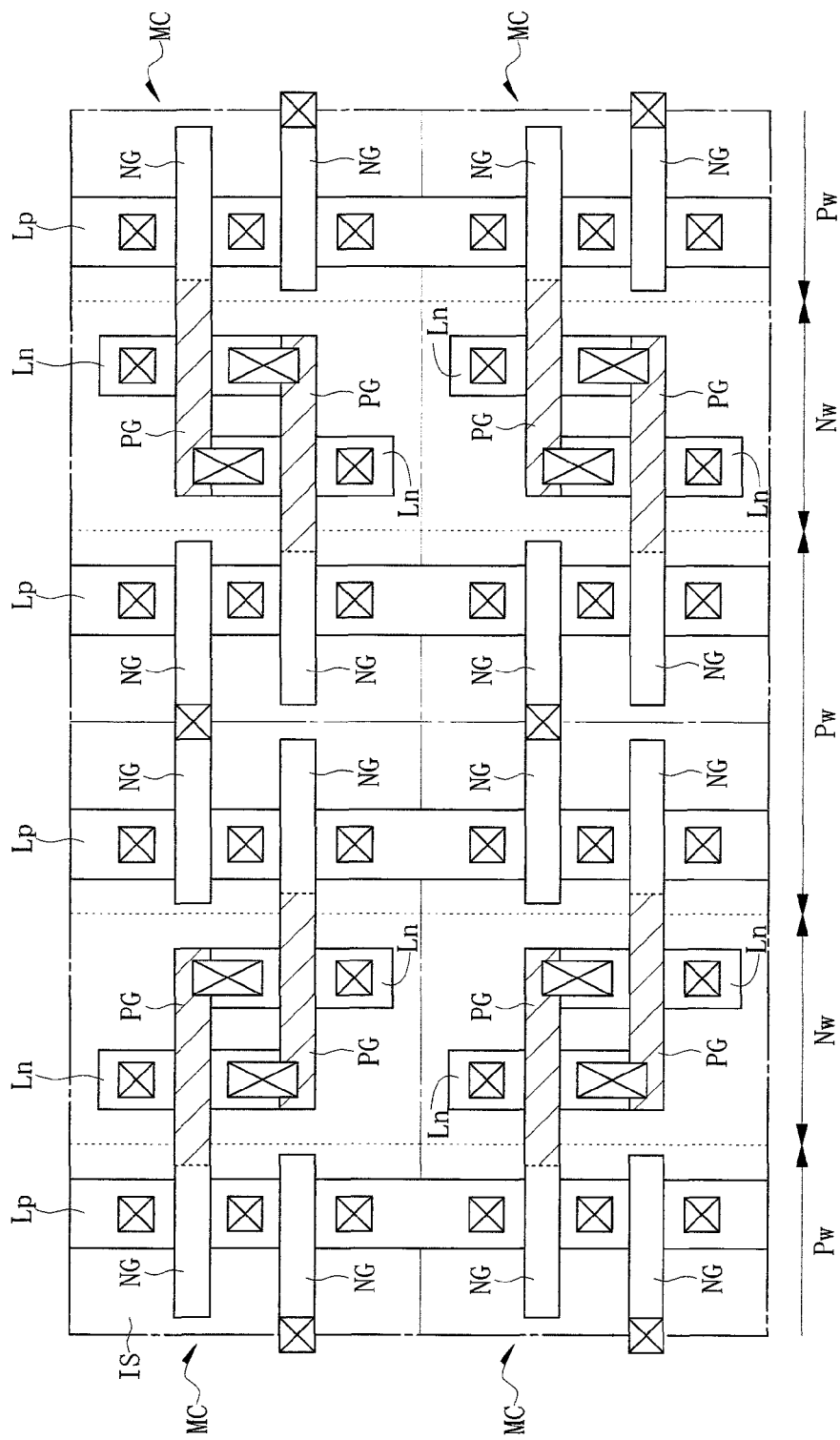
FIG. 44 is a plan view of a principal part of an SRAM memory cell for 4 bits according to the first example of the third embodiment.

With reference to FIGS. 43A to 44, the first example that the present invention is applied to the SRAM will be explained. FIGS. 43A and 43B are an equivalent circuit diagram and a plan view of a principal part of a memory cell for one bit (1-bit cell) of the SRAM, respectively, and FIG. 44 is a plan view of a principal part of a memory cell for four bits (4-bit cell) of the SRAM.

As illustrated in FIG. 43A, a memory cell MC is arranged at an intersection between a pair of complementary data lines (a data line DL and a data line DL) and a word line WL, and is configured by: a pair of driving MISes (Dr1 and Dr2); a pair of load MISes (Ld1 and Ld2); and a pair of transferring MISes (Tr1 and Tr2). Each of the driving MISes (Dr1 and Dr2) and the transferring MISes (Tr1 and Tr2) is formed as an nMIS, and each of the load MISes (Ld1 and Ld2) is formed as a pMIS.

Among the above-described six MISes configuring the memory cell MC, the driving MIS (Dr1) and the load MIS (Ld1) configure a CMOS inverter INV1, and the driving MIS (Dr2) and the load MIS (Ld2) configure a CMOS inverter INV2. The mutual input/output terminals (storage nodes A and B) of the pair of CMOS inverters INV1 and INV2 are intersected and connected with each other to configure the flip-flop circuit serving as an information storage unit for storing the information for one bit. Moreover, one input/output terminal (storage node A) of this flip-flop circuit is connected to either one of source and drain of the transferring MIS (Tr1), and the other input/output terminal (storage node B) is connected to either one of the source and drain of the transferring MIS (Tr2).

Further, the other of the source and drain of the transferring MIS (Tr1) is connected to the data line DL, and the other of the source and drain of the transferring MIS (Tr2) is connected to the data line DL. Moreover, one end of the flip-flop circuit (each source of the load MISes (Ld1 and Ld2)) is connected to a power supply voltage (Vcc), and the other end (each source of driving MISes (Dr1 and Dr2)) is connected to a reference voltage (Vss).

As illustrated in FIGS. 43B and 44, six MISes configuring the memory cell MC of the first example are formed in active regions Ln and Lp provided on the main surface of the semiconductor substrate, and each of the active regions Ln and Lp is surrounded in a periphery thereof by an element separation portion IS formed of an insulating film. The n-channel type driving MISes (Dr1 and Dr2) and transferring MISes (Tr1 and Tr2) are formed in the active region Lp of the p-well Pw, and the p-channel type load MISes (Ld1 and Ld2) are formed in the active region Ln of the n-well Nw. A distance "L" between the active region Lp of the p-well Pw and the active region Ln of the n-well Nw (which is a width of the element separation portion IS) adjacent to each other is set to, for example, about 80 nm.

Each of gate electrodes FG1 and FG2 of the transferring MISes (Tr1 and Tr2) has the same structure as that of the gate electrode explained in the above-described first or second embodiment, and each of the source and drain of each of the transferring MISes (Tr1 and Tr2) is configured by an n-type semiconductor region formed in the active region Lp of the p-well Pw.

The driving MIS (Dr1) and the load MIS (Ld1) configuring the CMOS inverter INV1 have a shared gate electrode FG3, the driving MIS (Dr2) and the load MIS (Ld2) configuring the CMOS inverter INV2 have a shared gate electrode FG4, and each of these gate electrodes FG3 and FG4 has the same structure as that of the gate electrode explained in the above-described first or second embodiment. Each of the source and drain of each of the driving MISes (Dr1 and Dr2) is configuring by an n-type semiconductor region formed in the active region Lp of the p-well Pw, and each of the source and drain of each of the load MISes (Ld1 and Ld2) is configuring by a p-type semiconductor region formed in the active region Ln of the n-well Nw.

Further, the above-described gate electrode FG3 is electrically connected to input terminals of the CMOS inverter INV2 (the drain of the load MIS (Ld2), the drain of the driving MIS (Dr2), and the source of the transferring MIS (Tr2) via a conductive film embedded into a connection hole CN2 and a local wiring. Similarly, the above-described gate electrode FG4 is electrically connected to input terminals of the CMOS inverter INV1 (the drain of the load MIS (Ld1), the drain of the driving MIS (Dr1), and the source of the transferring MIS (Tr1)) via a conductive film embedded into the connection hole CN2 and a local wiring.

Moreover, the connection hole CN1 is formed in contact with the source of each of the load MISes (Ld1 and Ld2), the source of each of the driving MISes (Dr1 and Dr2), and the drain of each of the transferring MISes (Tr1 and Tr2), so that they are electrically connected to other portions via the conductive film embedded inside the connection hole CN1.

In the memory cell of the SRAM according to the first example of the third embodiment, the driving MIS (Dr1) and the load MIS (Ld1) configuring the CMOS inverter INV1 have the shared gate electrode FG3, and the gate structure of the driving MIS (Dr1) is set to be the same as the Nch stack gate structure NG of the n-channel HK/MG transistor (such as the core nMIS of the first or second embodiment), and the gate structure of the load MIS (Ld1) is set to be the same as the Pch stack gate structure PG of the p-channel HK/MG transistor (such as the core pMIS of the first or second embodiment). Further, a boundary between the gate of the driving MIS (Dr1) and the gate of the load MIS (Ld1) is shifted toward the p-well Pw side from a boundary between the p-well Pw where the driving MIS (Dr1) is formed and the n-well Nw where the load MIS (Ld1) is formed (which is a PN boundary intermediate line "BL" illustrated in the drawing), so that the gate of the driving MIS (Dr1) which rides on the element separation portion IS is made shorter than the gate of the load MIS (Ld1) which rides on the element separation portion IS.

Similarly, the driving MIS (Dr2) and the load MIS (Ld2) configuring the CMOS inverter INV2 have the shared gate electrode FG4, and the gate structure of the driving MIS (Dr2) is set to be the same as the Nch stack gate structure NG of the n-channel HK/MG transistor (such as the core nMIS of the first or second embodiment), and the gate structure of the load MIS (Ld2) is set to be the same as the Pch stack gate structure PG of the p-channel HK/MG transistor (such as the core pMIS of the first or second embodiment). Further, a boundary between the gate of the driving MIS (Dr2) and the gate of the load MIS (Ld2) is shifted toward the p-well Pw side from a boundary between the p-well Pw where the driving MIS (Dr2) is formed and the n-well Nw where the load MIS (Ld2) is formed (which is a PN boundary intermediate line "BL" illustrated in the drawing), so that the gate of the driving MIS (Dr2) which rides on the element separation portion IS is made shorter than the gate of the load MIS (Ld2) which rides on the element separation portion IS.

Figure 45:
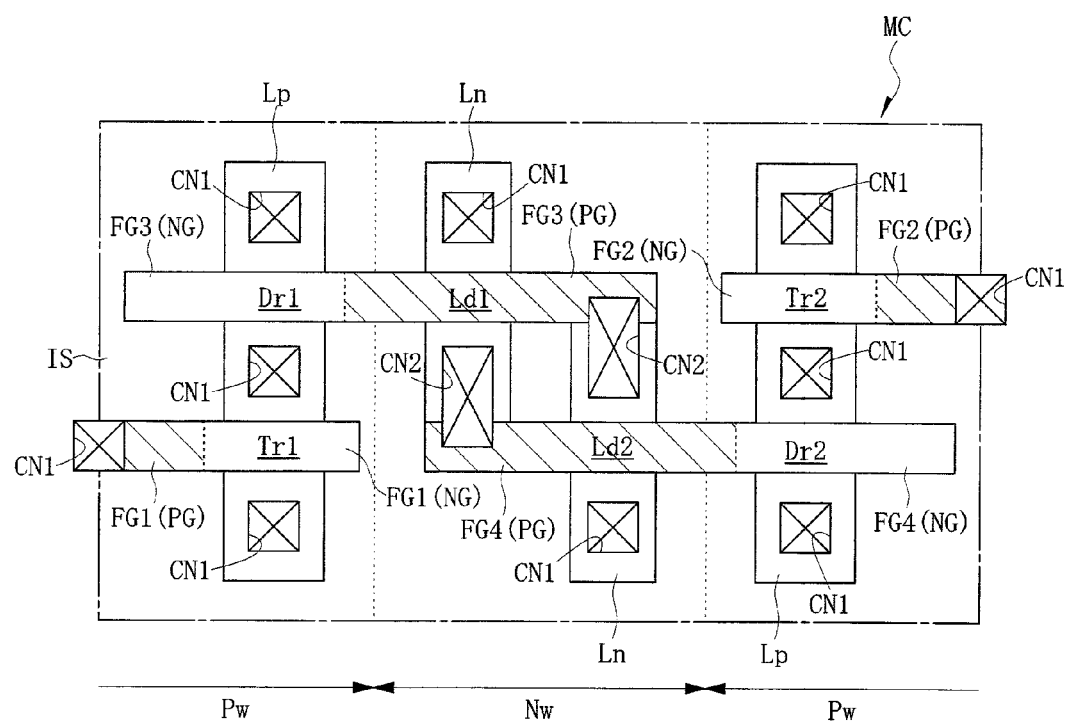
FIG. 45 is a plan view of a principal part of an SRAM memory cell for 1 bit according to a second example of the third embodiment.
Figure 46:
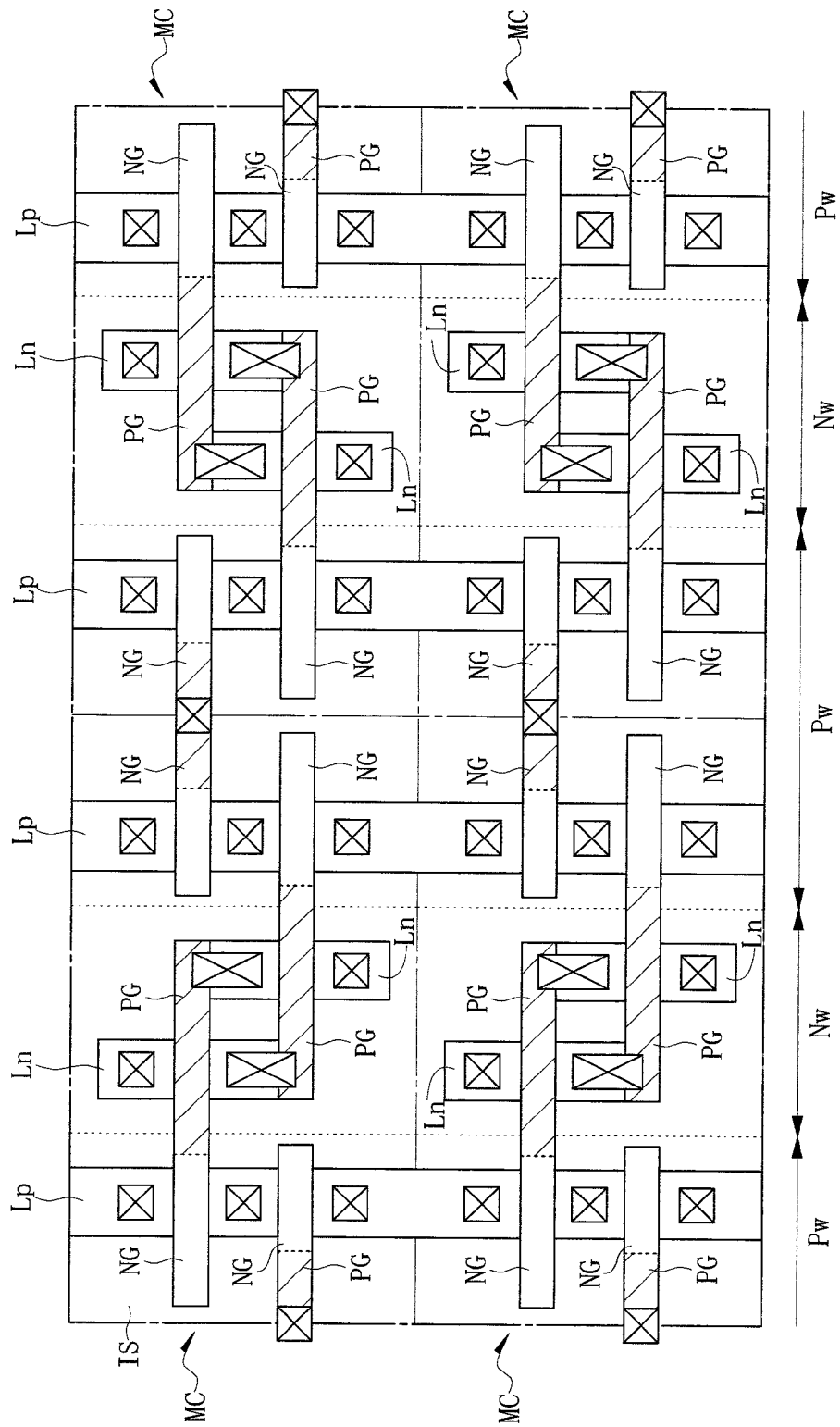
FIG. 46 is a plan view of a principal part of an SRAM memory cell for 4 bits according to the second example of the third embodiment.

Next, with reference to FIGS. 45 and 46, the second example that the present invention is applied to the SRAM will be explained. Note that the equivalent circuit and the basic plane structure of the memory cell are the same as those of the above-described first example explained with reference to FIGS. 43 and 44 except for the plane layout of the gate structure, and therefore, the explanation thereof will be omitted.

In the memory cell of the SRAM according to the second example of the third embodiment, the gate structure of each of the transferring MISes (Tr1 and Tr2) is the same as the Nch stack gate structure NG of the n-channel HK/MG transistor (such as the core nMIS of the first or second embodiment). However, a structure of a part of the gate which rides on the element separation portion IS is set to be the same as the Pch stack gate structure PG of the p-channel HK/MG transistor (such as the core pMIS of the first or second embodiment). Each of FIGS. 45 and 46 illustrates a plane layout of a memory cell to which the first and second examples are applied.

Figure 47:
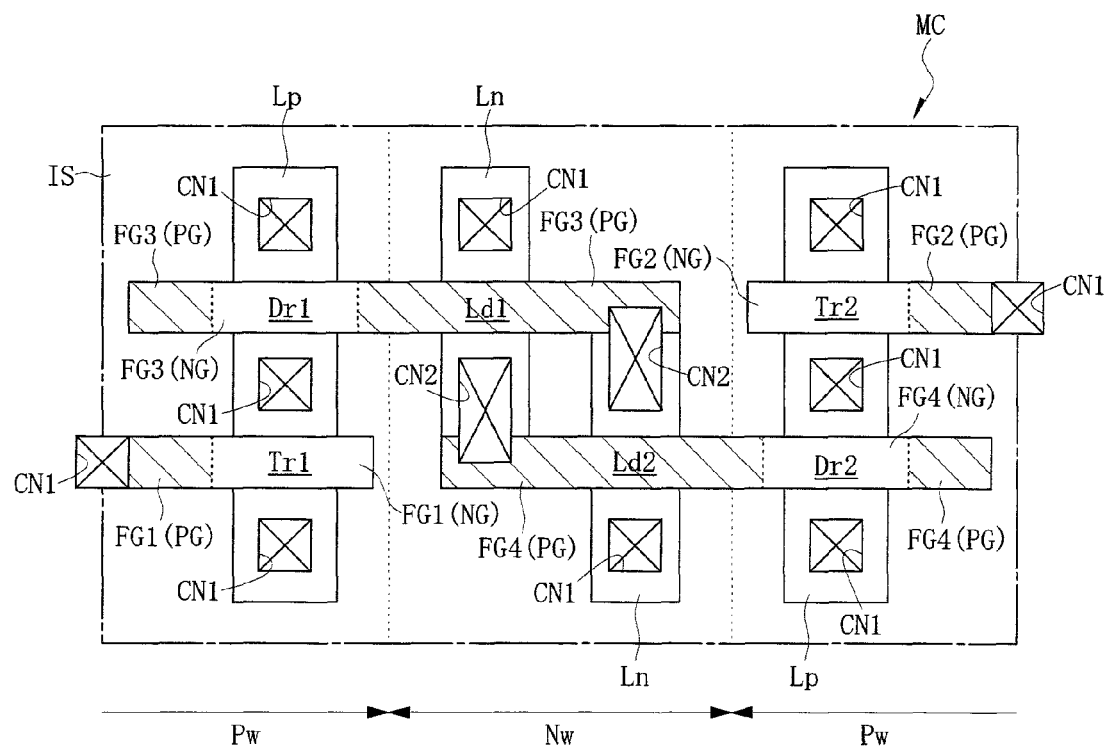
FIG. 47 is a plan view of a principal part of an SRAM memory cell for 1 bit according to a third example of the third embodiment.
Figure 48:
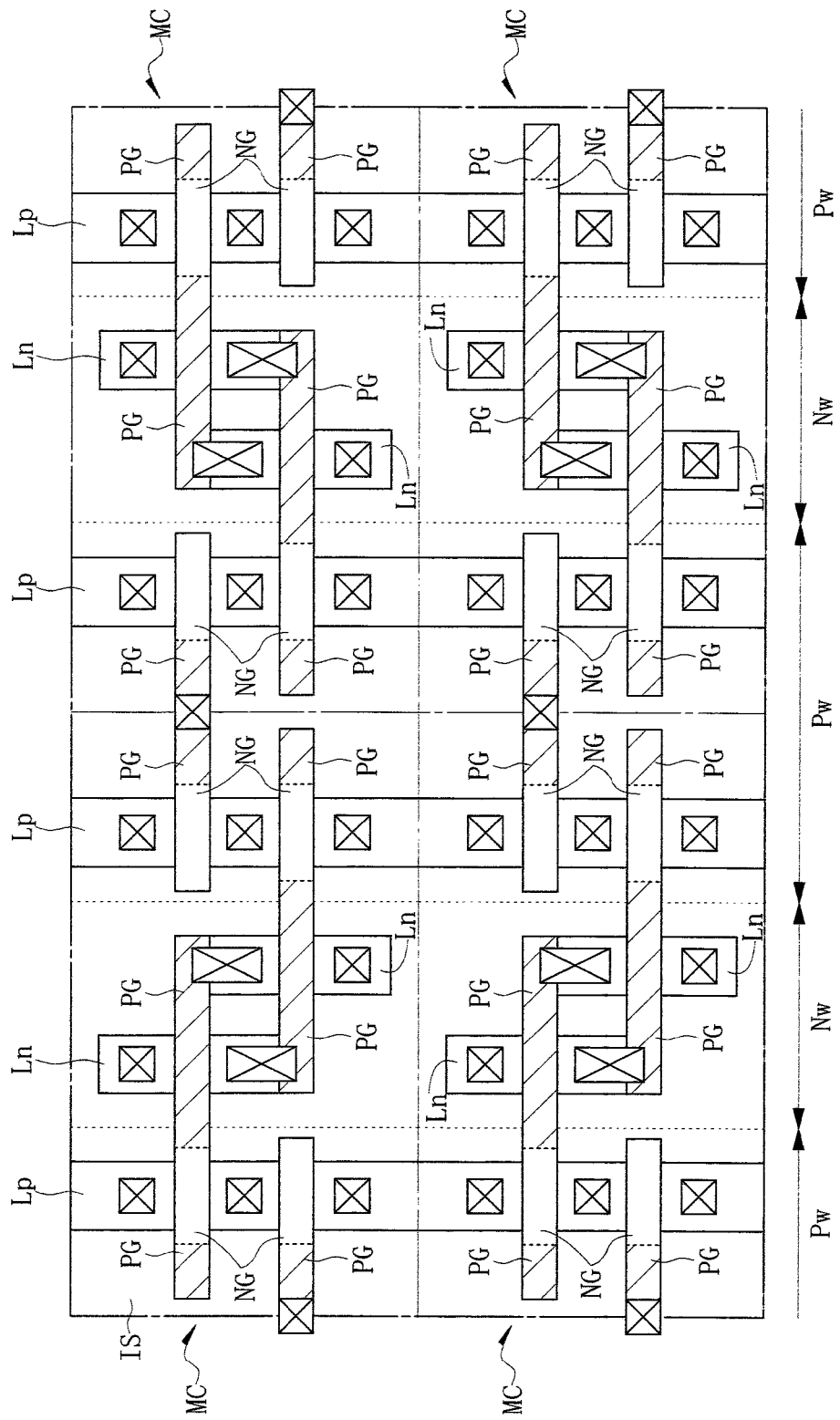
FIG. 48 is a plan view of a principal part of an SRAM memory cell for 4 bits according to the third example of the third embodiment.

Next, with reference to FIGS. 47 and 48, the third example that the present invention is applied to the SRAM will be explained. Note that the equivalent circuit and the basic plane structure of the memory cell are the same as those of the above-described first example explained with reference to FIGS. 43 and 44 except for the plane layout of the gate structure, and therefore, the explanation thereof will be omitted.

In the memory cell of the SRAM according to the third example of the third embodiment, the gate structure of each of the driving MISes (Dr1 and Dr2) is the same as the Nch stack gate structure NG of the n-channel HK/MG transistor (such as the core nMIS of the first or second embodiment). However, a structure of a part of the gates of the driving MISes (Dr1 and Dr2) which extend toward an opposite side to the respective load MISes (Ld1 and Ld2) and which ride on the respective element separation portions IS is set to be the same as the Pch stack gate structure PG of the p-channel HK/MG transistor (such as the core pMIS of the first or second embodiment). Each of FIGS. 47 and 48 illustrates a plane layout of a memory cell to which the first, second, and third examples are applied.

Figure 49:
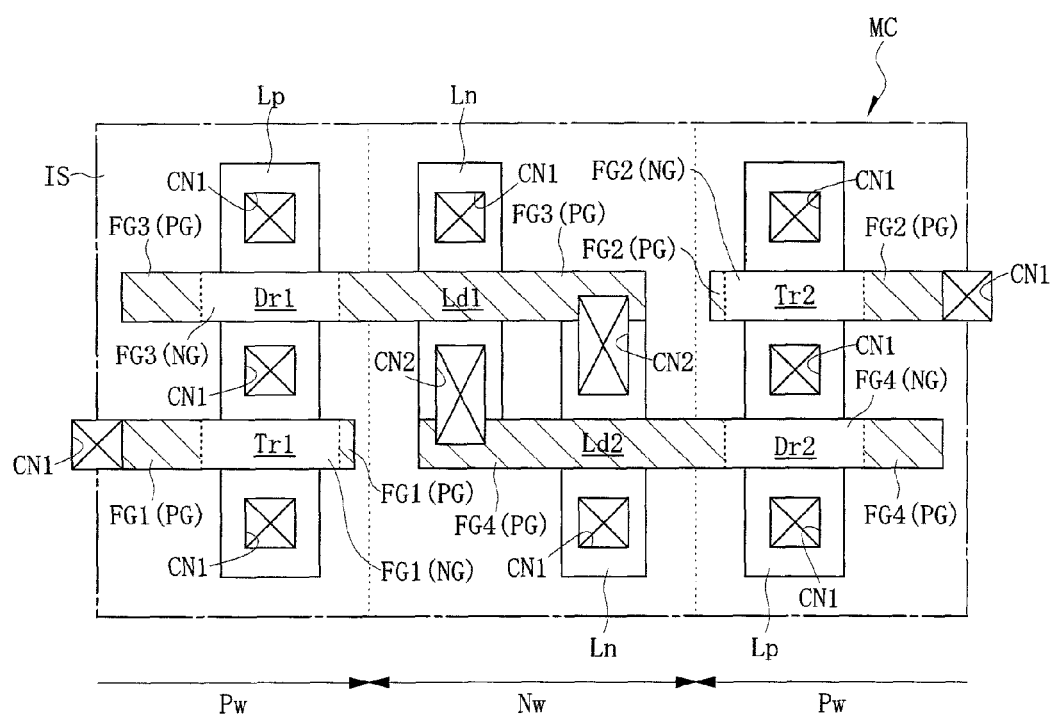
FIG. 49 is a plan view of a principal part of an SRAM memory cell for 1 bit according to a fourth example of the third embodiment.
Figure 50:
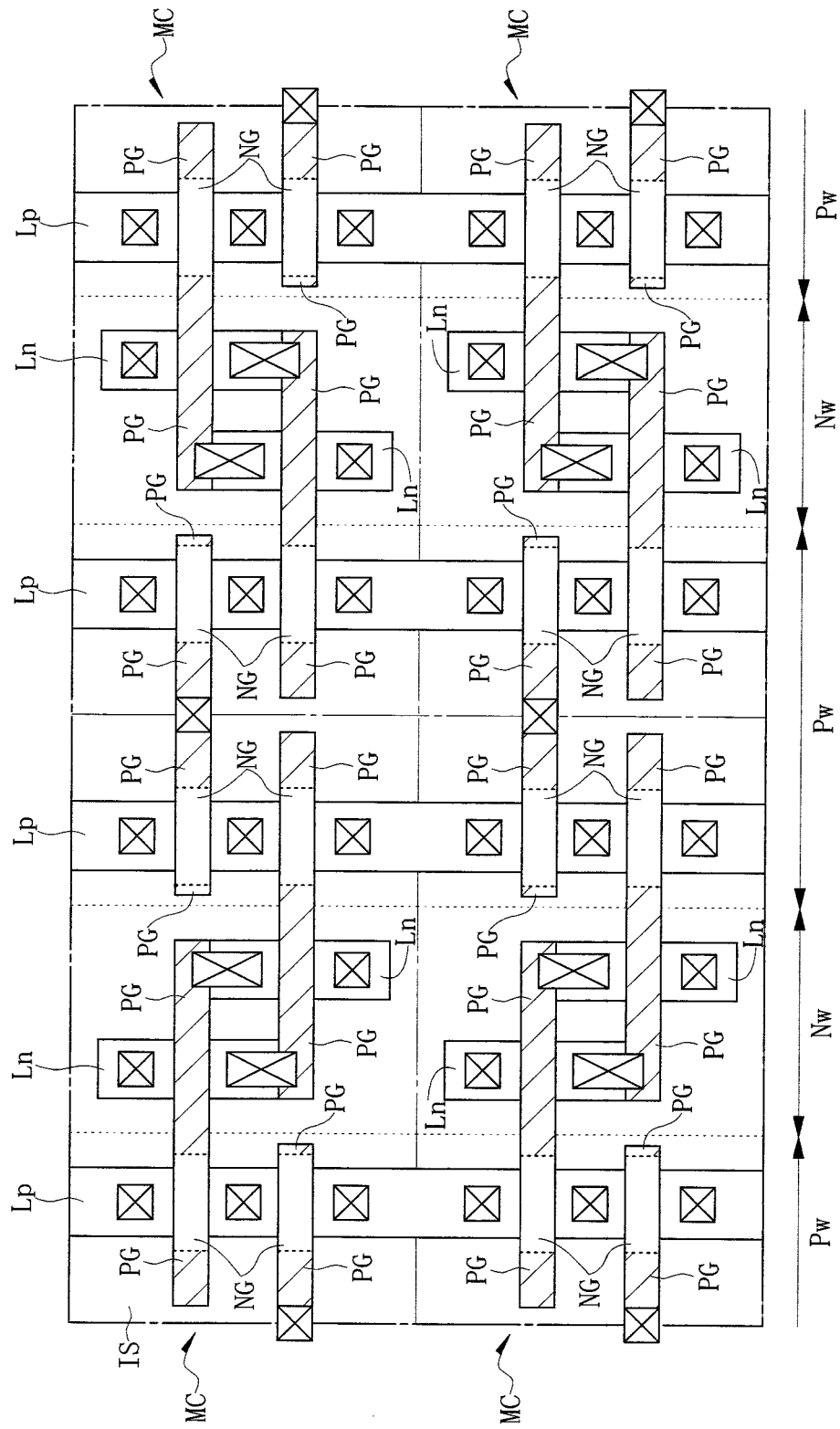
FIG. 50 is a plan view of a principal part of an SRAM memory cell for 4 bits according to the fourth example of the third embodiment.

Next, with reference to FIGS. 49 and 50, the fourth example that the present invention is applied to the SRAM will be explained. Note that the equivalent circuit and the basic plane structure of the memory cell are the same as those of the above-described first example explained with reference to FIGS. 43 and 44 except for the plane layout of the gate structure, and therefore, the explanation thereof will be omitted.

In the memory cell of the SRAM according to the fourth example of the third embodiment, the gate structure of each of the transferring MISes (Tr1 and Tr2) is the same as the Nch stack gate structure NG of the n-channel HK/MG transistor (such as the core nMIS of the first or second embodiment). However, a structure of a part of the gates of the transferring MISes (Tr1 and Tr2) which extend toward an opposite side to other respective adjacent memory cells and which ride on the respective element separation portions IS is set to be the same as the Pch stack gate structure PG of the p-channel HK/MG transistor (such as the core pMIS of the first or second embodiment). Each of FIGS. 49 and 50 illustrates a plane layout of a memory cell to which the first, second, third, and fourth examples are applied.

In this manner, according to the third embodiment, also in the SRAM, the overlapped portion of the gate having the Nch gate stack structure with the element separation portion is reduced similarly to the above-described first embodiment, so that the quantity of the oxygen supplied from the element separation portion to the gate having the Nch gate stack structure is reduced, and therefore, the increase in the threshold voltage of the n-channel HK/MG transistor can be suppressed.

Fourth Embodiment

In a fourth embodiment, first and second examples that the present invention is applied to a MIS capacitor having the gate structure of the n-channel HK/MG transistor will be explained.

Figure 51A:
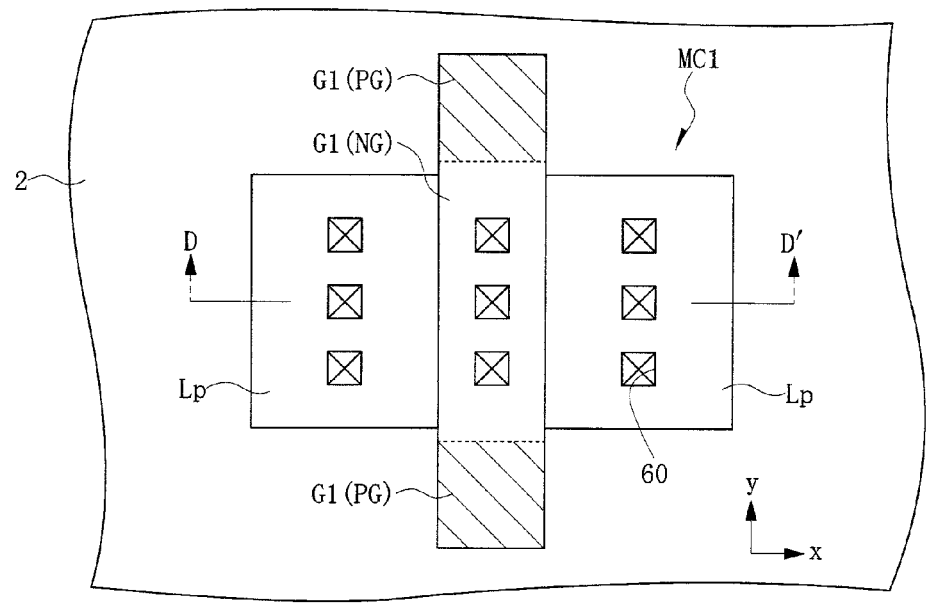
FIGS. 51A and 51B are a plan view of a principal part of a MIS capacitor according to a first example of a fourth embodiment and a cross-sectional view of a principal part along line D-D' of FIG. 51A, respectively.
Figure 51B:
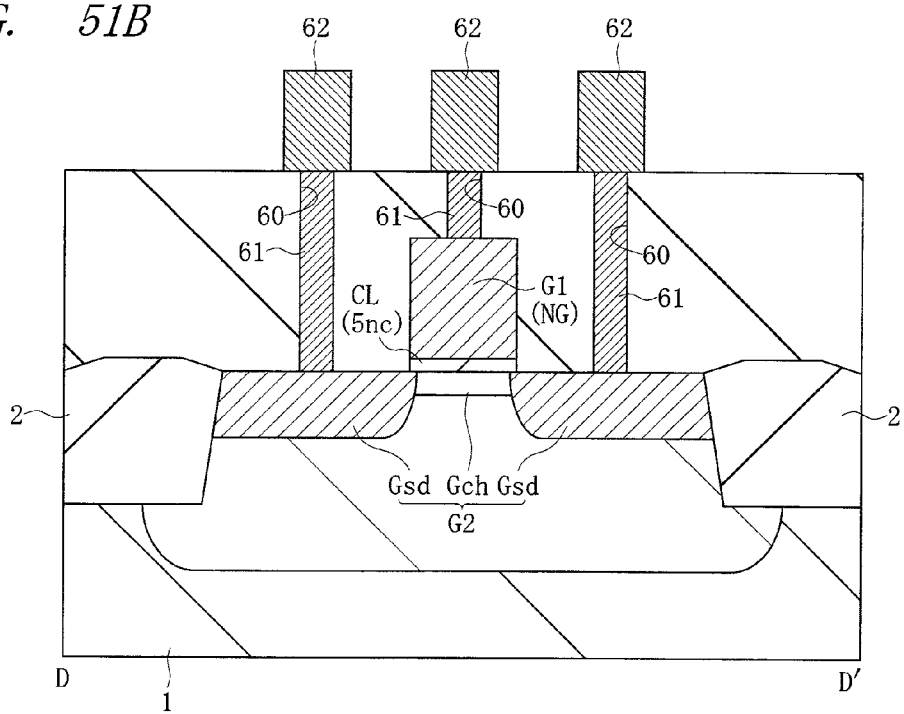

With reference to FIGS. 51A and 51B, the first example that the present invention is applied to the MIS capacitor will be explained. FIGS. 51A and 51B are a plan view of a principal part of the MIS capacitor and a cross-sectional view of a principal part (cross-sectional view of a principal part taken along line D-D' of FIG. 51A) thereof, respectively.

A MIS capacitor MC1 according to the first example is formed in an active region Lp of a p-well provided on a main surface of a semiconductor substrate 1, and a periphery of this active region Lp is surrounded by an element separation portion 2 formed of an insulating film. The MIS capacitor MC1 is configured by: a first electrode G1 which corresponds to the gate electrode of the n-channel HK/MG transistor and in which a center portion of the active region Lp is extended in a first direction (a "y" direction in FIG. 51) so that both ends thereof ride on the element separation portion 2; a second electrode G2 formed of an n-type semiconductor region Gch which corresponds to the channel of the n-channel HK/MG transistor and which is formed below the first electrode G1 in the active region Lp and an n-type semiconductor region Gsd which corresponds to the source and drain of the n-channel HK/MG transistor and which is formed on both sides of the first electrode G1 in the active region Lp; and a capacitive insulating film CL which corresponds to the gate insulating film of the n-channel HK/MG transistor. Each of the first electrode G1 and the second electrode G2 is connected to a wiring 62 via a plug 61 formed inside a connection hole 60.

Therefore, the first electrode G1 of the MIS capacitor MC1 is formed of the same conductive film as the conductive film (such as the gate electrode 7 of the core nMIS of the first or second embodiment) configuring the gate electrode of the n-channel HK/MG transistor, and the capacitive insulating film CL is formed of the same insulating film as the gate insulating film (such as the gate insulating film 5nc of the core nMIS of the first or second embodiment) of the n-channel HK/MG transistor.

However, between the element separation portion 2 and the part of the first electrode G1 of the MIS capacitor MC1 which rides on the element separation portion 2, the same insulating film as the insulating film (such as the gate insulating film 5pc of the core pMIS of the first or second embodiment) configuring the gate insulating film of the p-channel HK/MG transistor is formed. That is, although the gate of the MIS capacitor MC1 positioned in the active region Lp has the Nch gate stack structure NG, the part of the gate which rides on the element separation portion 2 has the Pch gate stack structure PG.

Figure 52A:
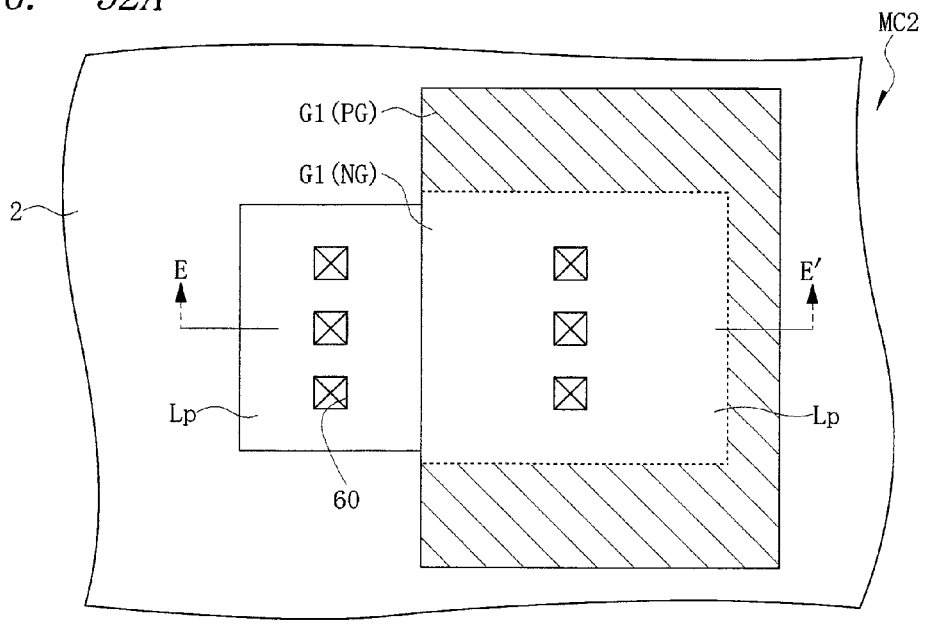
FIGS. 52A and 52B are a plan view of a principal part of a MIS capacitor according to a second example of the fourth embodiment and a cross-sectional view of a principal part along line E-E' of FIG. 52A, respectively.
Figure 52B:
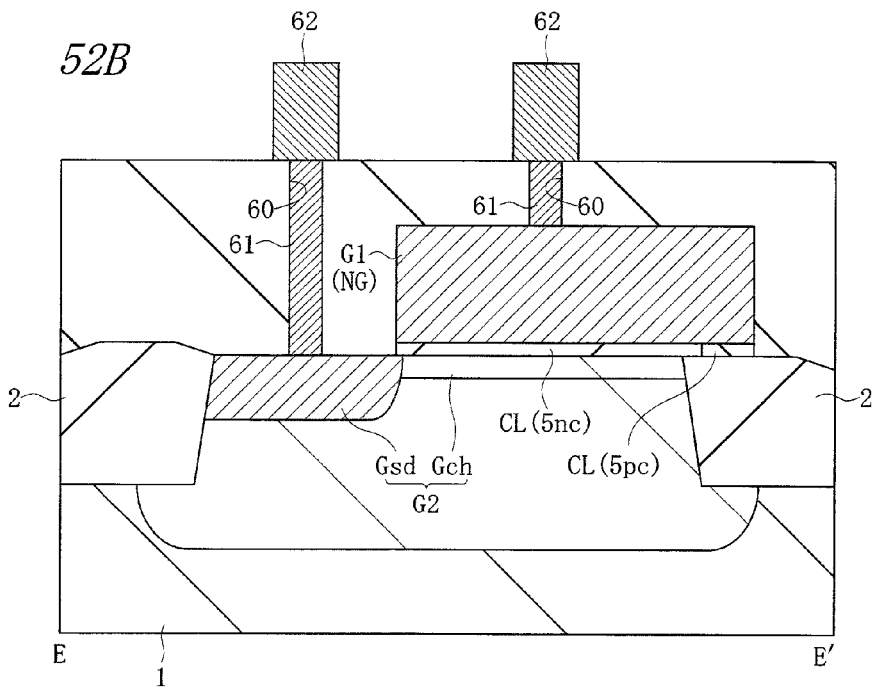

Next, with reference to FIGS. 52A and 52B, the second example that the present invention is applied to the MIS capacitor will be explained. FIGS. 52A and 52B are a plan view of a principal part of the MIS capacitor and a cross-sectional view of a principal part (cross-sectional view of a principal part taken along line E-E' of FIG. 52A) thereof, respectively.

The MIS capacitor MC2 according to the second example is configured by: a first electrode G1 which rides on the element separation portions 2 in three directions of the active region Lp; a second electrode G2 formed of n-type semiconductor regions Gch and Gsd formed in the active region Lp; and a capacitive insulating film CL formed between the first electrode G1 and the second electrode G2.

Therefore, the first electrode G1 of the MIS capacitor MC2 is formed of the same conductive film as the conductive film (such as the gate electrode 7 of the core nMIS of the first or second embodiment) configuring the gate electrode of the n-channel HK/MG transistor, and the capacitive insulating film CL is formed of the same insulating film as the gate insulating film (such as the gate insulating film 5nc of the core nMIS of the first or second embodiment) of the n-channel HK/MG transistor.

However, between the element separation portion 2 and the part of the first electrode G1 of the MIS capacitor MC2 which rides on the element separation portion 2, the same insulating film as the insulating film (such as the gate insulating film 5pc of the core pMIS of the first or second embodiment) configuring the gate insulating film of the p-channel HK/MG transistor is formed. That is, although the gate of the MIS capacitor MC2 positioned in the active region Lp has the Nch gate stack structure NG, the part of the gate which rides on the element separation portion 2 has the Pch gate stack structure PG.

In this manner, according to the fourth embodiment, also in the MIS capacitor, the overlapped portion of the gate having the Nch gate stack structure with the element separation portion is reduced similarly to the above-described first embodiment, so that the quantity of the oxygen supplied from the element separation portion to the gate having the Nch gate stack structure is reduced, and therefore, increase in a thickness of the capacitive insulating film CL can be suppressed, and decrease in a capacitive value can be suppressed.

In the foregoing, the invention made by the present inventor has been concretely described based on the embodiments. However, it is needless to say that the present invention is not limited to the foregoing embodiments and various modifications and alterations can be made within the scope of the present invention.

INDUSTRIAL APPLICABILITY

The present invention can be applied to a semiconductor device having an HK/MG transistor whose gate insulating film is made of a High-k material with a high dielectric constant and whose gate electrode is made of a metal material, and applied to a method of manufacturing the same.

The invention claimed is:

1. A method of manufacturing a semiconductor device including a first MISFET and a second MISFET, comprising steps of:
 (a) forming an element separation portion in a semiconductor substrate, thereby first and second regions of the semiconductor substrate are defined;

(b) forming a first gate insulating film over the first region and the element separation portion;
(c) forming a second gate insulating film over the second region and the element separation portion;
(d) forming a first dummy gate over the first and second gate insulating films;
(e) forming an interlayer insulating film over the first and second regions in order to cover the first dummy gate;
(f) after the step (e), exposing a top surface of the first dummy gate by performing a CMP method to the interlayer insulating film;
(g) after the step (f), forming a first trench over the first and second gate insulating films by removing the first dummy gate;
(h) embedded a first metal film in the first trench; and
(i) removing the first metal film being out of the first trench,
wherein the first MISFET includes the first gate insulating film and the first metal film,
wherein the second MISFET includes the second gate insulating film and the first metal film,
wherein the first gate insulating film is a different film from the second gate insulating film, and
wherein, on the element separation portion interposed between the first region and the second region, a length of the first gate insulating film is shorter than a length of the second gate insulating film.

2. A method of manufacturing a semiconductor device according to the claim 1,
wherein the first and second MISFETs constitute a CMOS invertors.

3. A method of manufacturing a semiconductor device according to the claim 1,
wherein the first gate insulating film includes Hf, O and La, and
wherein the second gate insulating film includes Hf and O and does not include La.

4. A method of manufacturing a semiconductor device according to the claim 1,
wherein the first metal film includes Al.

5. A method of manufacturing a semiconductor device including a first MISFET and a second MISFET, comprising steps of:
(a) forming an element separation portion in a semiconductor substrate, thereby first and second regions of the semiconductor substrate are defined;
(b) forming a first gate insulating film over the first region and the element separation portion;
(c) forming a second gate insulating film over the second region and the element separation portion;
(d) forming a first dummy gate over the first and second gate insulating films;
(e) forming an interlayer insulating film over the first and second regions in order to cover the first dummy gate;
(f) after the step (e), etching the interlayer insulating film, thereby a top surface of the first dummy gate is exposed;
(g) after the step (f), removing the first dummy gate;
(h) after the step (g), forming a first metal film over the first and second gate insulating films; and
(i) after the step (h), etching the first metal film, thereby a top surface of the interlayer insulating film is exposed,
wherein the first MISFET includes the first gate insulating film and the first metal film,
wherein the second MISFET includes the second gate insulating film and the first metal film,
wherein the first gate insulating film is a different film from the second gate insulating film, and
wherein, on the element separation portion interposed between the first region and the second region, a boundary of the first and second gate insulating films is located on a side of the first gate insulating film.

6. A method of manufacturing a semiconductor device according to the claim 5,
wherein the first and second MISFETs constitute a CMOS invertors.

7. A method of manufacturing a semiconductor device according to the claim 5,
wherein the first gate insulating film includes Hf, O and La, and
wherein the second gate insulating film includes Hf and O and does not include La.

8. A method of manufacturing a semiconductor device according to the claim 5,
wherein the first metal film includes Al.

9. A method of manufacturing a semiconductor device including a first MISFET and a second MISFET, comprising steps of:
(a) forming an element separation portion in a semiconductor substrate, thereby first and second regions of the semiconductor substrate are defined;
(b) forming a first gate insulating film over the first region and the element separation portion;
(c) forming a second gate insulating film over the second region and the element separation portion;
(d) forming an interlayer insulating film over the first and second regions;
(e) forming a first trench in the interlayer insulating film, the first trench arranged over the first and second gate insulating film; and
(f) embedding a first metal film in the first trench,
wherein the first MISFET includes the first gate insulating film and the first metal film,
wherein the second MISFET includes the second gate insulating film and the first metal film,
wherein the first gate insulating film is a different film from the second gate insulating film, and
wherein, on the element separation portion interposed between the first region and the second region, a boundary of the first and second gate insulating films is located on a side of the first gate insulating film.

10. A method of manufacturing a semiconductor device according to the claim 9,
wherein the first and second MISFETs constitute a CMOS invertors.

11. A method of manufacturing a semiconductor device according to the claim 9,
wherein the first gate insulating film includes Hf, O and La, and
wherein the second gate insulating film includes Hf and O and does not include La.

12. A method of manufacturing a semiconductor device according to the claim 9,
wherein the first metal film includes Al.

* * * * *